United States Patent
Hatakeyama et al.

(10) Patent No.: US 8,932,803 B2
(45) Date of Patent: Jan. 13, 2015

(54) PATTERN FORMING PROCESS

(71) Applicant: Shin-Etsu Chemical Co., Ltd., Tokyo (JP)

(72) Inventors: Jun Hatakeyama, Joetsu (JP); Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/105,331

(22) Filed: Dec. 13, 2013

(65) Prior Publication Data

US 2014/0199637 A1 Jul. 17, 2014

(30) Foreign Application Priority Data

Jan. 16, 2013 (JP) .................. 2013-005152

(51) Int. Cl.
*G03F 7/26* (2006.01)
*G03F 7/20* (2006.01)

(52) U.S. Cl.
CPC .................. *G03F 7/2024* (2013.01)
USPC ........... 430/324; 430/331; 430/325; 430/330; 430/315; 430/270.1

(58) Field of Classification Search
CPC ..................... H01L 21/31144; H01L 21/0274; H01L 21/0337; H01L 21/0273; H01L 21/31105; H01L 21/76832; H01L 21/0271; H01L 21/0332; H01L 2224/11474; H01L 21/32139; G03F 7/0035; G03F 7/095; G03F 7/322

USPC .................. 430/325, 331, 315, 330
See application file for complete search history.

(56) References Cited

U.S. PATENT DOCUMENTS 6,136,500 A 10/2000 Kobayashi et al.
(Continued)

FOREIGN PATENT DOCUMENTS

JP 2000-327633 A 11/2000
JP 3790649 B2 6/2006
(Continued)

OTHER PUBLICATIONS

Chen et al., "Resist Freezing Process for Double Exposure Lithography", Procedings of SPIE et al., 2008, p. 69230G-1-69230G-10, SPIE vol. 6923.

*Primary Examiner* — Caleen Sullivan
(74) *Attorney, Agent, or Firm* — Westerman, Hattori, Daniels & Adrian, LLP

(57) ABSTRACT

A pattern is formed by coating a first chemically amplified positive resist composition comprising a resin comprising recurring units having an acid labile group so that it may turn soluble in alkaline developer upon elimination of the acid labile group, a photoacid generator, and a first organic solvent, onto a processable substrate, prebaking, exposing, PEB, and developing in an alkaline developer to form a positive pattern; heating the positive pattern to render it resistant to a second organic solvent used in a second resist composition; coating the second resist composition, prebaking, exposing, PEB, and developing in a third organic solvent to form a negative pattern. The positive pattern and the negative pattern are simultaneously formed.

14 Claims, 3 Drawing Sheets

(56) References Cited

U.S. PATENT DOCUMENTS

| | | |
|---|---|---|
| 6,448,420 B1 | 9/2002 | Kinsho et al. |
| 7,537,880 B2 | 5/2009 | Harada et al. |
| 8,003,295 B2 | 8/2011 | Hatakeyama |
| 8,530,148 B2 | 9/2013 | Tsubaki et al. |
| 2008/0153030 A1 | 6/2008 | Kobayashi et al. |
| 2009/0087786 A1* | 4/2009 | Hatakeyama ............... 430/285.1 |
| 2014/0080066 A1* | 3/2014 | Meya et al. .................. 430/312 |

FOREIGN PATENT DOCUMENTS

| | | |
|---|---|---|
| JP | 3991462 B2 | 10/2007 |
| JP | 2007-297590 A | 11/2007 |
| JP | 2008-111103 A | 5/2008 |
| JP | 2008-158339 A | 7/2008 |
| JP | 2009-063689 A | 3/2009 |
| JP | 2009-93150 A | 4/2009 |
| JP | 2010-152299 A | 7/2010 |
| JP | 4554665 B2 | 9/2010 |

* cited by examiner

FIG.1A COATING OF 1ST POSITIVE RESIST COMPOSITION

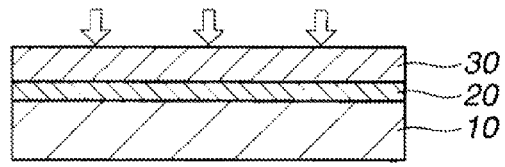

FIG.1B EXPOSURE OF 1ST POSITIVE RESIST FILM

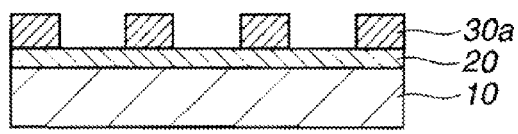

FIG.1C PEB AND ALKALI DEVELOPMENT OF 1ST POSITIVE RESIST FILM TO FORM PATTERN

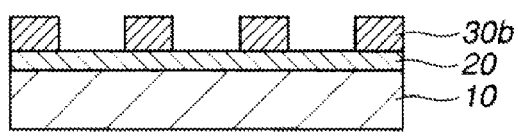

FIG.1D BAKING OF 1ST POSITIVE RESIST FOR CROSSLINKING

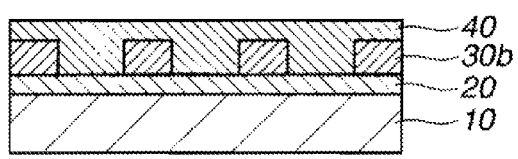

FIG.1E COATING OF 2ND RESIST COMPOSITION

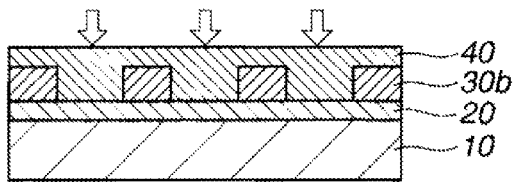

FIG.1F EXPOSURE OF 2ND RESIST FILM

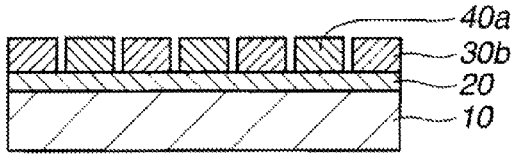

FIG.1G PEB AND ORGANIC SOLVENT DEVELOPMENT OF 2ND POSITIVE RESIST FILM

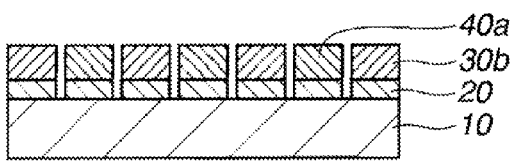

FIG.1H DRY ETCHING THROUGH 1ST AND 2ND RESIST PATTERNS AS MASK

PATTERN FORMING PROCESS

CROSS-REFERENCE TO RELATED APPLICATION

This non-provisional application claims priority under 35 U.S.C. §119(a) on Patent Application No. 2013-005152 filed in Japan on Jan. 16, 2013, the entire contents of which are hereby incorporated by reference.

TECHNICAL FIELD

This invention relates to a patterning process involving the steps of forming a positive pattern through exposure and alkaline development of a first resist composition, rendering the positive pattern insoluble in organic solvent with the aid of acid and heat, coating a second resist composition thereon, and forming a negative pattern through exposure and organic solvent development.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was stopped and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-edge roughness (LER or LWR) of resist film, defect-free MoSi laminate mask, reduced aberration of reflection mirror, and the like.

Another candidate for the 32-nm node lithography is high refractive index liquid immersion lithography. The development of this technology was stopped because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

Patent Document 1 discloses a process involving forming a first pattern of a positive resist material through exposure and alkaline development, rendering the first pattern insoluble in organic solvent and alkaline developer with the aid of acid and heat, coating another positive resist material thereon, and forming a second pattern through exposure and alkaline development. Patent Document 2 discloses a process involving forming a first pattern of a positive resist material through exposure and alkaline development, rendering the first pattern insoluble in organic solvent and alkaline developer with the aid of light irradiation and heat, coating another positive resist material thereon, and forming a second pattern through exposure and alkaline development. These processes belong to a double patterning process involving the steps of insolubilizing a first positive resist pattern and combining it with a second positive pattern.

As compared with the line pattern, the trench or hole pattern is difficult to reduce its size. If an attempt is made to form fine holes according to the prior art method by combining a positive resist film with a hole pattern mask and effecting under-exposure, the exposure margin is extremely narrowed. It is then proposed to form holes of larger size and shrink the developed holes by thermal flow, RELACS® or other techniques. However, there is a substantial difference between the pattern size as developed and the pattern size as shrunk, giving rise to the problem that a greater shrinkage leads to a lower control accuracy. With the hole shrinking method, the hole size can be shrunk, but the pitch cannot be narrowed.

Holes can be shrunk using the direct self assembly (DSA) technology. A typical DSA material is a styrene-methacrylate block copolymer. The DSA technology can shrink a hole pattern if holes are of true circle. When the DSA technology is applied to elongated holes or trench patterns, juxtaposed holes are formed. It is a drawback that shrinkage occurs while the original shape is deformed.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkali development and organic solvent development is under study.

As the ArF resist composition for negative tone development with organic solvent, positive ArF resist compositions of the prior art design may be used. Such pattern forming process is described in Patent Document 3.

An attempt to form elongated holes via negative development results in elliptic shape. This is due to the influence of optical interference. The elliptic hole pattern is undesired when it is intended to form a rectangular hole pattern.

Non-Patent Document 1 proposes a process for reducing the pitch to one half by heating a first positive resist pattern for insolubilizing it in organic solvent and alkaline developer, coating a second resist material, and forming a second positive pattern between the first positive pattern features. If the second pattern is orthogonal to the first pattern, a hole pattern can be formed. If the pitch is changed between the first and second lines, rectangular holes can be formed. However, since both the first and second steps use positive resist materials, formation of a narrow trench pattern is disadvantageous from the standpoint of optical contrast.

Patent Document 4 proposes an image reversal technology involving forming a positive resist pattern of positive resist material via alkaline development, heating the positive resist pattern for insolubilizing it in organic solvent while maintaining alkaline development capability, coating a film of low alkaline solubility, and effecting development to dissolve only the surface layer of the low alkaline solubility film while leaving the majority of film, and to dissolve the positive resist pattern in alkaline developer. Since the positive resist pattern is merely insolubilized in only organic solvent, this technology does not need a high degree of insolubilization and thus prevents deformation of the positive pattern.

CITATION LIST

Patent Document 1: JP-A 2009-063689
Patent Document 2: JP-A 2009-093150 (U.S. Pat. No. 8,003,295)
Patent Document 3: JP 4554665 (U.S. Pat. No. 8,530,148)
Patent Document 4: JP-A 2010-152299
Non-Patent Document 1: Proc. SPIE Vol. 6923, p.69230G-1 (2008)

DISCLOSURE OF INVENTION

An object of the invention is to provide a pattern forming process capable of forming a rectangular space pattern with narrow slits and preventing any scum from being left even when a second resist film straddling a first resist pattern is developed.

The inventors have reached a pattern forming process capable of forming a first positive pattern and a second negative pattern simultaneously by subjecting a resin in a positive resist pattern of a chemically amplified positive resist composition to partial crosslinking treatment, for thereby insolubilizing the positive resist pattern with respect to the organic solvent in a resist material used in forming a second pattern while minimizing the deformation of the positive resist pattern by heat treatment, coating the resist material for the second pattern, exposure, PEB, and development in organic solvent.

When it is desired to form a rectangular space pattern, negative development in organic solvent is undesired because an elliptic pattern is formed. When an orthogonal pattern is formed by insolubilizing a first positive resist material in alkaline developer and organic solvent with the aid of heat, coating a second positive resist material thereon, and forming a second resist pattern extending perpendicular to a first resist pattern, this process is short in forming narrow slits because low contrast light is used in conjunction with the positive resist material. While the second resist material has an increased film thickness where it straddles the first positive resist material, the positive resist material has the drawback that material removal to cut a trench in this area is difficult with a likelihood of leaving residue. If a negative resist material adapted for organic solvent development is used as the second resist material, narrower trenches than the use of positive resist material can be resolved using a negative image with high contrast. Use of the negative resist material avoids scum formation even in the area where the second resist material straddles the first resist material.

The litho-etch litho-etch (LELE) process involving transferring a first positive resist pattern to the underlying hard mask by dry etching, and transferring a second negative resist pattern thereon to the underlying hard mask by dry etching can form a rectangular trench pattern like the process of the invention. However, the LELE process needs two layers of hard mask corresponding to the positive and negative patterns, and two steps of dry etching. The process of the invention needs only one layer of hard mask and only one step of dry etching. Although the first positive resist material should have such characteristics that it may be turned insoluble in the organic solvent in the second resist material by heating after alkaline development, the first positive resist material need not have such characteristics that it may be turned insoluble in alkaline developer, because development of the second resist material uses an organic solvent rather than the alkaline developer. If the first resist pattern is turned insoluble even in alkaline developer, the bake after development must be done at higher temperature, which can cause shrinkage or deformation of the pattern. Deformation or shrinkage of the first positive resist pattern must be minimized.

On use of a positive resist material, formation of a thin line pattern is advantageous in terms of optical contrast. On use of a negative resist material, formation of a thin trench pattern is advantageous in terms of optical contrast. The gist of the invention resides in that a rectangular trench pattern is formed by carrying out double patterning in pattern layouts compliant with positive and negative resist materials.

The invention provides a pattern forming process comprising the steps of:

coating a first chemically amplified positive resist composition onto a processable substrate, said first resist composition comprising a resin comprising recurring units having an acid labile group so that it may turn soluble in alkaline developer as a result of the acid labile group being eliminated, a photoacid generator capable of generating an acid upon exposure to high-energy radiation and optionally a thermal acid generator capable of generating an acid upon heating, and a first organic solvent, prebaking the coating to remove the unnecessary solvent and to form a resist film, exposing patternwise the resist film to high-energy radiation, post-exposure baking, and developing in an alkaline developer to form a positive pattern, heating the positive pattern to render it resistant to a second organic solvent used in a second resist composition to be subsequently coated, coating the second resist composition comprising a resin and the second organic solvent onto the positive pattern-bearing substrate, prebaking, exposing, post-exposure baking, and developing in a third organic solvent to form a negative pattern, whereby the positive pattern of the first resist composition and the negative pattern of the second resist composition are simultaneously formed.

In a preferred embodiment, the second organic solvent in the second resist composition is selected from the group consisting of propylene glycol monomethyl ether acetate, cyclohexanone, cyclopentanone, ethyl lactate, propylene glycol monomethyl ether, heptanone, γ-butyrolactone and mixtures thereof, and the positive pattern after heating experiences a film thickness loss of up to 10 nm when it is kept in contact with the second organic solvent for 30 seconds.

In a preferred embodiment, the first resist composition comprises the thermal acid generator capable of generating an acid upon heating.

The preferred thermal acid generator has the general formula (P1a-2):

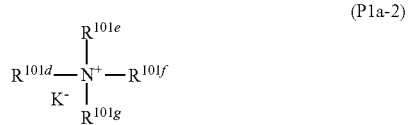

(P1a-2)

wherein $K^-$ is a sulfonate having at least one fluorine at α-position, perfluoroalkylimidate or perfluoroalkylmethidate, $R^{101d}$, $R^{101e}$, $R^{101f}$ and $R^{101g}$ are each independently hydrogen, a straight, branched or cyclic $C_1$-$C_{12}$ alkyl, alkenyl, oxoalkyl or oxoalkenyl group, $C_6$-$C_{20}$ aryl group, $C_7$-$C_{12}$ aralkyl group or aryloxoalkyl group, in which some or all hydrogen atoms may be substituted by alkoxy groups, $R^{101d}$ and $R^{101e}$, or $R^{101d}$, $R^{101e}$ and $R^{101f}$ may bond together to form a ring with the nitrogen atom to which they are attached, and when they form a ring, $R^{101d}$ and $R^{101e}$, or $R^{101d}$, $R^{101e}$ and $R^{101f}$, taken together, represent a $C_3$-$C_{10}$ alkylene group or form a hetero-aromatic ring having the nitrogen atom in the formula therein.

In a preferred embodiment, the resin in the first positive resist composition comprises recurring units having 7-oxanorbornane ring and recurring units having an acid labile group which is eliminatable with acid. During the steps of generating acid in the positive pattern and heating to eliminate the acid labile group on the resin in the positive pattern, crosslinking of the resin and elimination of the acid labile group are conducted at the same time in the positive pattern.

In a preferred embodiment, the recurring units having 7-oxanorbornane ring are recurring units (a) having the general formula (1):

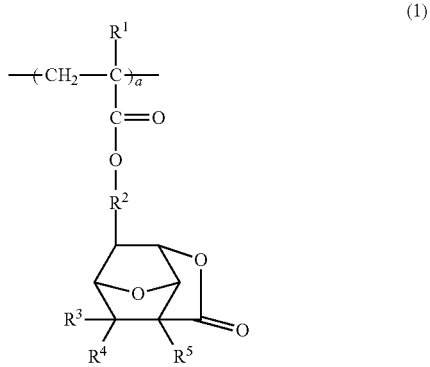

(1)

wherein $R^1$ is hydrogen or methyl, $R^2$ is a single bond, or a straight, branched or cyclic $C_1$-$C_6$ alkylene group which may contain an ether or ester moiety and which has a primary or secondary carbon atom through which it is linked to the ester moiety in the formula, $R^3$, $R^4$, and $R^5$ are each independently hydrogen, a straight, branched or cyclic $C_1$-$C_6$ alkyl group or cyano group, and a is a number in the range: $0<a<1.0$.

In a preferred embodiment, the recurring units having an acid labile group are recurring units (b) having the general formula (2):

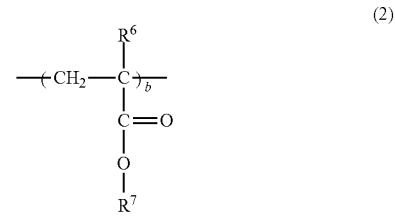

(2)

wherein $R^6$ is hydrogen or methyl, $R^7$ is an acid labile group, and b is a number in the range: $0<b\leq0.8$. Typically, $R^7$ is an acid labile group of alicyclic structure.

In a preferred embodiment, the resin in the second resist composition comprises recurring units having a carboxyl and/or hydroxyl group substituted with an acid labile group. The recurring units having a carboxyl or hydroxyl group substituted with an acid labile group are preferably recurring units (c) or (d) having the general formula (3):

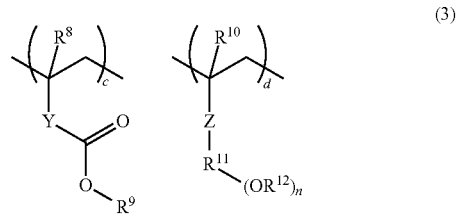

(3)

wherein $R^8$ and $R^{10}$ each are hydrogen or methyl, $R^9$ and $R^{12}$ each are an acid labile group, Y is a single bond or —C(=O)—O—$R^{13}$—, $R^{13}$ is a straight, branched or cyclic $C_1$-$C_{10}$ alkylene group which may contain an ether or ester moiety, or a naphthylene group, z is a single bond or —C(=O)—O—, $R^{11}$ is a straight, branched or cyclic $C_1$-$C_{15}$ alkylene group or a trivalent group obtained by eliminating one hydrogen from the alkylene group, which may contain an ether or ester moiety, or a naphthylene group or a trivalent group obtained by eliminating one hydrogen from the naphthylene group, n is 1 or 2, c and d are numbers in the range: $0\leq c<1.0$, $0\leq d<1.0$, and $0<c+d<1.0$.

In a preferred embodiment, the third organic solvent used in the last developing step to form a negative pattern is selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

In one preferred embodiment, the first positive pattern crosses the second negative pattern. In another preferred embodiment, the first positive pattern and the second negative pattern are formed in different directions. In a further preferred embodiment, spaces of the second negative pattern are formed in proximity to the remaining portion of the first positive pattern.

Advantageous Effects of Invention

The pattern forming process of the invention is successful in forming a rectangular space pattern with narrow slits. The pattern can be developed without leaving scum where the second resist film straddles the first resist pattern.

BRIEF DESCRIPTION OF DRAWINGS

FIG. 1 schematically illustrates the pattern forming process of the invention; FIG. 1A showing a first resist film deposited on a processable substrate on a substrate; FIG. 1B showing exposure of the first resist film; FIG. 1C showing the first resist film during alkaline development; FIG. 1D showing the first resist pattern being crosslinked via deprotection with the aid of acid and heat; FIG. 1E showing coating of a second resist material; FIG. 1F showing exposure of the second resist film; FIG. 1G showing the second resist film during organic solvent development; and FIG. 1H showing the processable substrate being dry etched.

DESCRIPTION OF PREFERRED EMBODIMENTS

Figure 2:
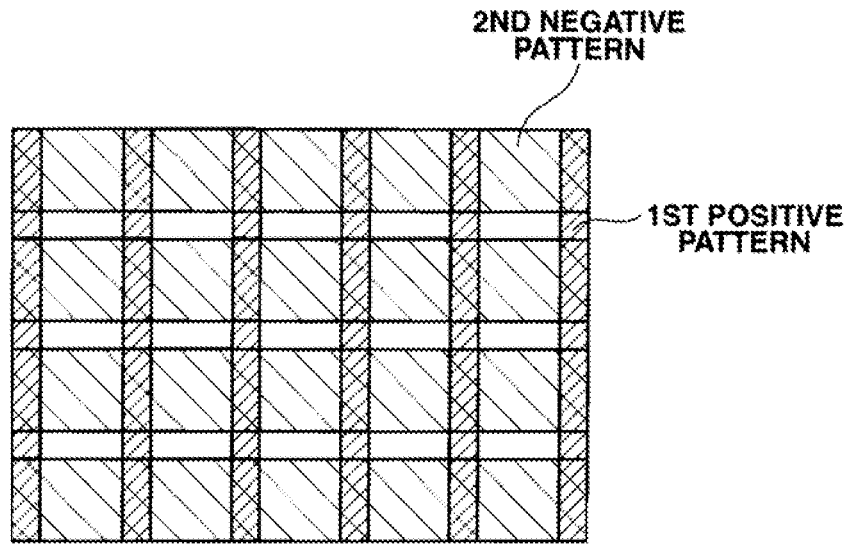
FIG. 2 illustrates a first positive pattern and a second negative pattern, which are combined as orthogonal lines.

The terms "a" and "an" herein do not denote a limitation of quantity, but rather denote the presence of at least one of the referenced item. "Optional" or "optionally" means that the subsequently described event or circumstance may or may not occur, and that the description includes instances where the event occurs and instances where it does not. As used herein, the notation ($C_n$-$C_m$) means a group containing from n to m carbon atoms per group.

The abbreviations and acronyms have the following meaning.

PAG: photoacid generator
TAG: thermal acid generator
Mw: weight average molecular weight
Mn: number average molecular weight
Mw/Mn: molecular weight distribution or dispersity
GPC: gel permeation chromatography
PEB: post-exposure baking The invention is directed to a pattern forming process comprising the steps of coating a first chemically amplified positive resist composition onto a processable substrate, the first resist composition comprising a resin comprising recurring units having an acid labile group so that it may turn soluble in alkaline developer as a result of the acid labile group being eliminated, a photoacid generator and optionally a thermal acid generator, and a first organic solvent, prebaking the coating to remove the unnecessary solvent and to form a resist film, exposing patternwise the resist film to high-energy radiation, PEB, and developing in an alkaline developer to form a positive pattern; heating the positive pattern to render it resistant to a second organic solvent used in a second resist composition; coating the second resist composition comprising a resin and the second organic solvent onto the positive pattern-bearing substrate, prebaking, exposing, PEB, and developing in a third organic solvent to form a negative pattern, whereby the positive pattern of the first resist composition and the negative pattern of the second resist composition are simultaneously formed.

In order that the first positive resist composition be turned insoluble in organic solvent by baking after development, crosslinking reaction must take place as well as deprotection of the acid labile group. With the acid labile group eliminated, the resin turns insoluble in the third organic solvent during development of the second resist composition. However, since the second solvent used in the second resist composition has a higher solubility than the developer for the second resist composition, the resin must be insoluble in the second solvent used in the second resist composition.

The crosslink formation relies on electrophilic partial structures such as ester groups, cyclic ether and the like in the resin. With the aid of acid and heat, crosslinking reaction takes place via ester exchange, ring opening, esterification and etherification of lactone ring, ring opening, etherification and esterification of cyclic ether, or the like.

The polymer advantageously used as the base resin in the first positive resist composition is a polymer comprising recurring units having a lactone ring, especially recurring units having 7-oxanorbornane ring, and preferably recurring units (a) of the general formula (1). Since this polymer has both an ester group and cyclic ether in a common recurring unit, it is highly reactive for crosslinking reaction. Since this unit is used as an adhesive unit, the inventive process is effectively applicable without adding any extra construction to the base resin. The resin used in the negative resist composition adapted for subsequent organic solvent development may comprise recurring units having 7-oxanorbornane ring, though such units are not essential.

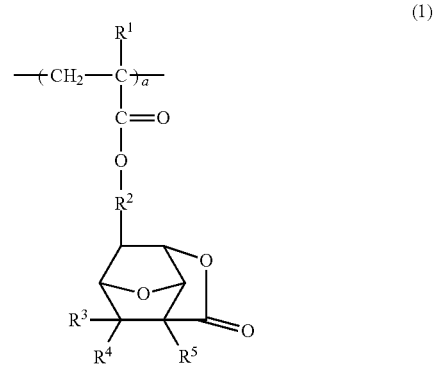

Herein $R^1$ is hydrogen or methyl. $R^2$ is a single bond, or a straight, branched or cyclic $C_1$-$C_6$ alkylene group which may contain an ether or ester moiety and which has a primary or secondary carbon atom through which it is linked to the ester moiety in the formula. $R^3$, $R^4$, and $R^5$ are each independently hydrogen, a straight, branched or cyclic $C_1$-$C_6$ alkyl group or cyano group, and a is a number in the range: $0 < a < 1.0$.

Examples of the $C_1$-$C_6$ alkylene group include methylene, ethylene, n-propylene, isopropylene, n-butylene, isobutylene, sec-butylene, n-pentylene, isopentylene, cyclopentylene, n-hexylene, and cyclohexylene. Examples of the $C_1$-$C_6$ alkyl group include methyl, ethyl, n-propyl, isopropyl, n-butyl, isobutyl, sec-butyl, n-pentyl, isopentyl, cyclopentyl, n-hexyl, and cyclohexyl.

The monomer Ma from which recurring units (a) of formula (1) are derived has the following formula.

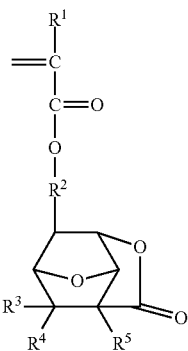

Ma

Herein $R^1$ to $R^5$ are as defined above.

Examples of the monomer Ma are shown below.

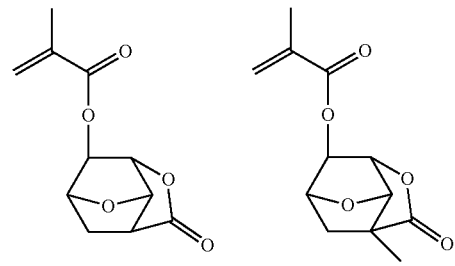

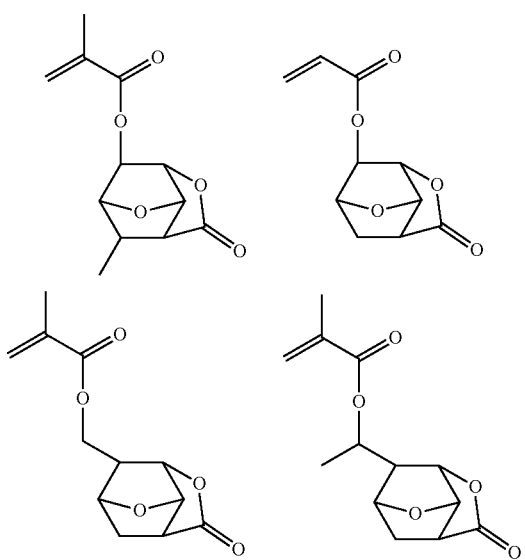

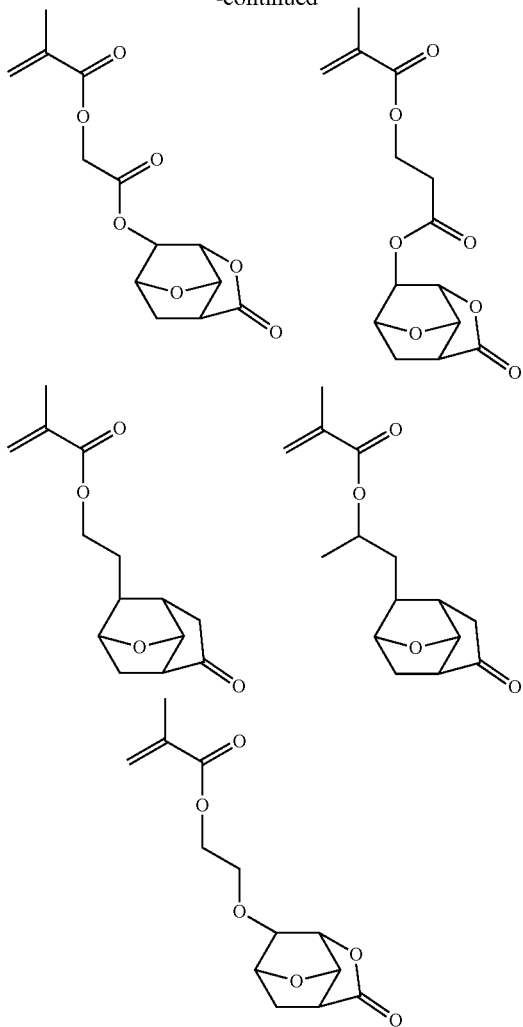

-continued

The process proceeds through the steps of forming a first positive pattern by exposure and alkaline development, deprotection of the acid labile group and crosslinking reaction with the aid of acid and heat, coating a second resist composition thereon, and developing it in an organic solvent to form a negative pattern. The first pattern becomes a film which is alkali soluble as a result of deprotection of the acid labile group from the acid labile group-containing recurring unit, and which is insoluble in the second solvent in the second resist composition and the organic solvent developer for forming negative pattern as a result of crosslinking of 7-oxanorbornane ring. Therefore, when the second resist composition is coated on the first pattern which has been developed in alkaline developer and subsequently heated, intermixing does not occur between the first pattern and the second resist composition.

If a polymer comprising recurring units having oxirane or oxetane is used as the base resin in the first resist composition, crosslinking can take place at the temperature of the resist process, for example, the PEB temperature of about 90 to 130° C., because the oxirane or oxetane ring has a very high rate of cleavage reaction. As a result, the polymer turns alkali insoluble and does not function as the positive resist composition intended herein. On the other hand, the 1,4-epoxy bond of 7-oxanorbornane ring has a low rate of cleavage reaction as compared with the oxirane or oxetane ring. Thus, no crosslinking takes place in the heating temperature range of PEB. The recurring unit having 7-oxanorbornane ring is stable against acid in the process until development, and behaves as a hydrophilic group to exert the function of improving adhesion and alkali solubility. However, with the aid of the acid generated by flood exposure or heating of the pattern after development and heating at 170° C. or higher, the 1,4-epoxy bond of 7-oxanorbornane ring undergoes ring-opening, and crosslinking reaction takes place. As a result, the polymer becomes insoluble in the relevant solvent. At the same time, deprotection of the acid labile group in the acid labile group-containing recurring unit occurs with the aid of acid and heat. A thermal acid generator capable of generating acid may be added to the resist composition, or the entire surface of the pattern after development may be irradiated with UV of wavelength 400 nm or less.

The base resin used in the positive resist composition in the pattern forming process of the invention is preferably a polymer comprising crosslinkable recurring units (a) of the general formula (1) and acid labile group-containing recurring units (b) of the general formula (2).

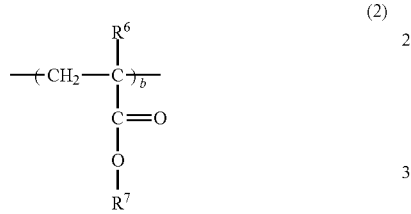

(2)

Herein $R^6$ is hydrogen or methyl, $R^7$ is an acid labile group, and b is a number in the range: $0<b\leq0.8$.

The monomer Mb from which recurring units (b) of formula (2) are derived has the following formula.

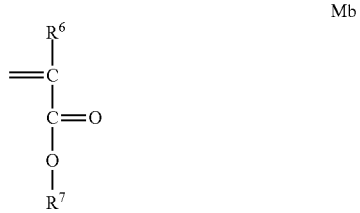

Mb

Herein $R^6$ and $R^7$ are as defined above.

The second resist composition for forming a negative pattern through organic solvent development preferably comprises a polymer comprising recurring units (c) or (d) having a carboxyl or hydroxyl group whose hydrogen atom is substituted by an acid labile group, as represented by the general formula (3).

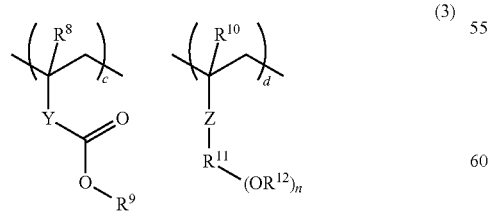

(3)

Herein $R^8$ and $R^{10}$ each are hydrogen or methyl. $R^9$ and $R^{12}$ each are an acid labile group. Y is a single bond or —C(=O)—O—$R^{13}$—, wherein $R^{13}$ is a straight, branched or cyclic $C_1$-$C_{10}$ alkylene group which may contain an ether or ester moiety, or a naphthylene group. Z is a single bond or —C(=O)—O—. $R^{11}$ is a straight, branched or cyclic $C_1$-$C_{15}$ alkylene group or a trivalent group obtained by eliminating one hydrogen from the alkylene group, which may contain an ether or ester moiety, or a naphthylene group or a trivalent group obtained by eliminating one hydrogen from the naphthylene group. The subscript n is 1 or 2, c and d are numbers in the range: $0\leq c<1.0$, $0\leq d<1.0$, and $0<c+d<1.0$.

The monomers Mc and Md from which recurring units (c) and (d) of formula (3) are derived has the following formulae.

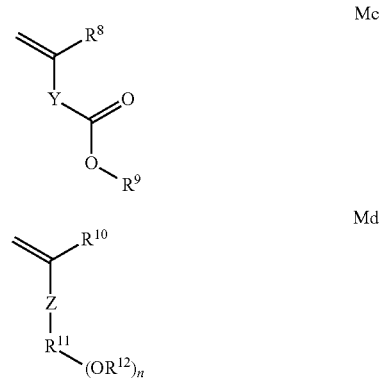

Herein $R^8$ to $R^{12}$, Y, Z and n are as defined above.

Examples of the monomer Mc wherein Y is a variant are shown below wherein $R^8$ and $R^9$ are as defined above.

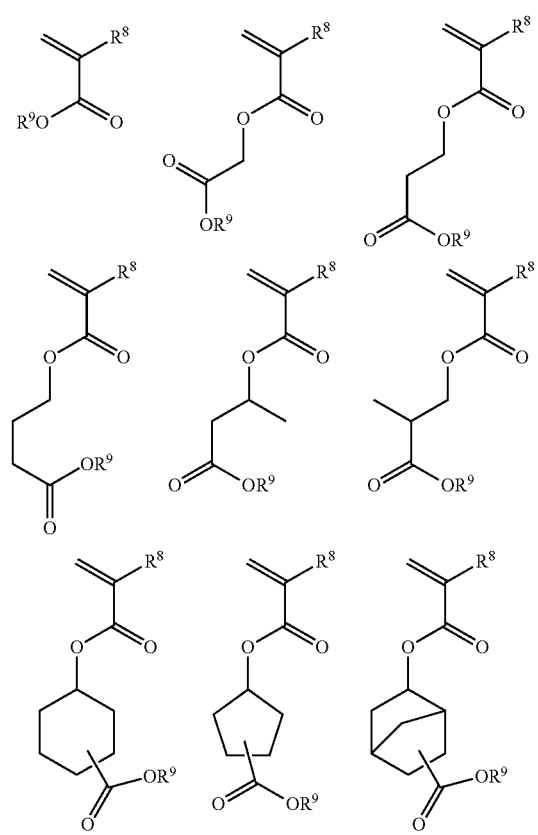

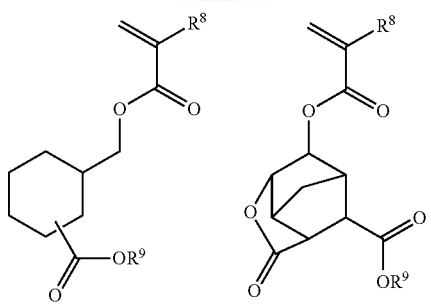
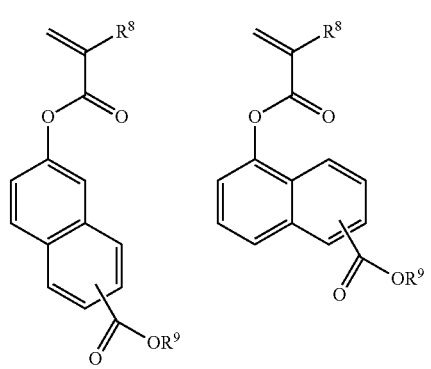
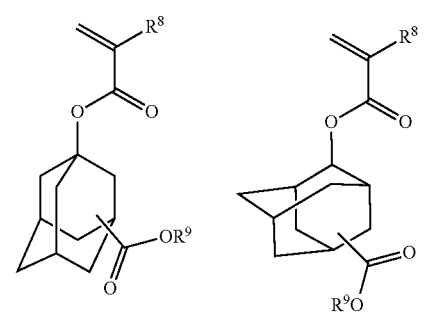
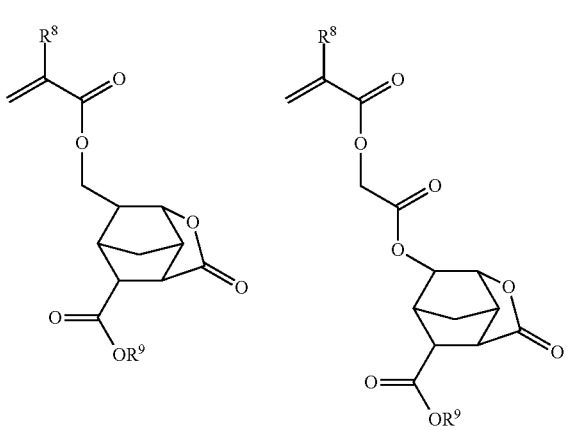
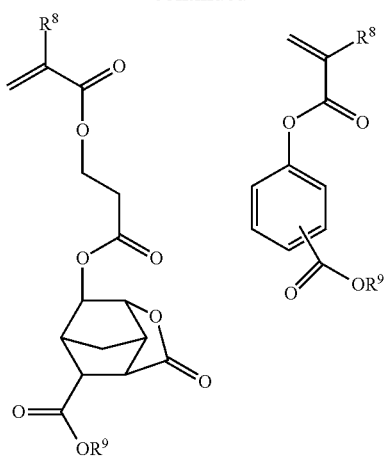
Examples of the monomer Md are shown below wherein $R^{10}$ and $R^{12}$ are as defined above.
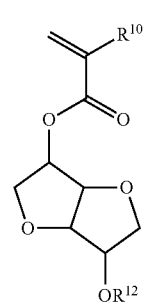
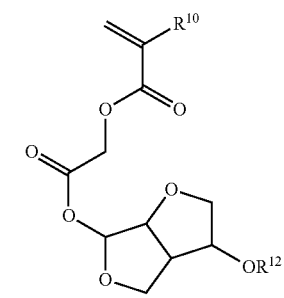

-continued
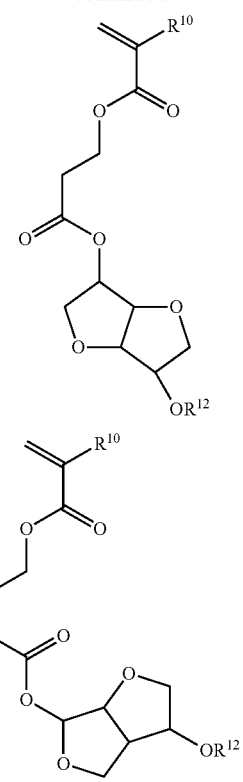
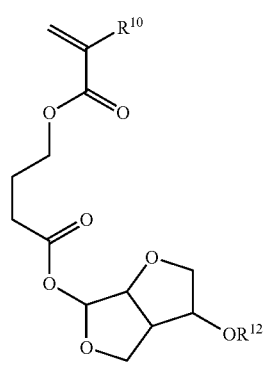
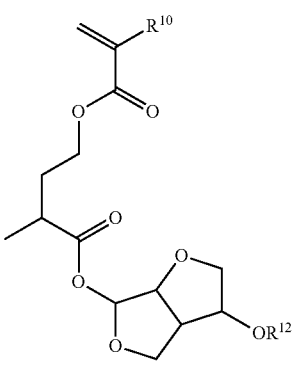
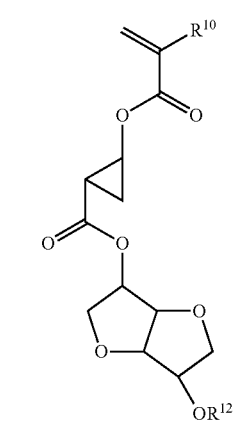
-continued
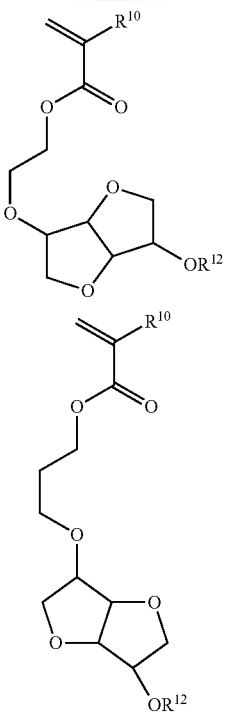
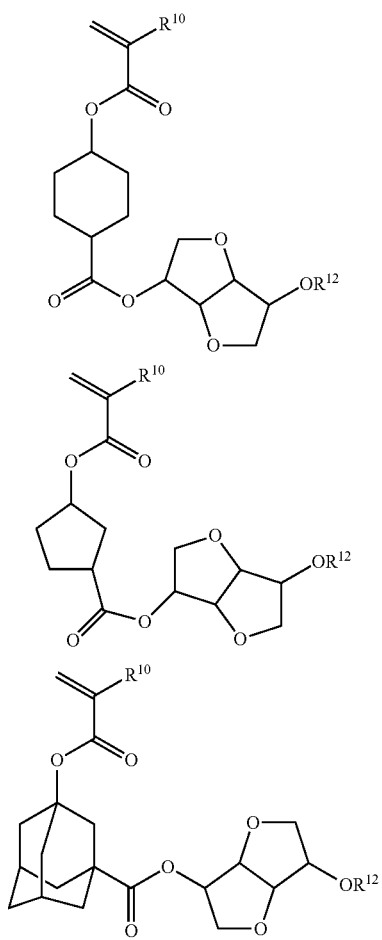

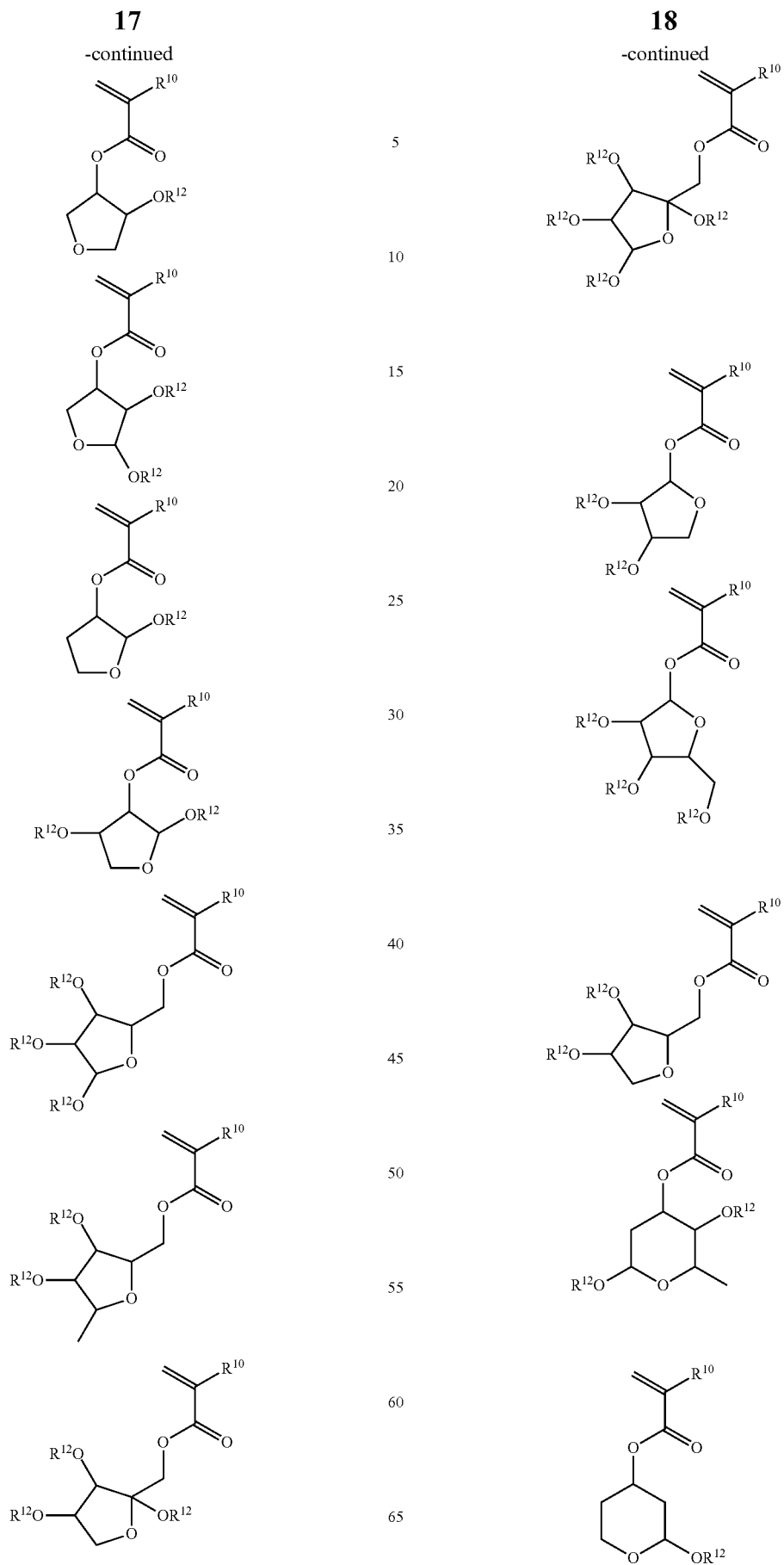

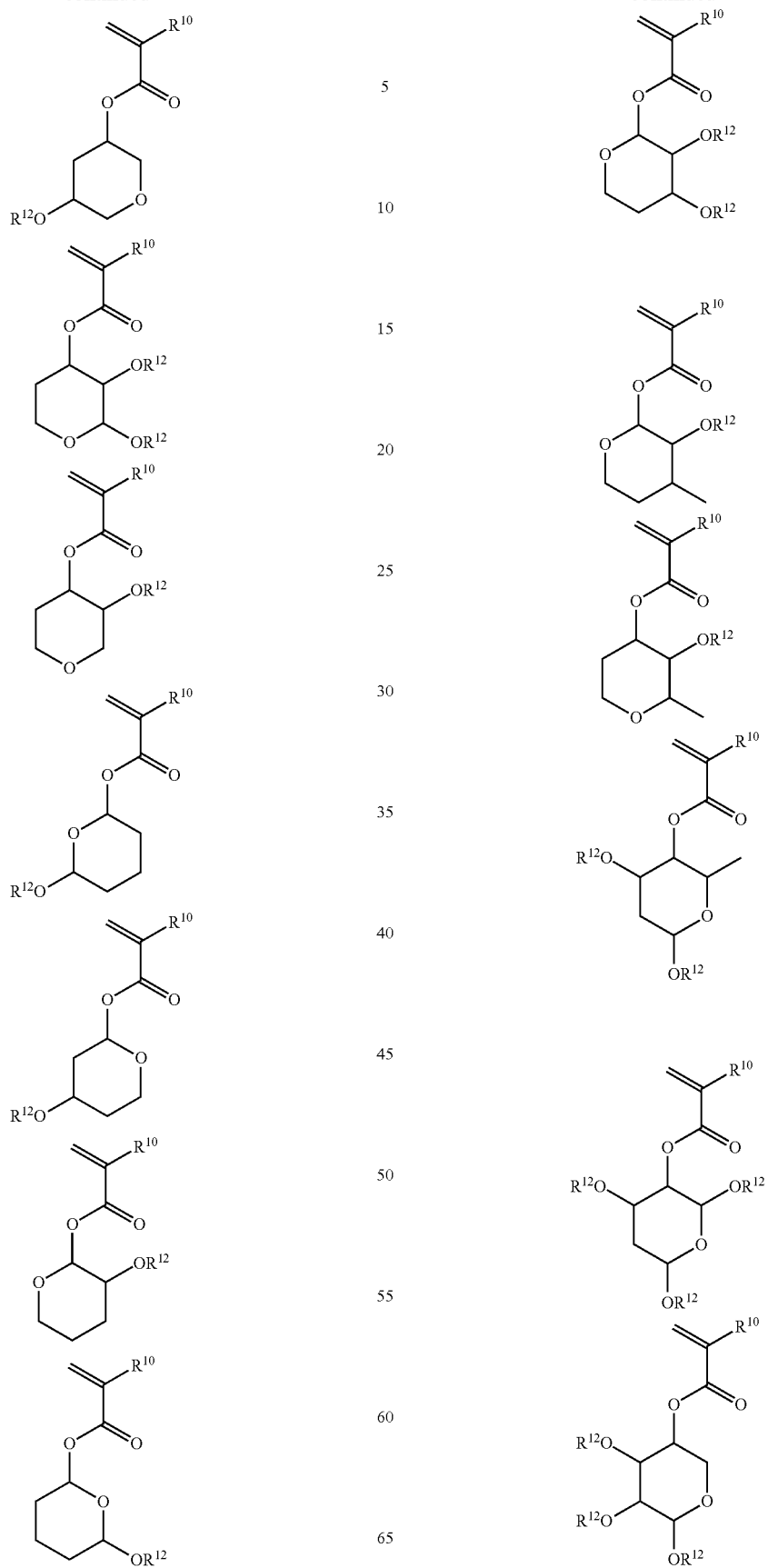

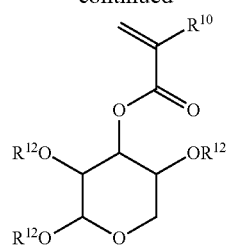
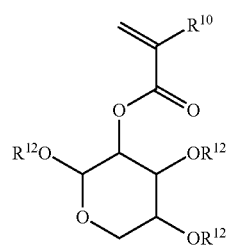
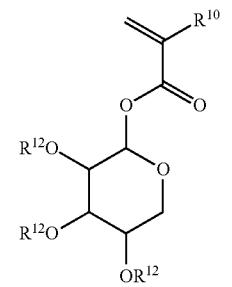
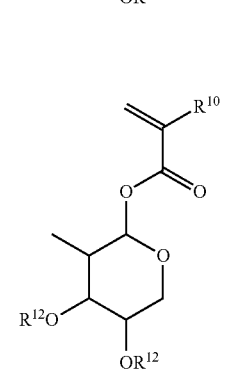
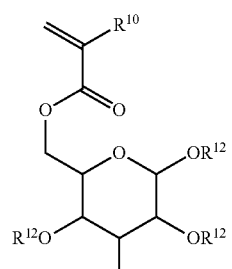
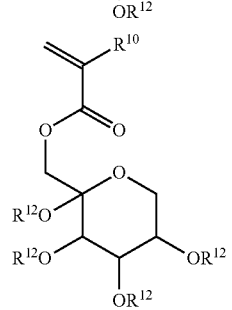
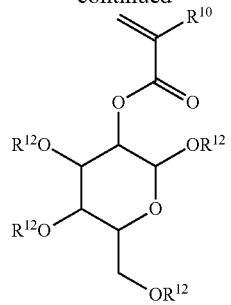
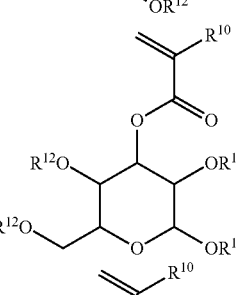
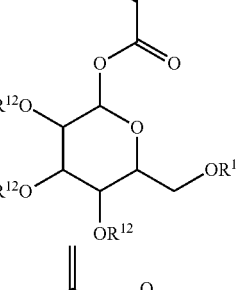
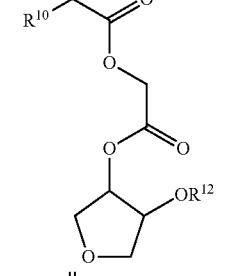
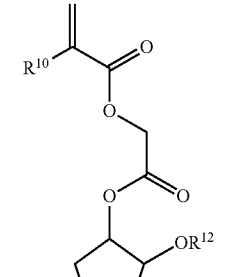
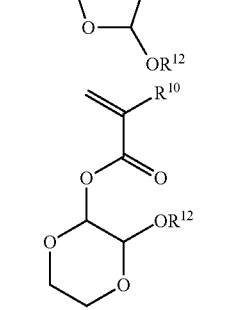

-continued
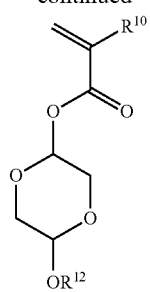
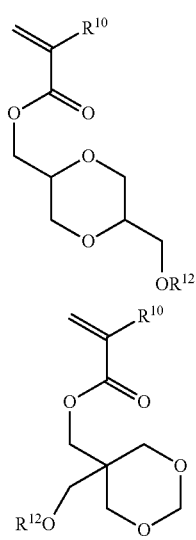
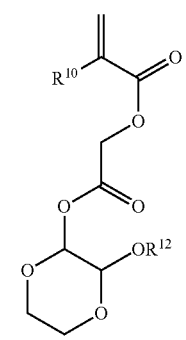
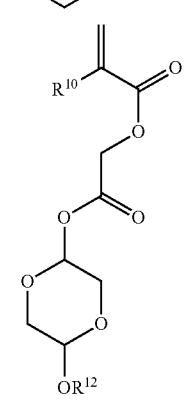
-continued
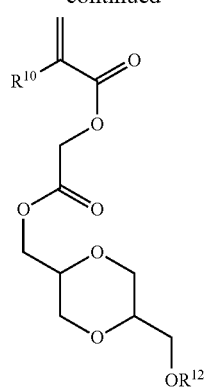
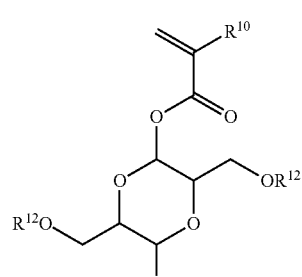
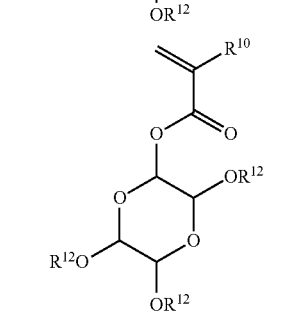
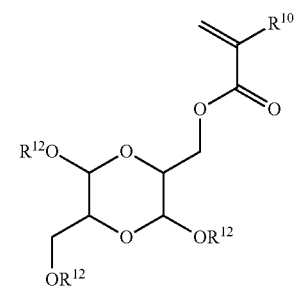
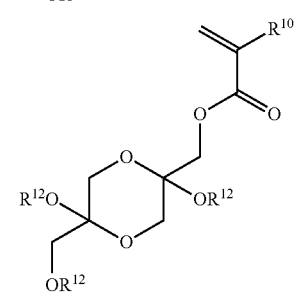

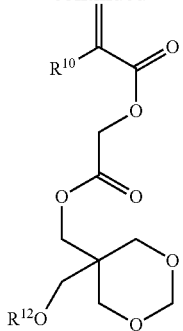
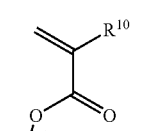
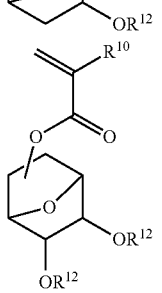
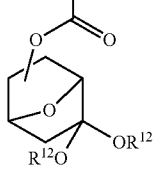
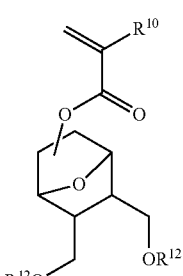
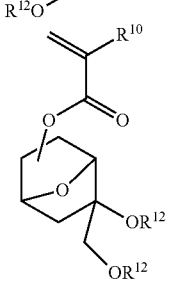
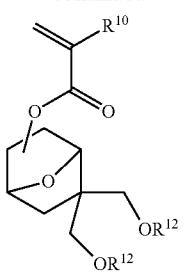
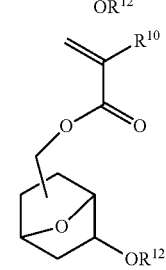
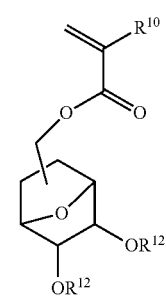
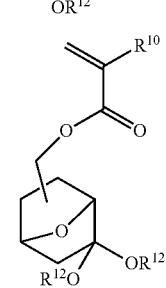
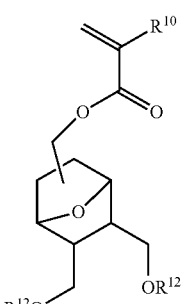
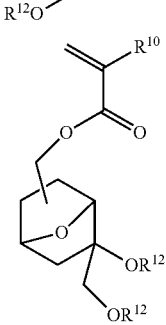

27
-continued
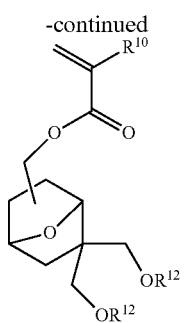
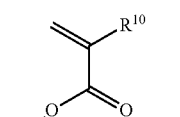
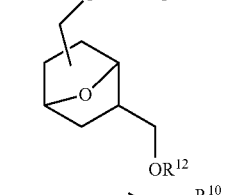
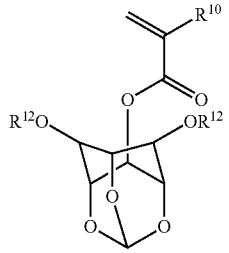
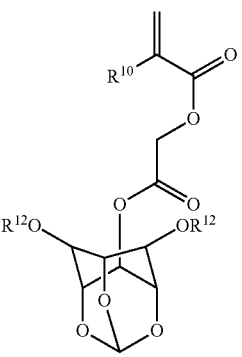
28
-continued
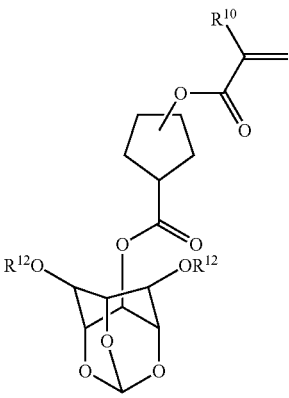
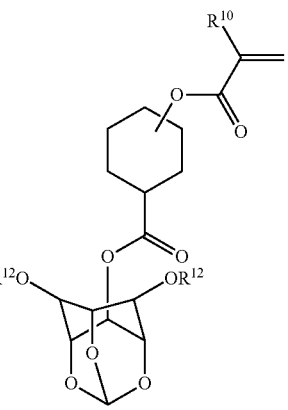
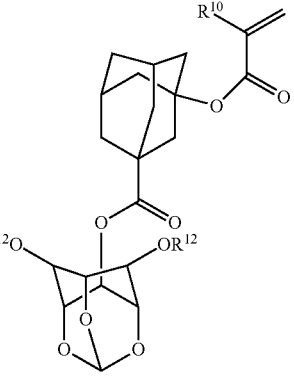
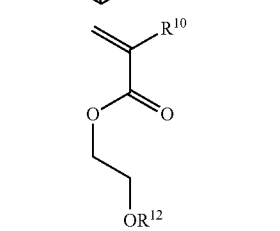
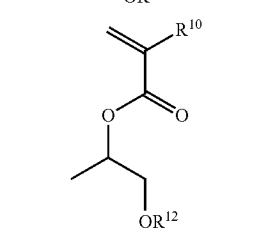

-continued
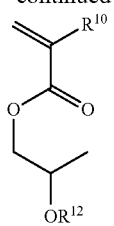
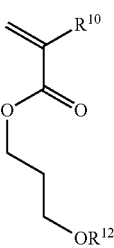
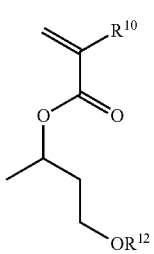
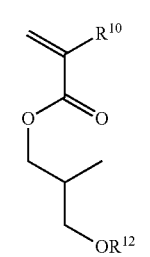
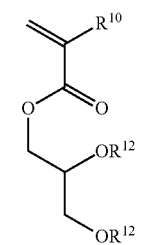
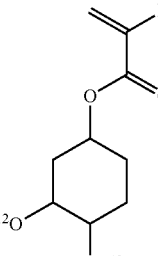
-continued
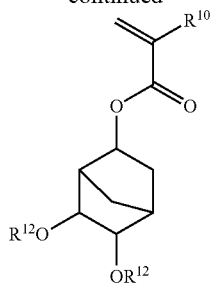
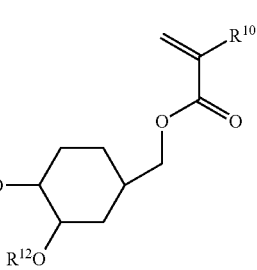
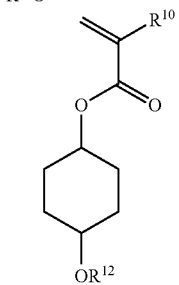
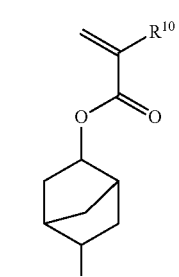
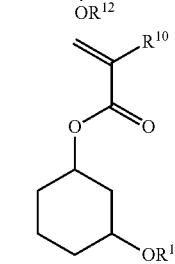
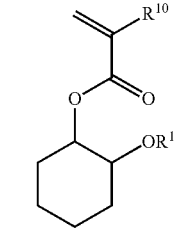

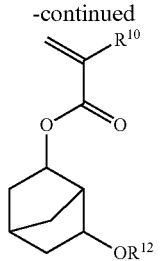
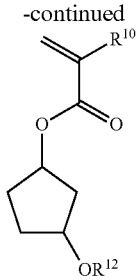
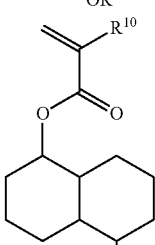
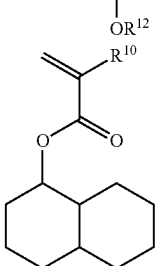
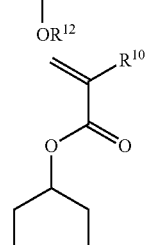
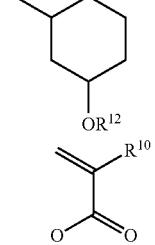
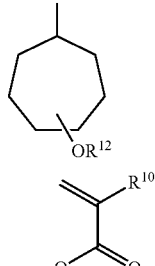
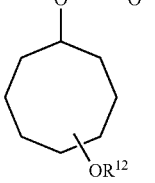

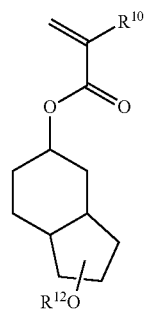
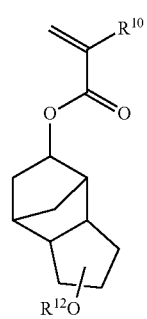
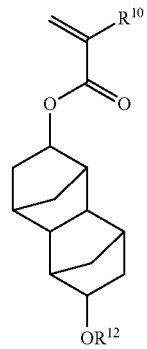
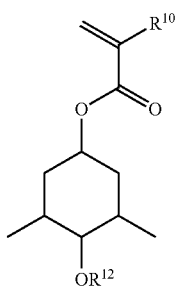
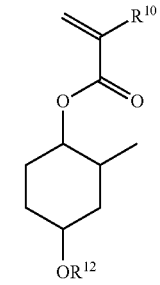
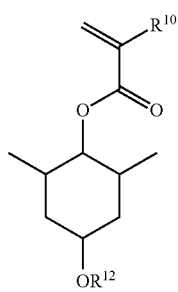
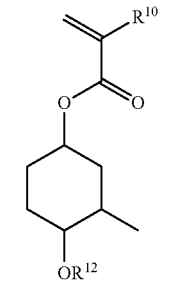
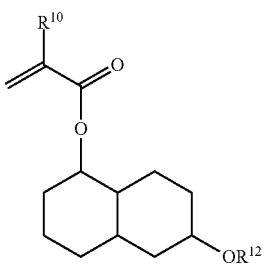
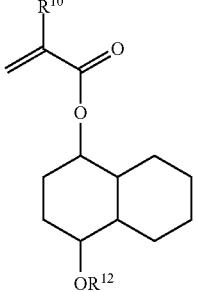
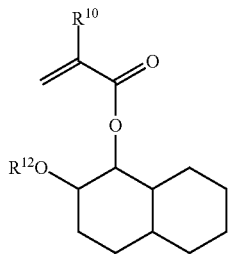
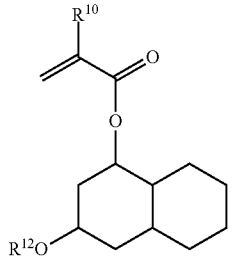

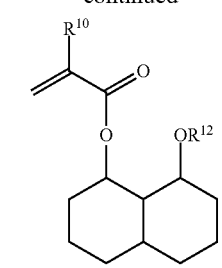
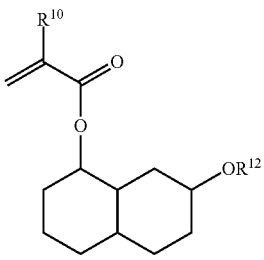
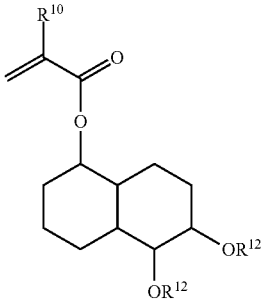
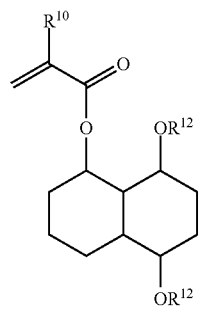
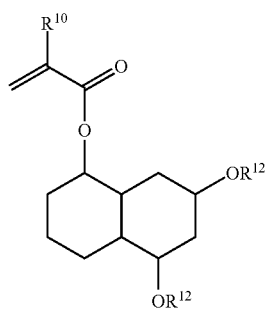
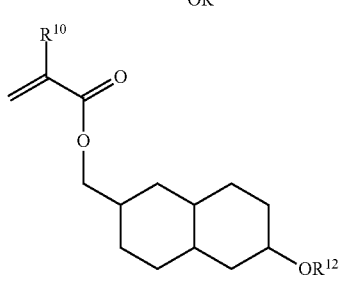
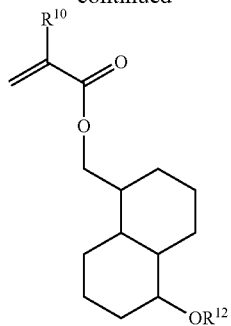
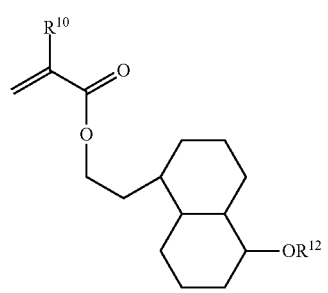
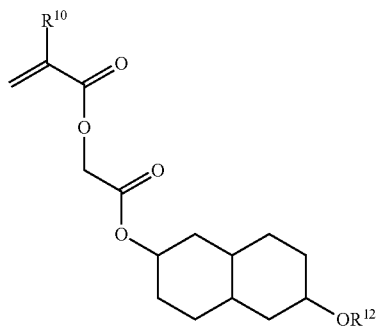
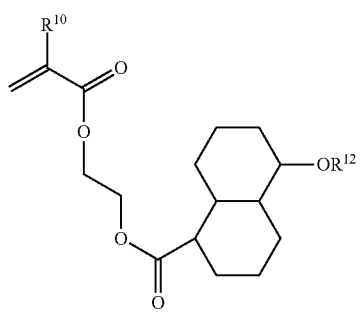
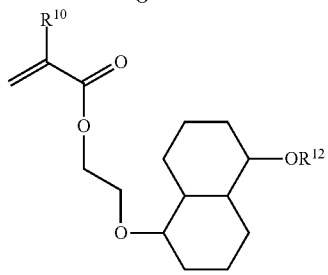

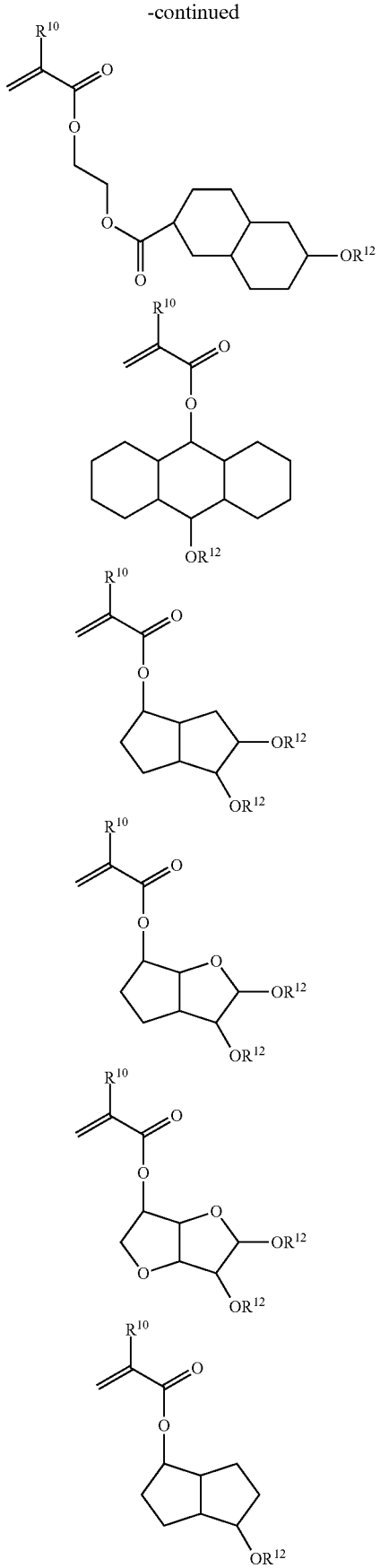
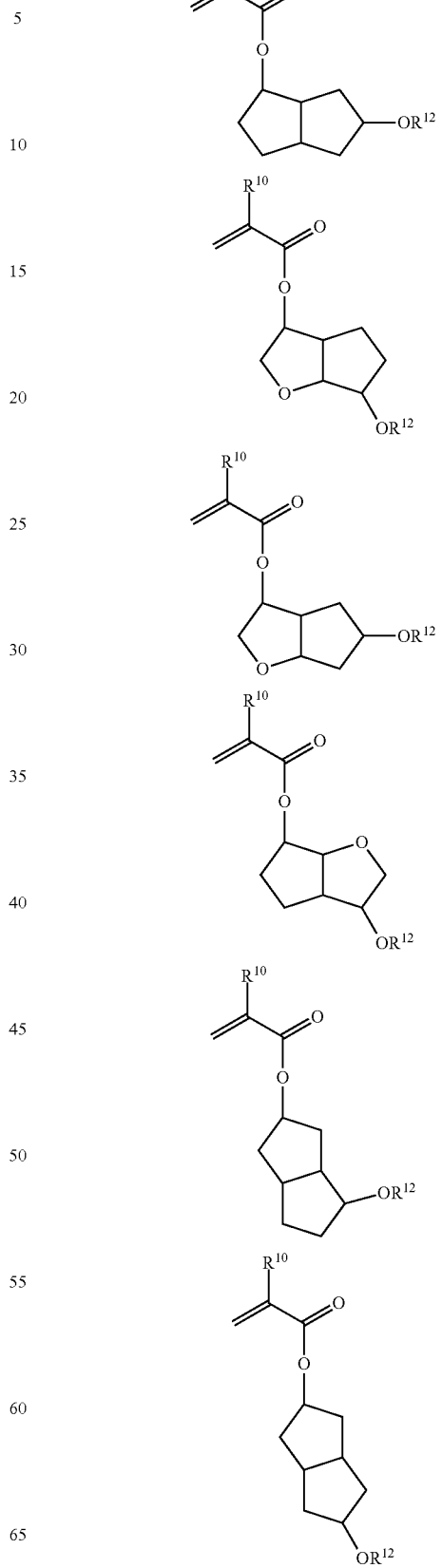

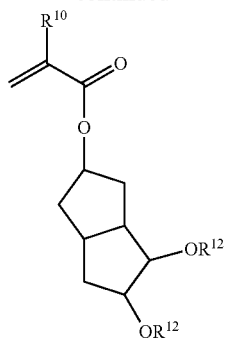
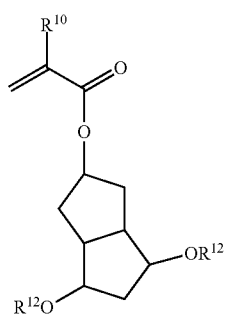
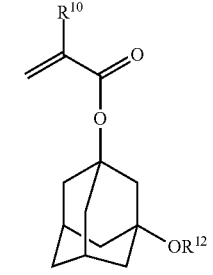
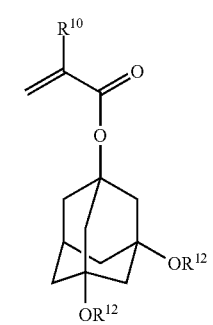
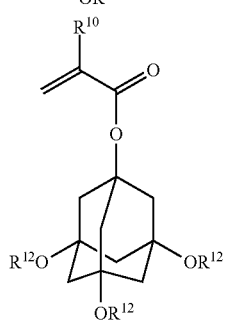
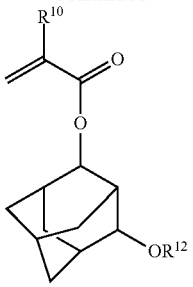
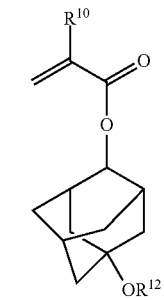
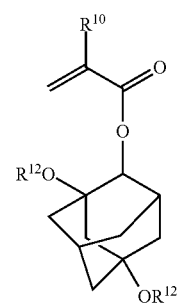
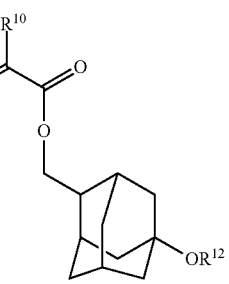
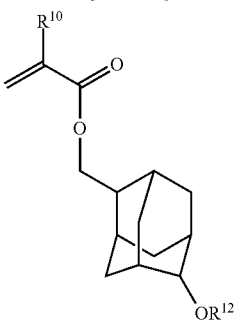

-continued

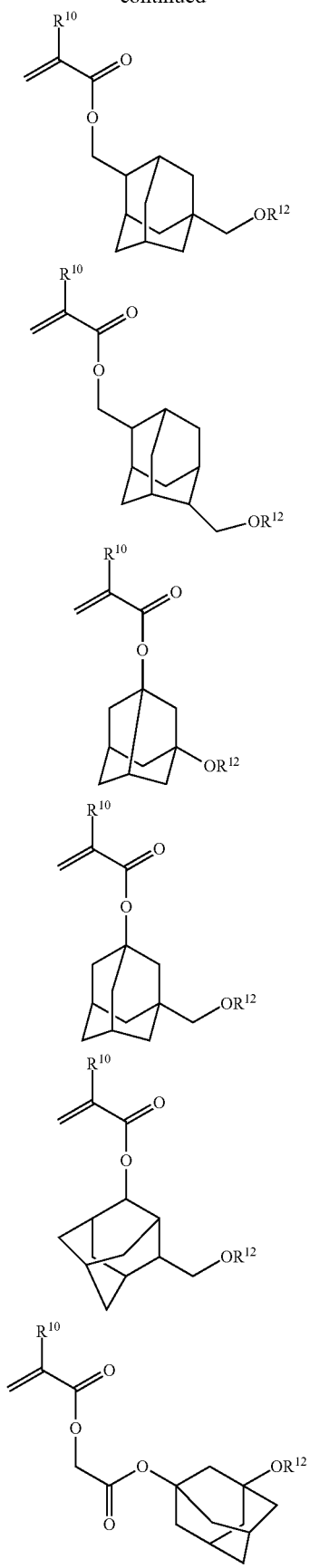

-continued

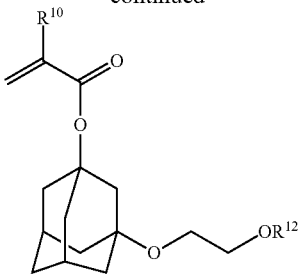

The acid labile groups represented by $R^7$, $R^9$ and $R^{12}$ in formulae (2) and (3) may be selected from a variety of such groups. Preferred acid labile groups are groups of formulae (AL-10) and (AL-11), tertiary alkyl groups of formula (AL-12), and oxoalkyl groups of 4 to 20 carbon atoms, but not limited thereto.

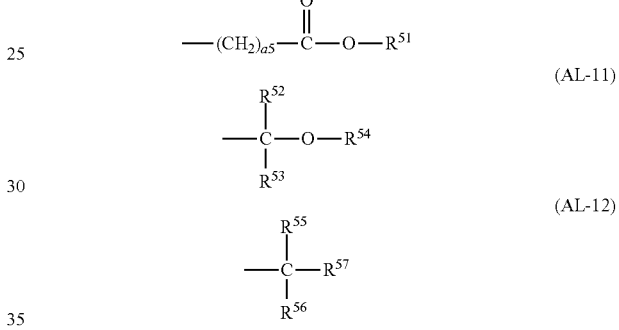

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, preferably 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

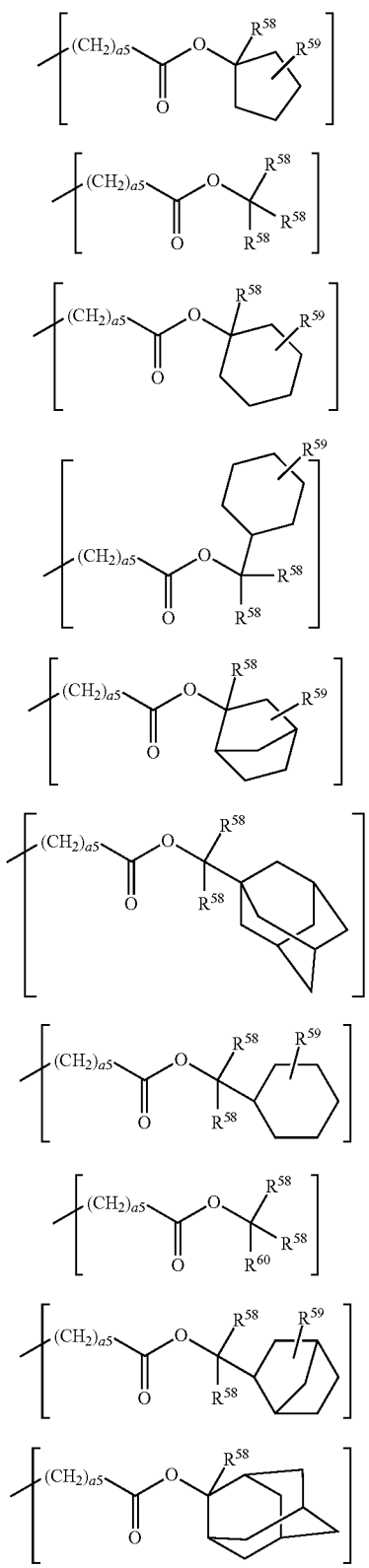

In formulae (AL-10)-1 to (AL-10)-10, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10 as defined above.

Illustrative examples of the acetal group of formula (AL-11) include those of the following formulae (AL-11)-1 to (AL-11)-34.

(AL-11)-1    —CH$_2$—O—CH$_3$ (AL-11)-2    —CH$_2$—O—CH$_2$—CH$_3$ (AL-11)-3    —CH$_2$—O—(CH$_2$)$_2$—CH$_3$ (AL-11)-4    —CH$_2$—O—(CH$_2$)$_3$—CH$_3$ (AL-11)-5    —CH$_2$—O—CH(CH$_3$)—CH$_3$ (AL-11)-6    —CH$_2$—O—C(CH$_3$)$_3$ (AL-11)-7    —CH(CH$_3$)—O—CH$_3$ (AL-11)-8    —CH(CH$_2$CH$_3$)—O—CH$_3$ (AL-11)-9    —CH(CH$_2$CH$_2$CH$_3$)—O—CH$_3$ (AL-11)-10   —CH(CH$_3$)—O—CH$_2$—CH$_3$ (AL-11)-11   —CH(CH$_2$CH$_3$)—O—CH$_2$—CH$_3$ (AL-11)-12   —CH(CH(CH$_3$)$_2$)—O—CH$_2$—CH$_3$ (AL-11)-13   —CH(CH$_3$)—O—(CH$_2$)$_2$—CH$_3$ (AL-11)-14   —CH(CH$_2$CH$_3$)—O—(CH$_2$)$_2$—CH$_3$ (AL-11)-15   —CH(CH(CH$_3$)$_2$)—O—(CH$_2$)$_2$—CH$_3$ (AL-11)-16
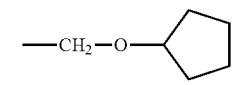

(AL-11)-17
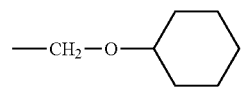

(AL-11)-18
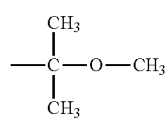

(AL-11)-19
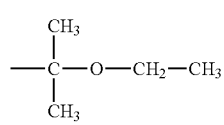

(AL-11)-20
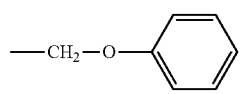

(AL-11)-21
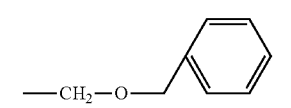

(AL-11)-22
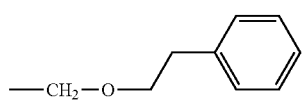

(AL-11)-23
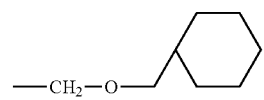

(AL-11)-24
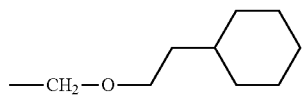

(AL-11)-25
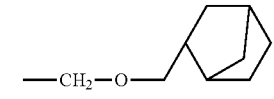

(AL-11)-26
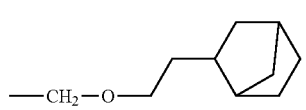

(AL-11)-27
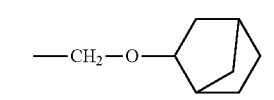

(AL-11)-28
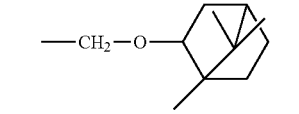

(AL-11)-29
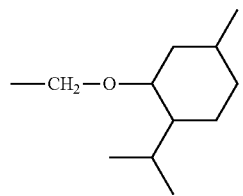

(AL-11)-30
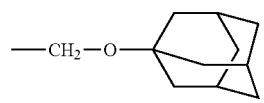

(AL-11)-31
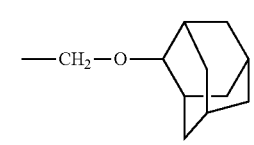

(AL-11)-32
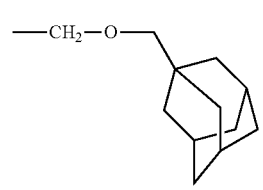

(AL-11)-33
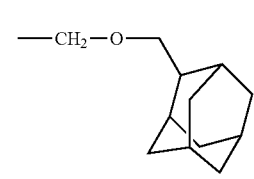

(AL-11)-34
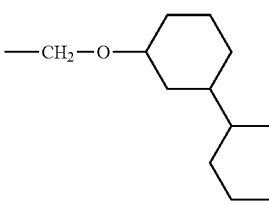

The polymer may be crosslinked within the molecule or between molecules with acid labile groups of formula (AL-11a) or (AL-11b).

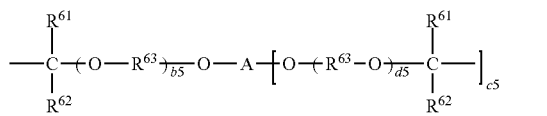
(AL-11a)

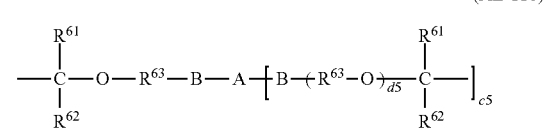
(AL-11b)

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ represent a straight or branched $C_1$-$C_8$ alkylene group when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

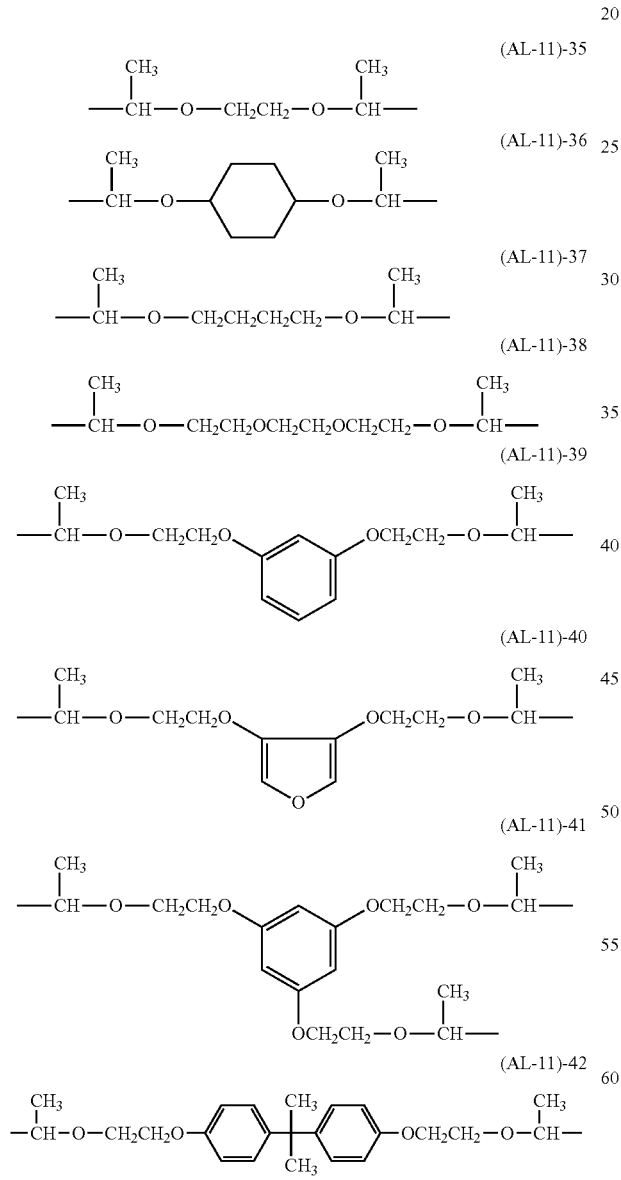

Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.

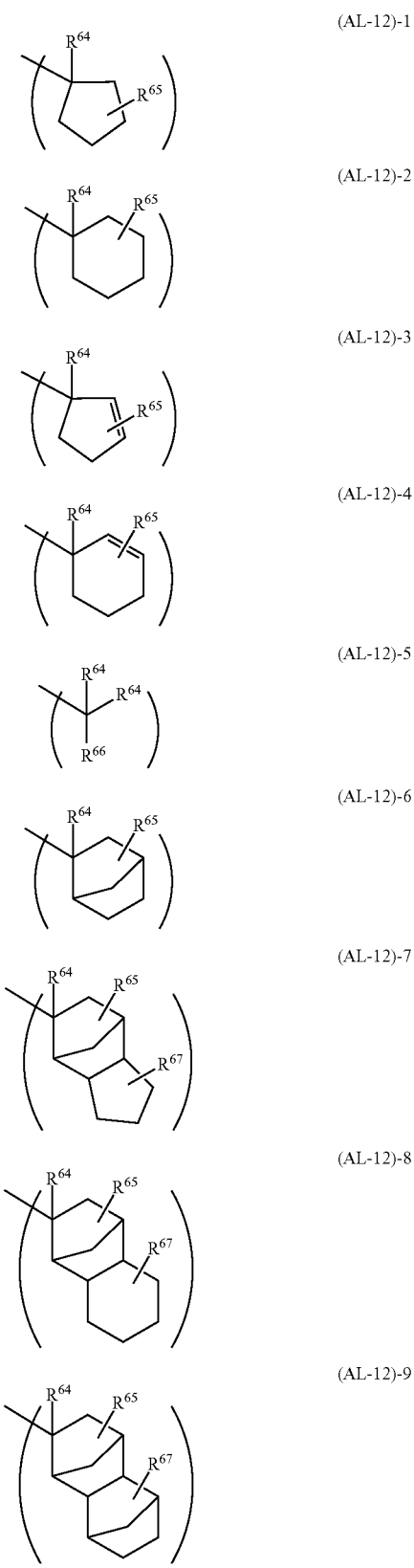

(AL-12)-10
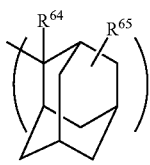

(AL-12)-11
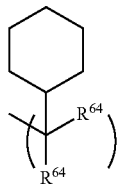

(AL-12)-12
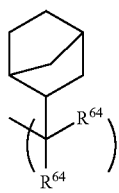

(AL-12)-13
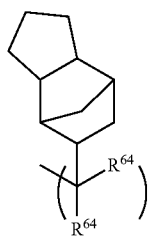

(AL-12)-14
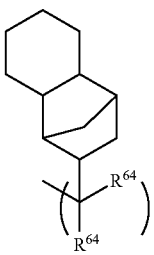

(AL-12)-15
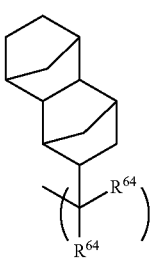

(AL-12)-16
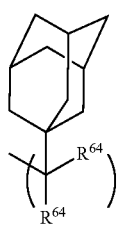

Herein $R^{64}$ is independently a straight, branched or cyclic $C_1$-$C_8$ alkyl group, $C_6$-$C_{20}$ aryl group or $C_7$-$C_{20}$ aralkyl group.

$R^{65}$ and $R^{67}$ each are hydrogen or a straight, branched or cyclic $C_1$-$C_{20}$ alkyl group. $R^{66}$ is a $C_6$-$C_{20}$ aryl group or $C_7$-$C_{20}$ aralkyl group.

With acid labile groups comprising $R^{068}$ representative of a di- or more valent alkylene or arylene group being included as shown in formulae (AL-12)-17 and (AL-12)-18, the polymer may be crosslinked within the molecule or between molecules.

(AL-12)-17
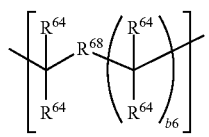

(AL-12)-18
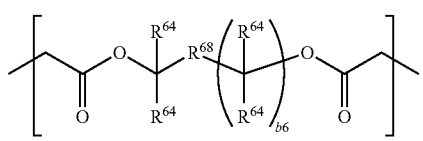

In formulae (AL-12)-17 and (AL-12)-18, $R^{64}$ is as defined above; $R^{68}$ is a straight, branched or cyclic $C_1$-$C_{20}$ alkylene group or arylene group which may contain a heteroatom such as oxygen, sulfur or nitrogen; and b6 is an integer of 1 to 3.

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

(AL-13)-1
—$(CH_2)_4OH$ (AL-13)-2
—$(CH_2)_2O(CH_2)_3CH_3$ (AL-13)-3

(AL-13)-4
—$(CH_2)_2O(CH_2)_2OH$ (AL-13)-5
—$(CH_2)_6OH$ (AL-13)-6
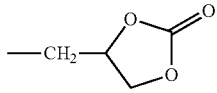

(AL-13)-7
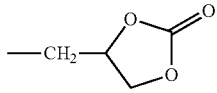

Of the acid labile groups of formula (AL-12), recurring units having an exo-form structure represented by the formula (AL-12)-19 are preferred.

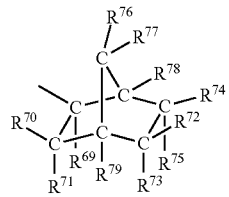 (AL-12)-19

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{78}$ and $R^{79}$ are each independently hydrogen or a monovalent hydrocarbon group, typically $C_1$-$C_{15}$ alkyl group, which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{78}$ may bond together to form a ring, typically alicyclic, with the carbon atom to which they are attached, and in this case, each group participating in ring formation is a divalent hydrocarbon group, typically $C_1$-$C_{15}$ alkylene group, which may contain a heteroatom. Also, a pair of $R^{70}$ and $R^{79}$, $R^{75}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 shown below are derived are described in U.S. Pat. No. 6,448,420 (JP-A 2000-327633).

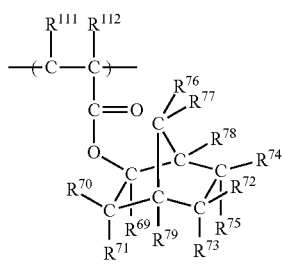

Illustrative non-limiting examples of suitable monomers are given below wherein $R^{111}$ and $R^{112}$ are each independently hydrogen, methyl, —COOCH, or —CH$_2$COOCH$_3$.

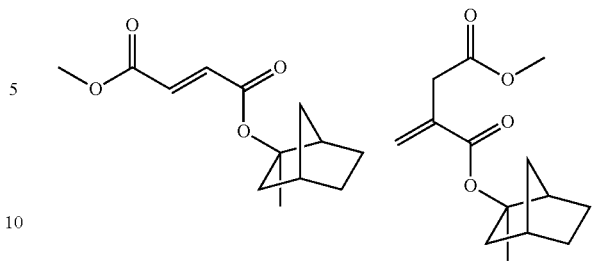

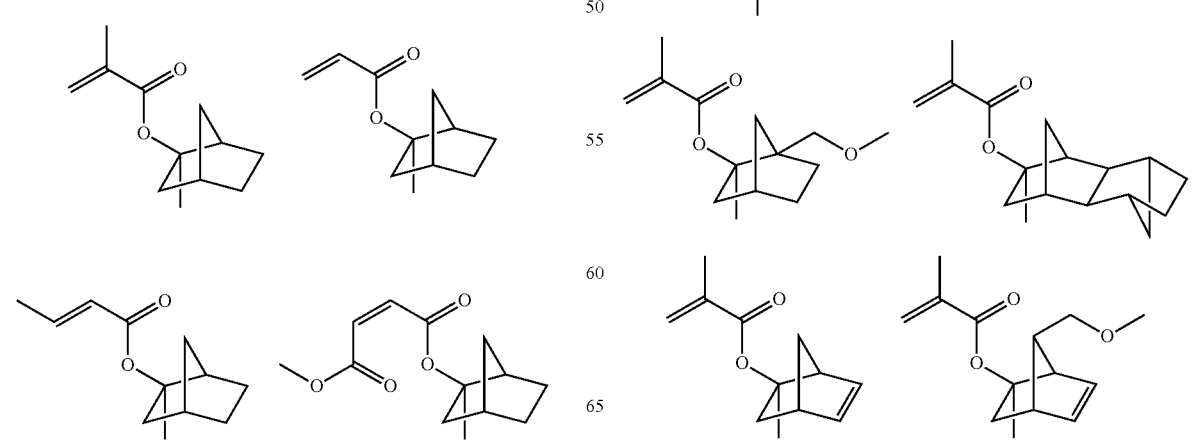

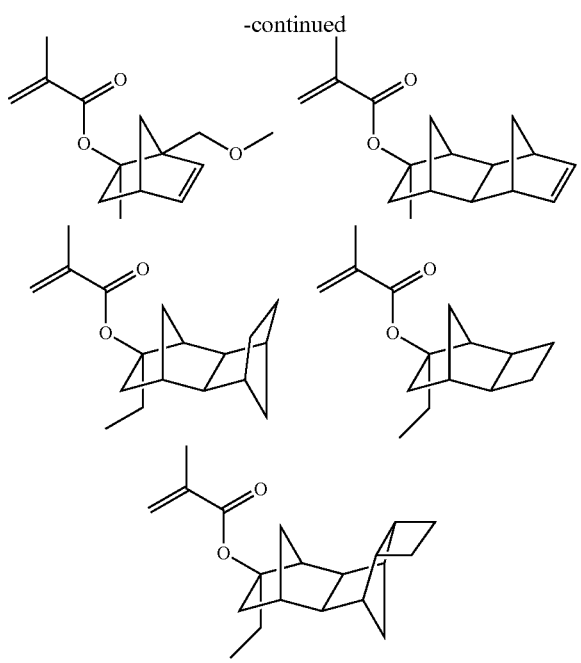

Also included in the acid labile groups of formula (AL-12) are acid labile groups having furandiyl, tetrahydrofurandiyl or oxanorbornanediyl as represented by the following formula (AL-12)-20.

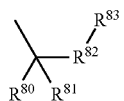
(AL-12)-20

Herein, $R^{80}$ and $R^{81}$ are each independently a monovalent hydrocarbon group, typically a straight, branched or cyclic $C_1$-$C_{10}$ alkyl group. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl group, which may contain a heteroatom.

Recurring units substituted with an acid labile group having furandiyl, tetrahydrofurandiyl or oxanorbornanediyl as represented by the formula:

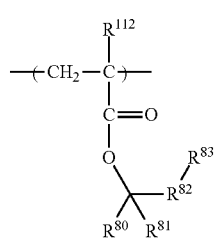

(wherein $R^{80}$ to $R^{83}$ and $8^{112}$ are as defined above) are derived from monomers, examples of which are shown below. Note that Me is methyl and Ac is acetyl.

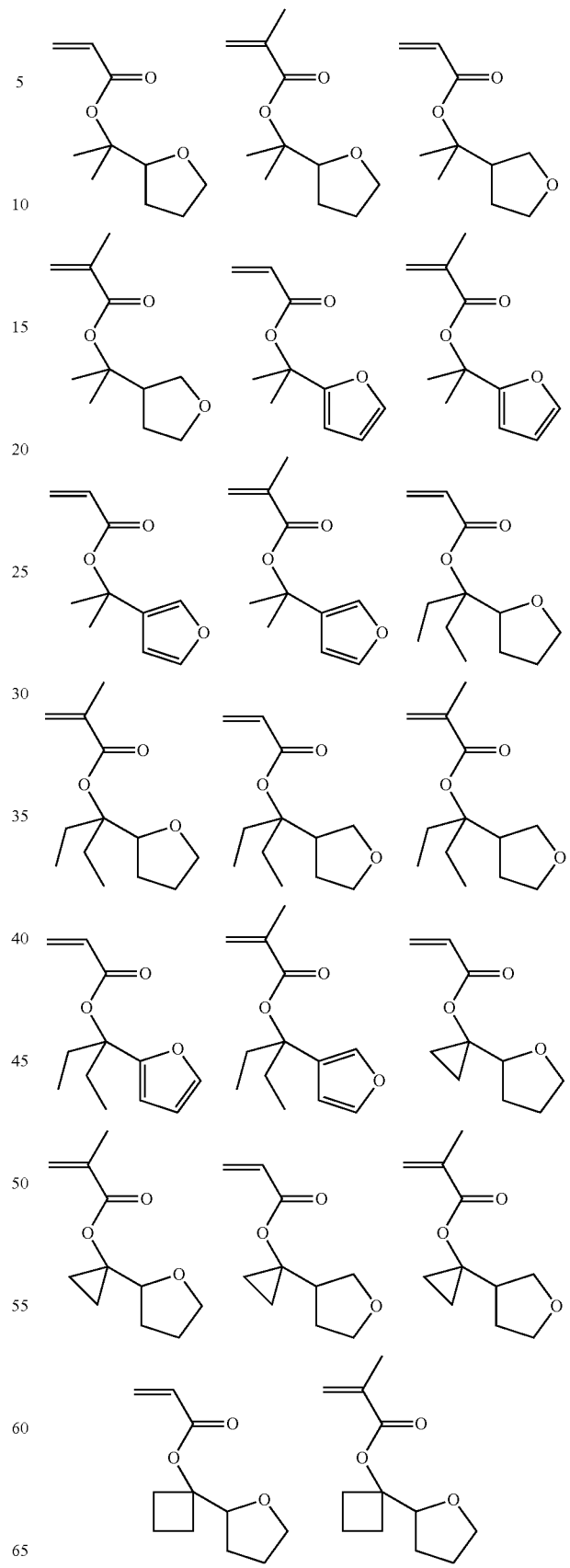

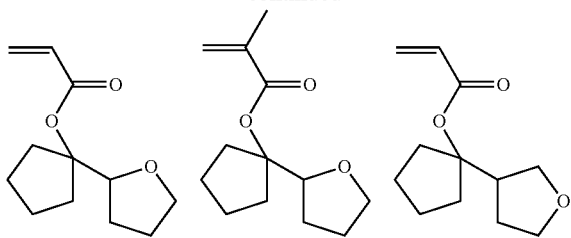
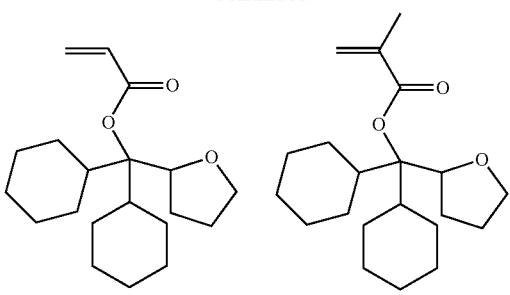
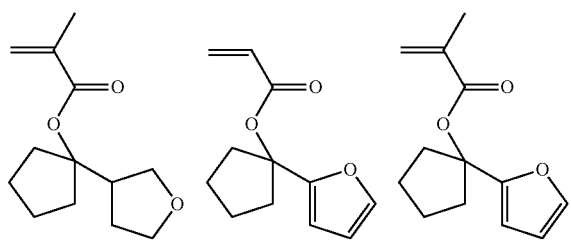
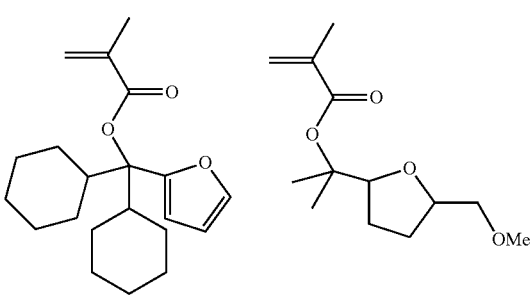
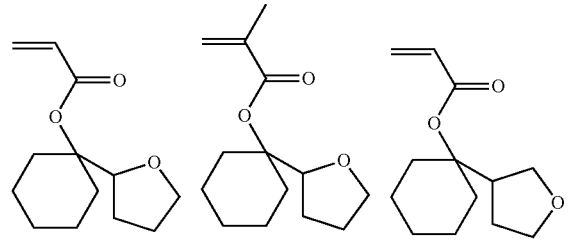
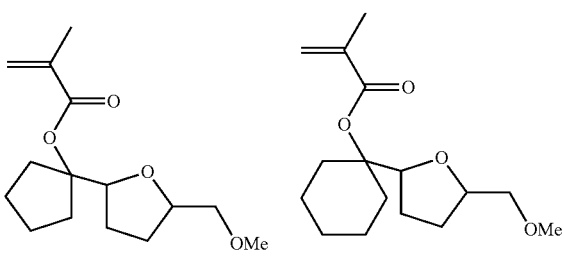
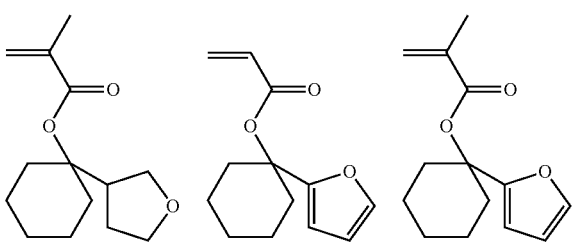
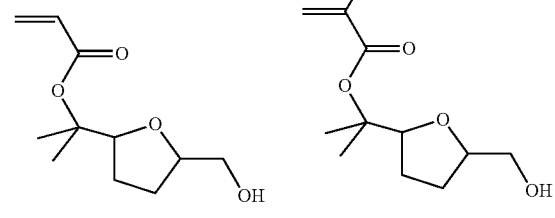
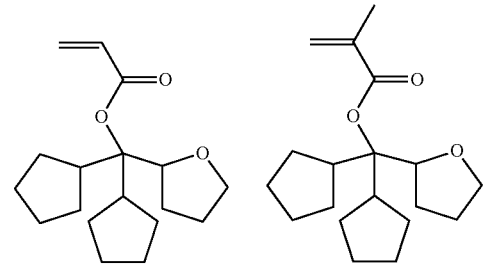
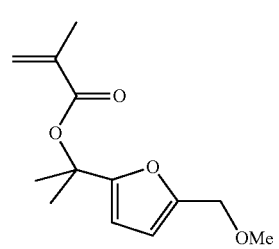
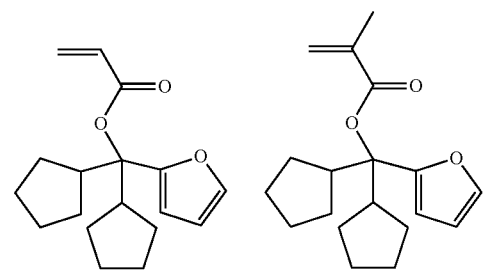

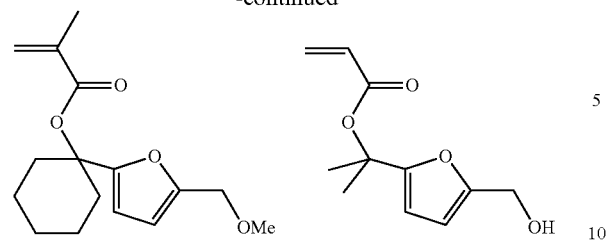
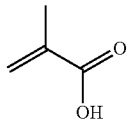
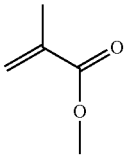
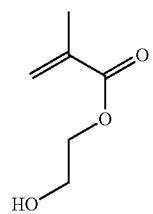
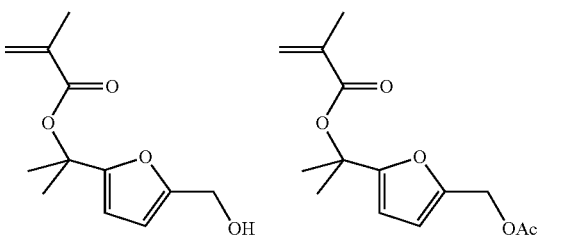
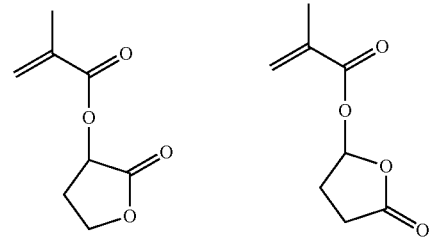
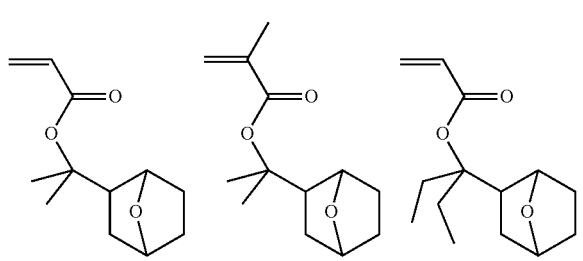
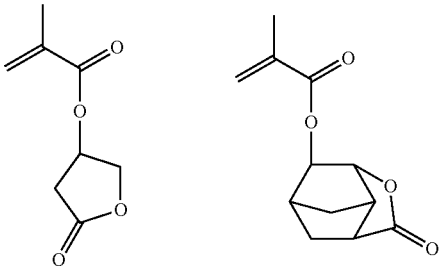
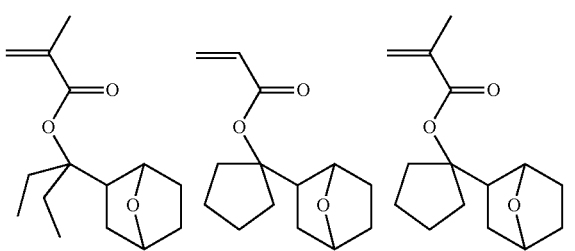
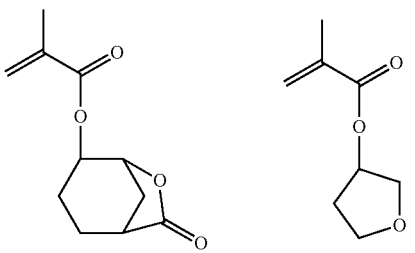
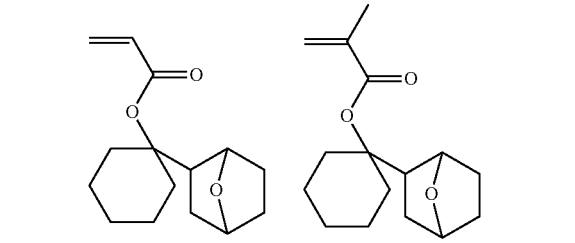
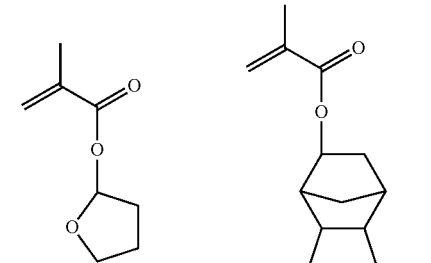

While the polymer in the first positive resist composition preferably includes recurring units (a) of formula (1) and recurring units (b) of formula (2) and the polymer in the second resist composition for negative development preferably includes recurring units (c) of formula (3) and/or recurring units (d) of formula (3), either of the polymers may have further copolymerized therein recurring units (e) derived from a monomer having an adhesive group such as hydroxy, cyano, carbonyl, ester, ether group, lactone ring, carboxyl or carboxylic anhydride group. Examples of monomers from which recurring units (e) are derived are given below.

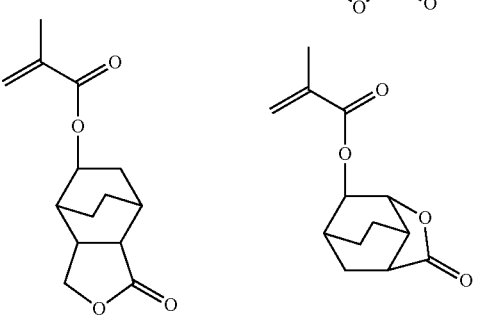

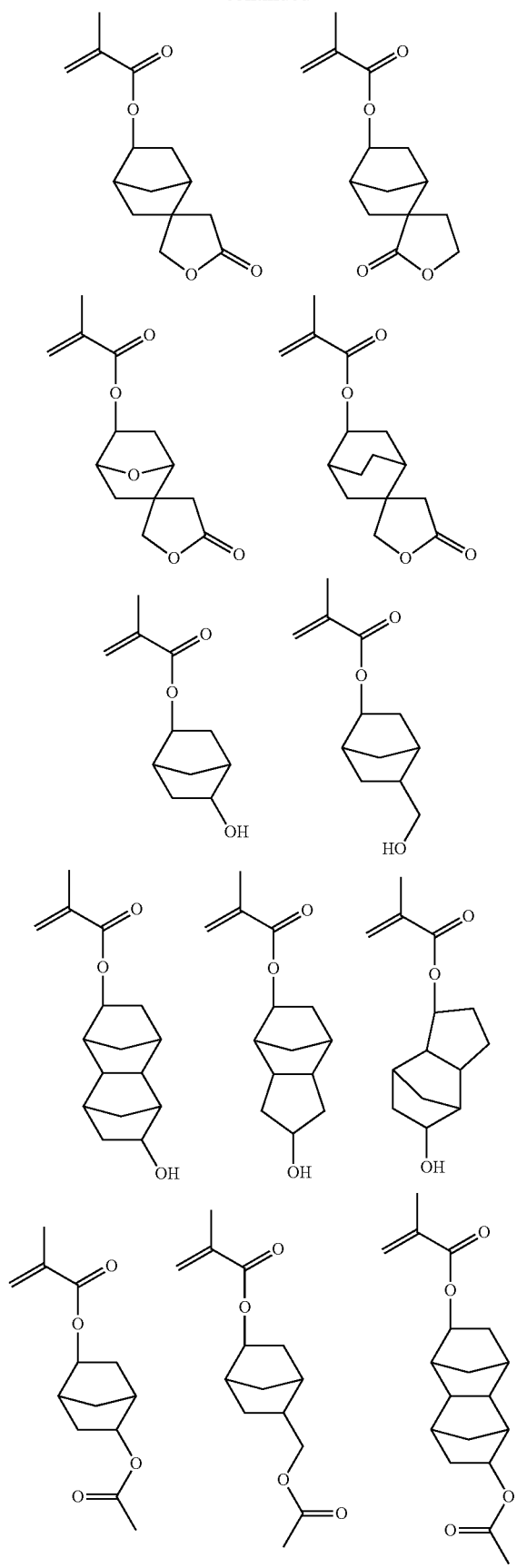
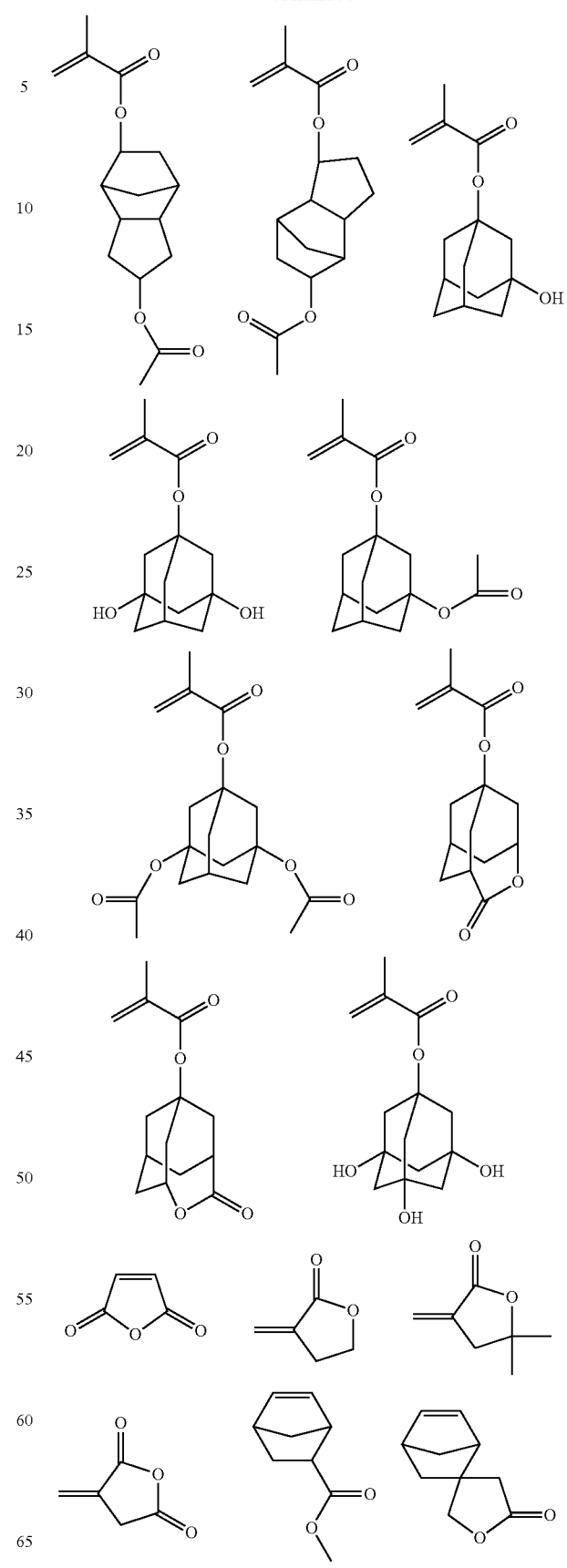

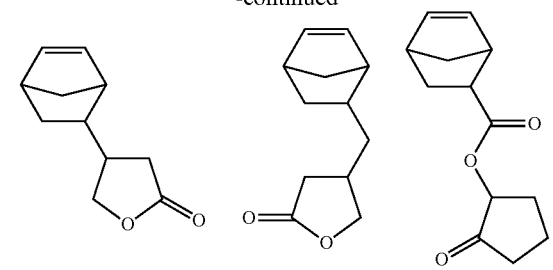
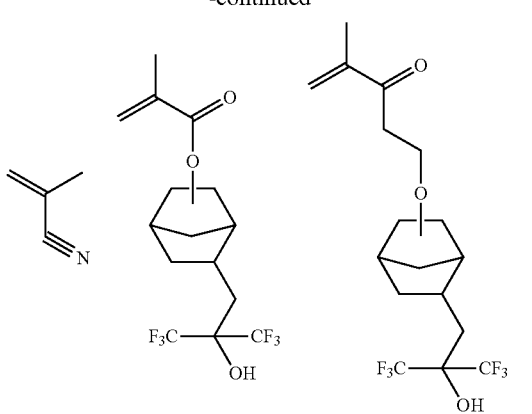
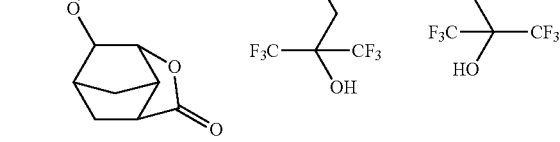
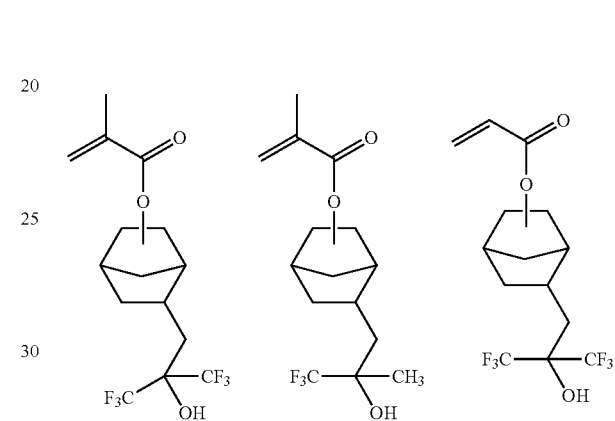
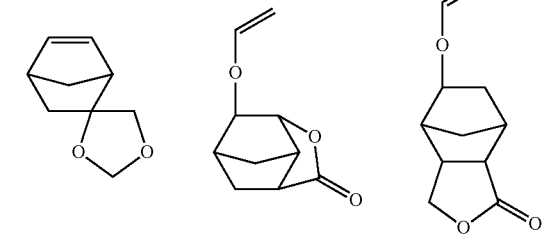
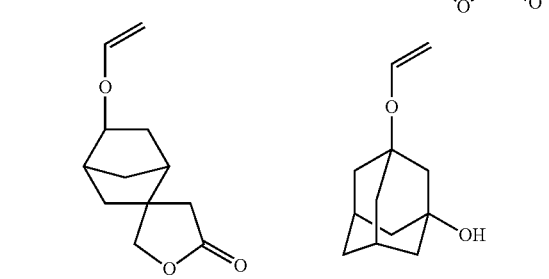
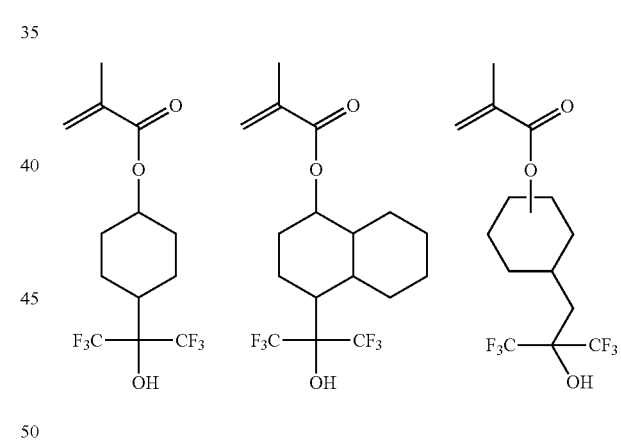
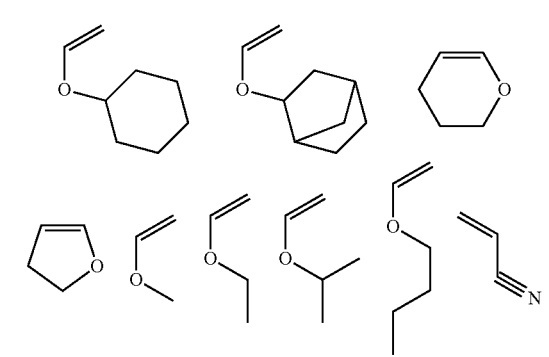
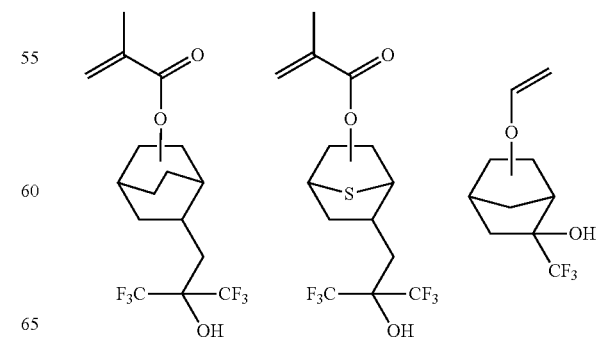

63
-continued
64
-continued
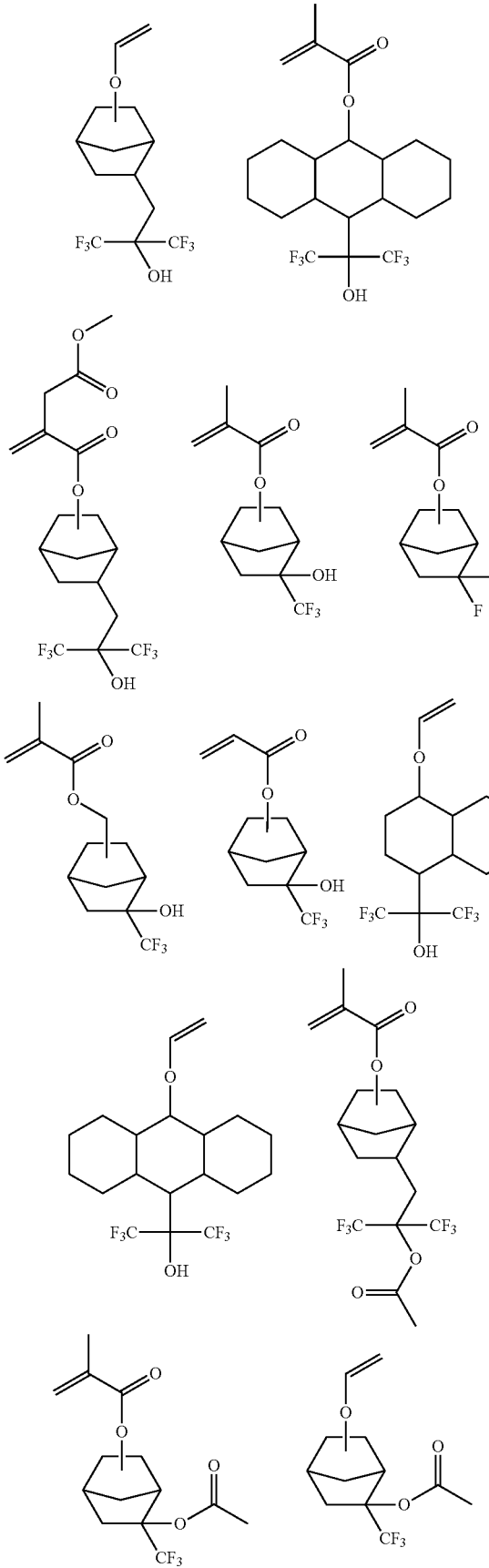
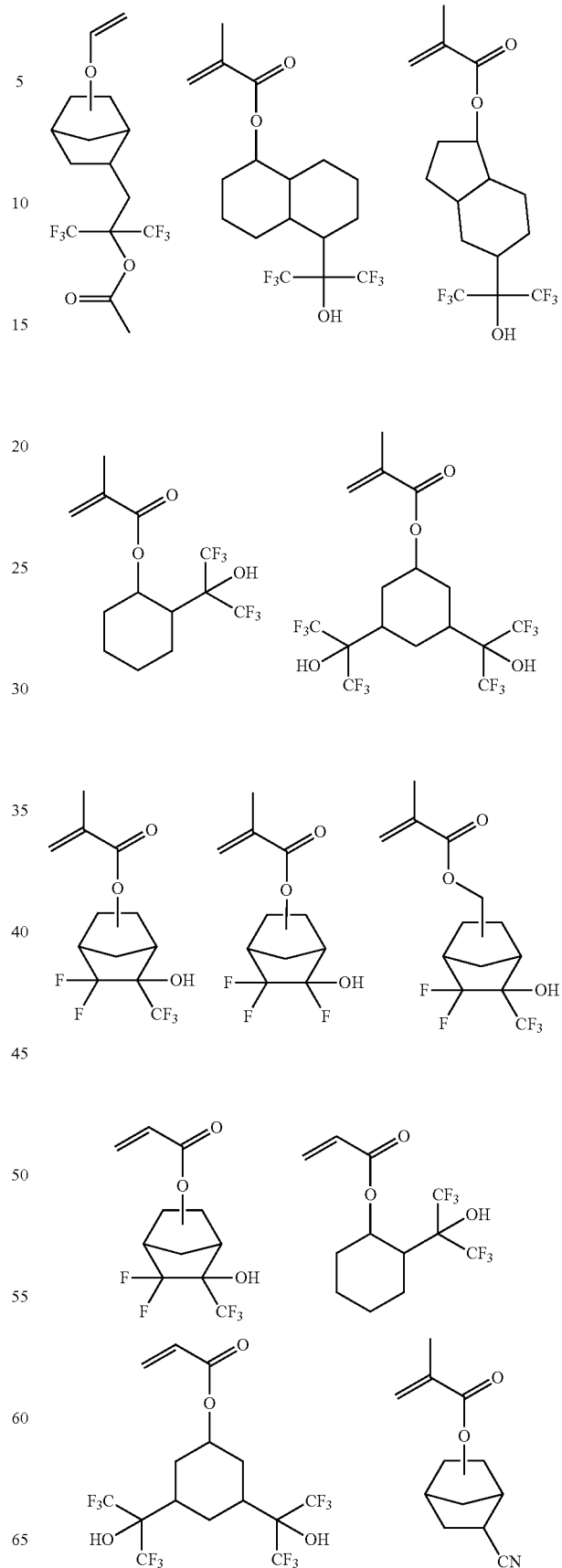

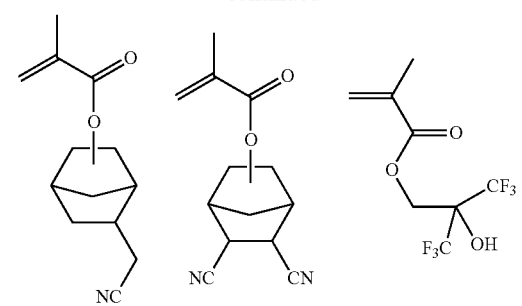
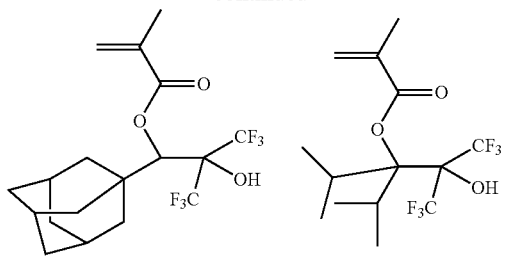
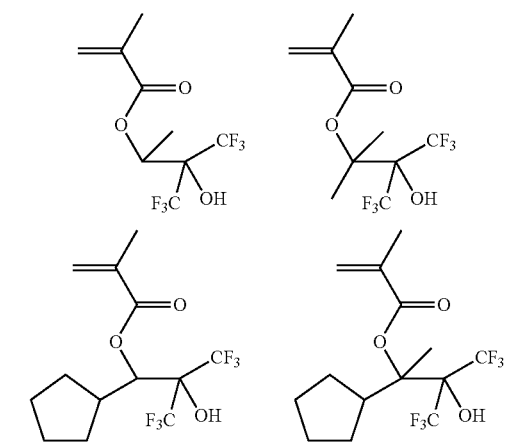
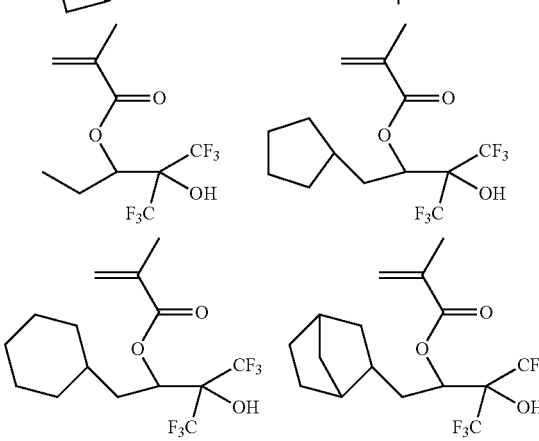
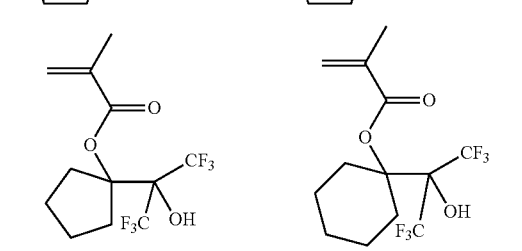
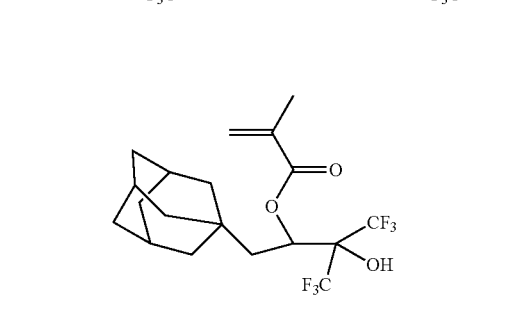
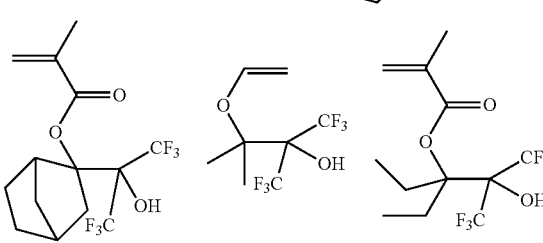
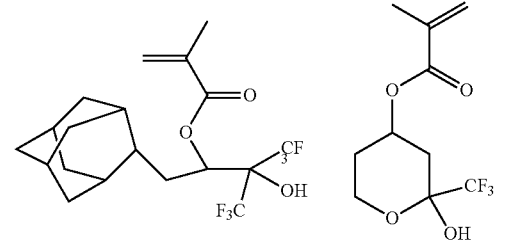
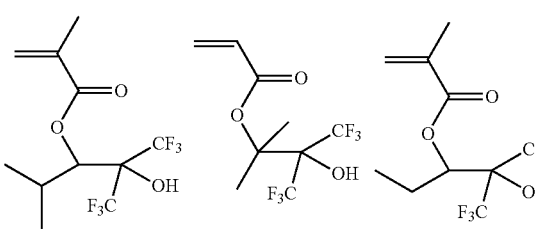
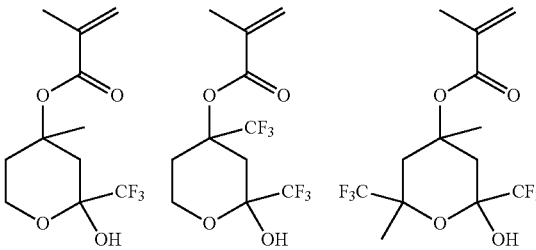
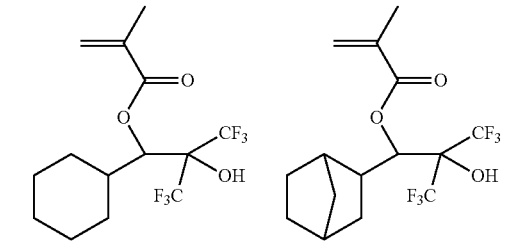
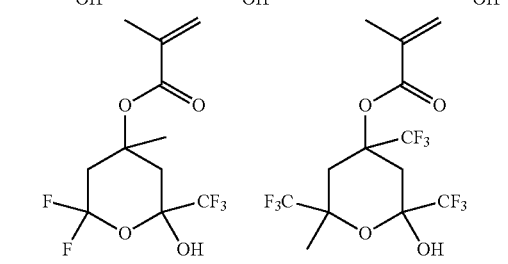

67
-continued
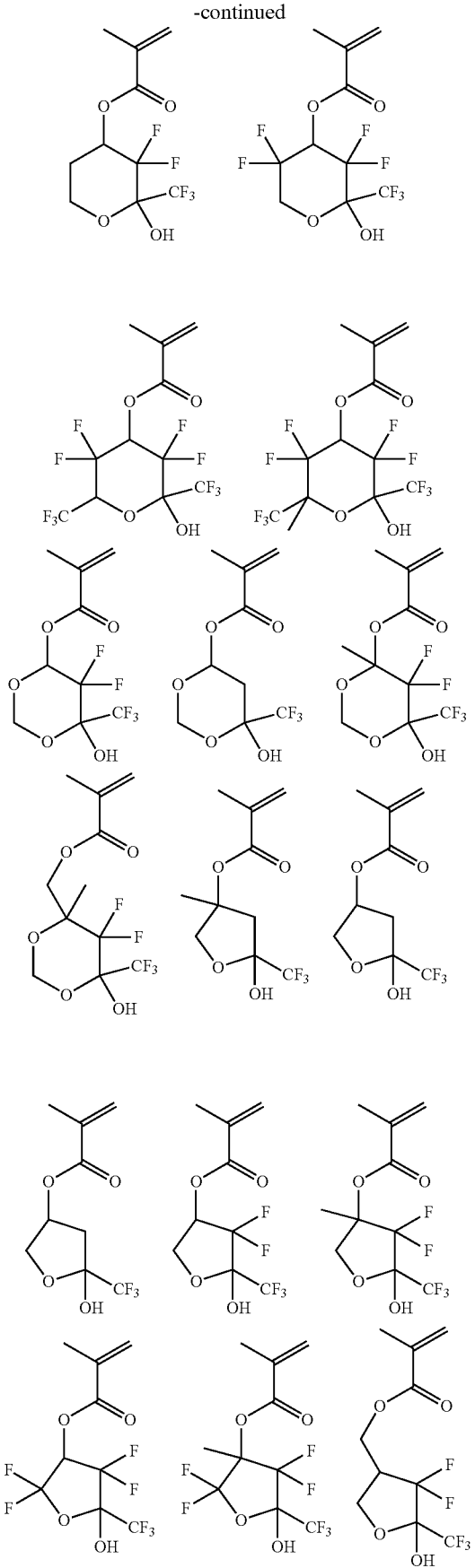
68
-continued
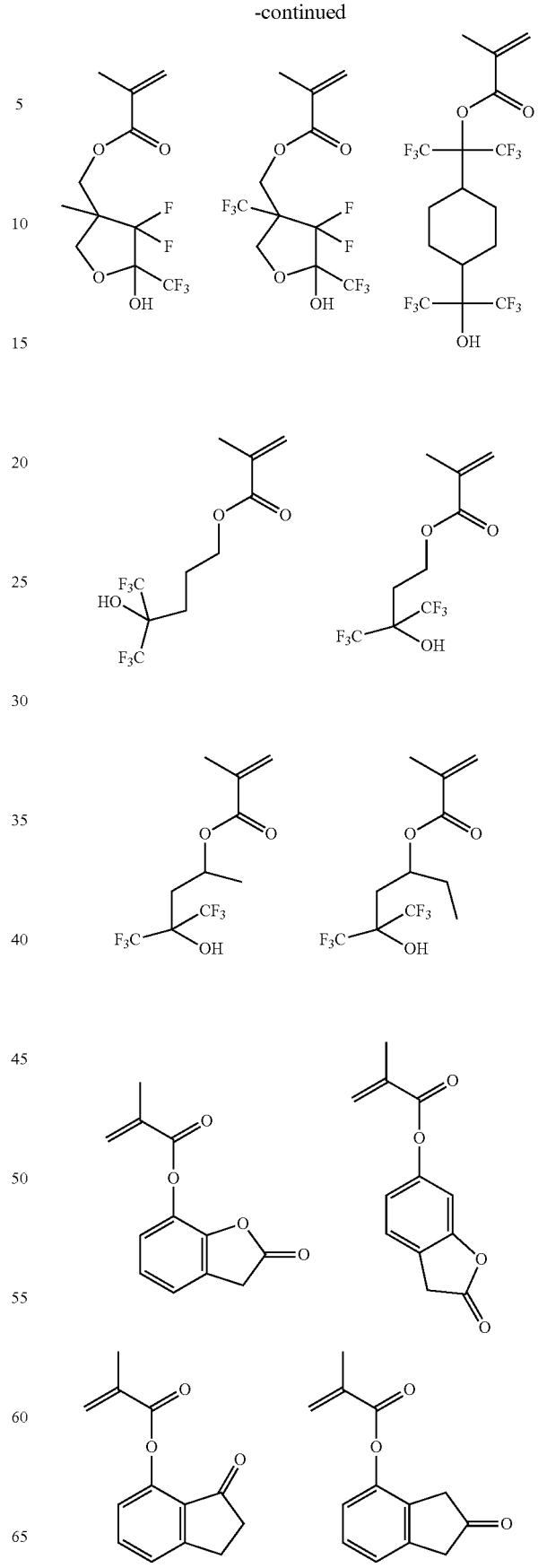

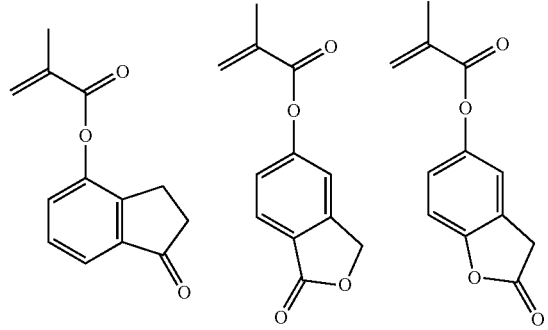
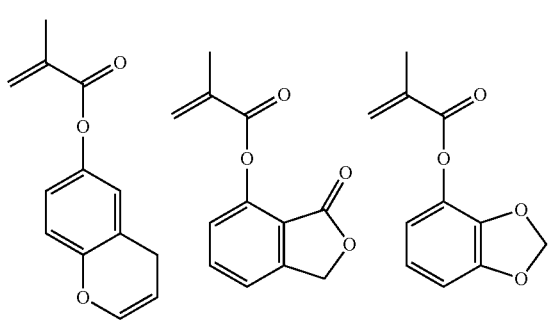
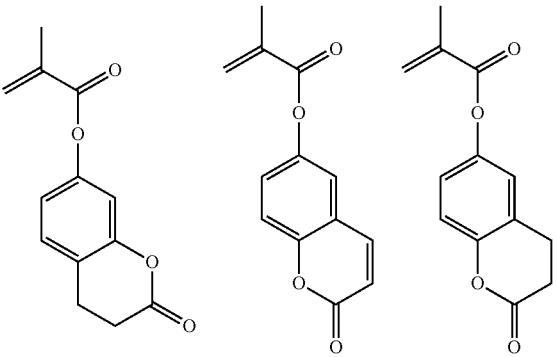
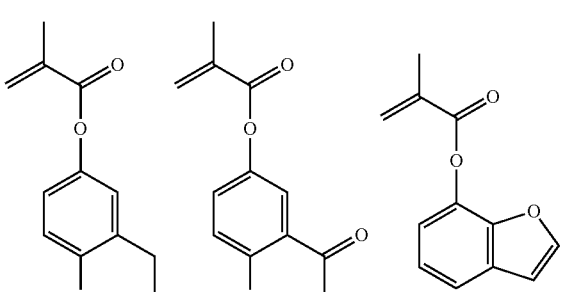
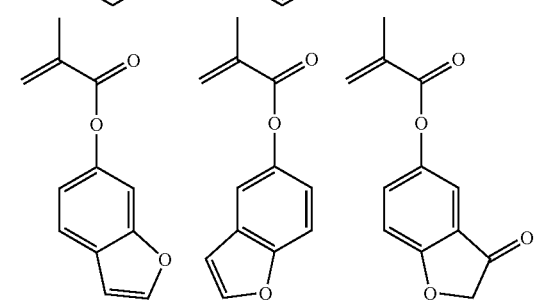
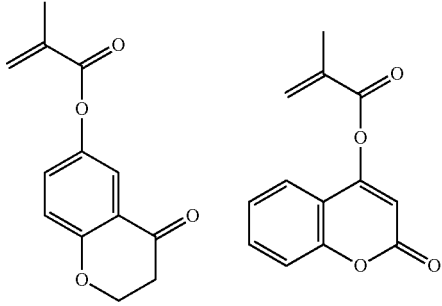
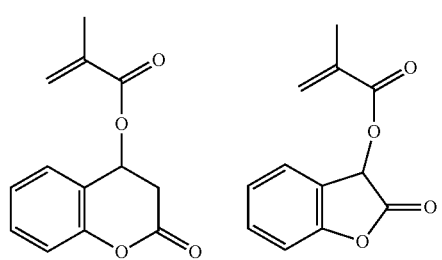
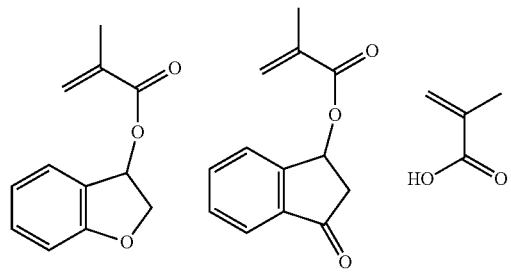
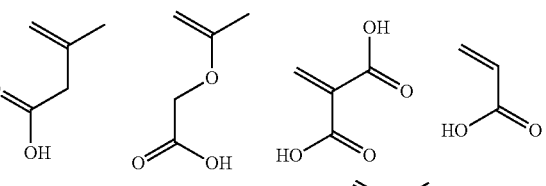
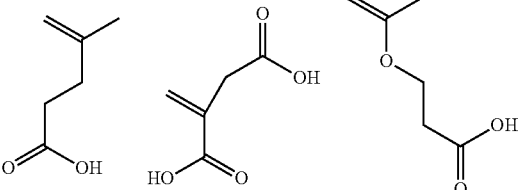
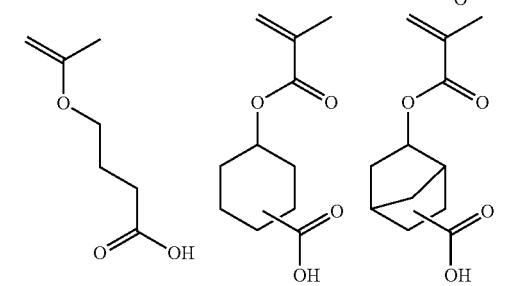

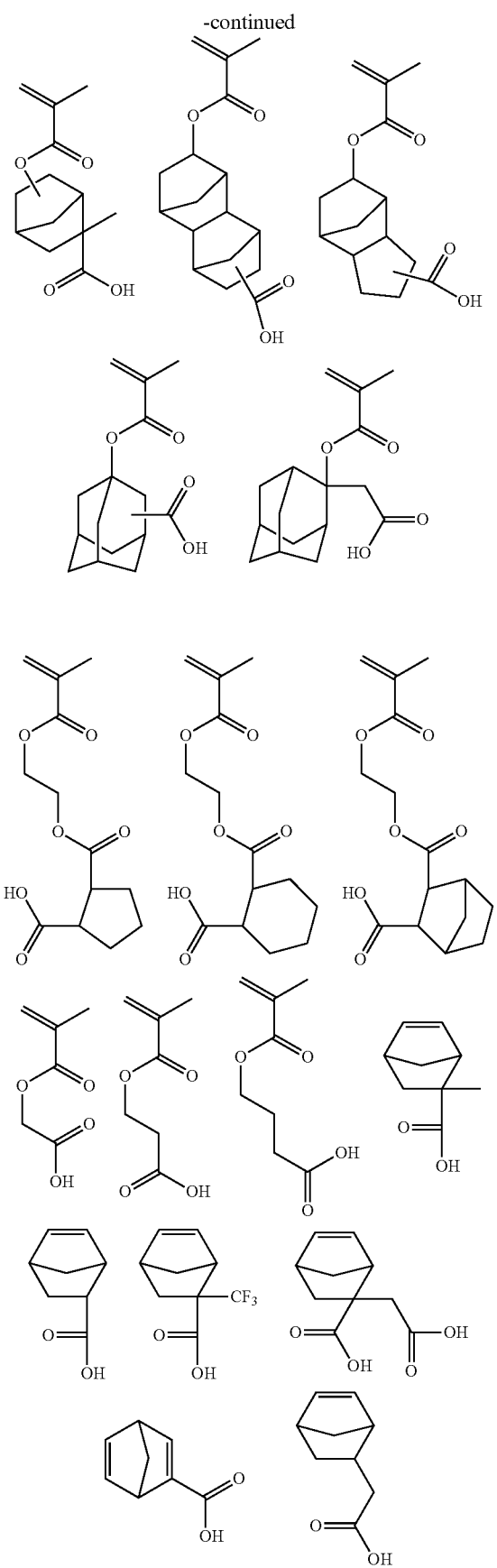

Preferably, the polymer has further copolymerized therein recurring units of at least one type selected from sulfonium salt units (f1) to (f3), as represented by the general formula (4). A resist composition comprising such a polymer having an acid generator bound to its main chain as base resin has the advantage that the pattern obtained after development has a reduced edge roughness (LWR).

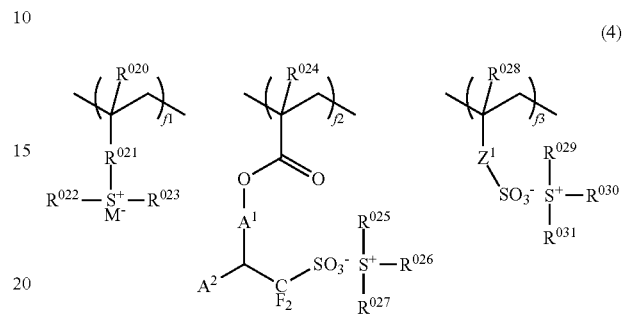

(4)

Herein $R^{020}$, $R^{024}$, and $R^{028}$ each are hydrogen or methyl. $R^{021}$ is a single bond, phenylene, —O—$R^{033}$—, or —C(=O)—Y—$R^{033}$—, wherein Y is oxygen or NH, and $R^{033}$ is a straight, branched or cyclic $C_1$-$C_6$ alkylene group, alkenylene group or phenylene group, which may contain a carbonyl (—CO—), ester (—COO—), ether (—O—), or hydroxyl moiety. $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group. $A^1$ is a single bond, -$A^0$-C(=O)—O—, -$A^0$-O— or -$A^0$-O—C(=O)—, wherein $A^0$ is a straight, branched or cyclic $C_1$-$C_{12}$ alkylene group which may contain a carbonyl, ester or ether moiety. $A^2$ is hydrogen, $CF_3$ or carbonyl. $Z^1$ is a single bond, methylene, ethylene, phenylene, fluorinated phenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety. $M^-$ is a non-nucleophilic counter ion.

Examples of the monomer from which sulfonium salt-containing recurring units (f1) in formula (4) are derived are given below.

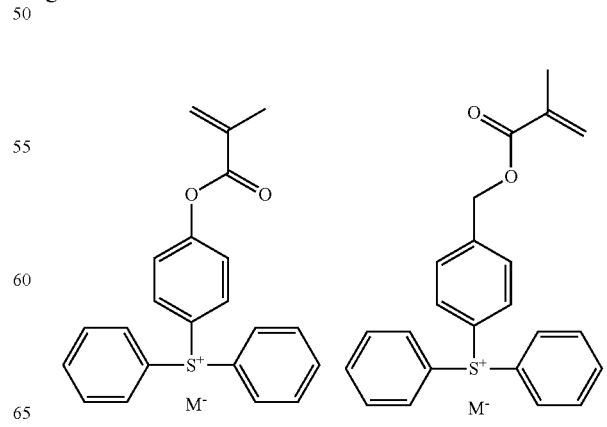

73
-continued
74
-continued
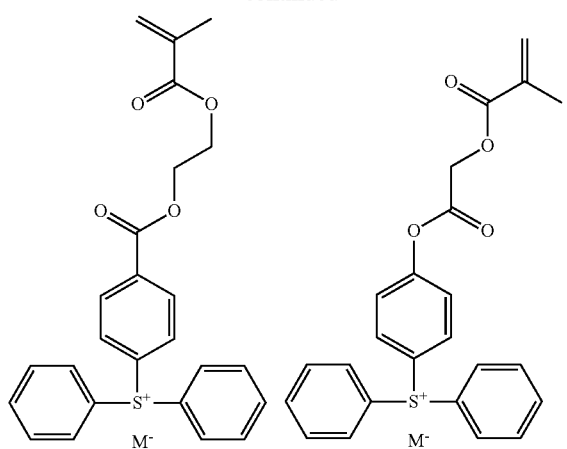
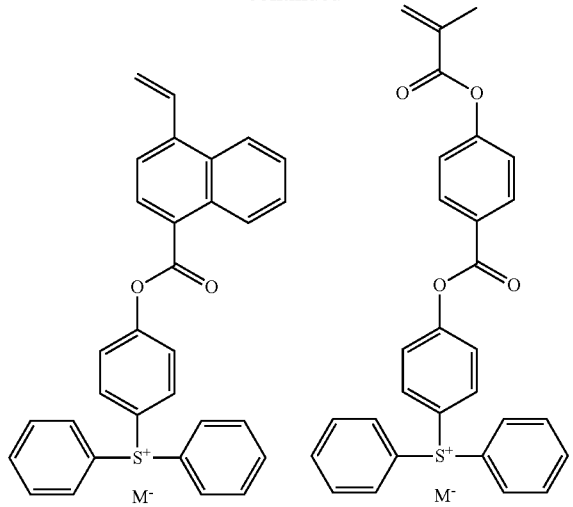
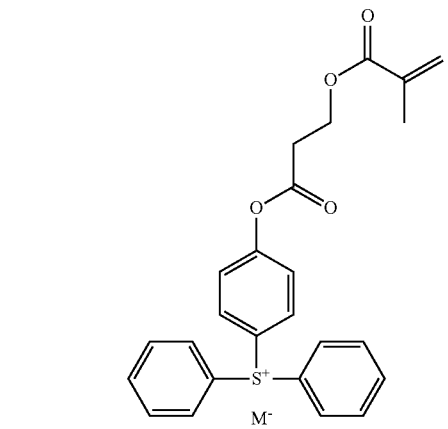
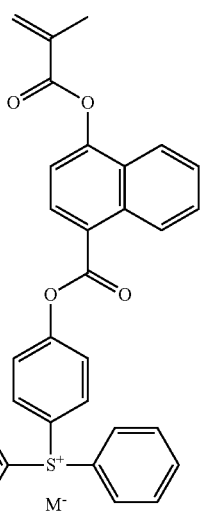
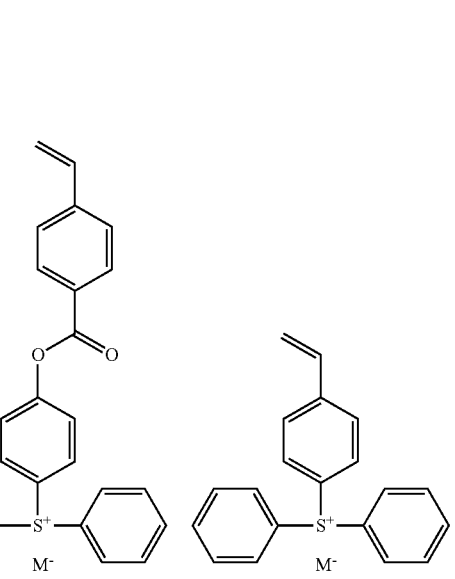
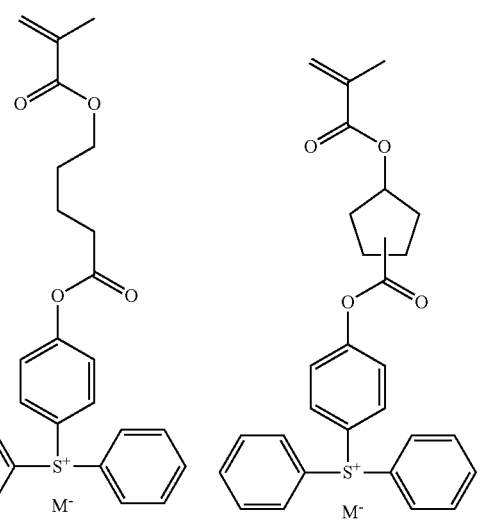

-continued

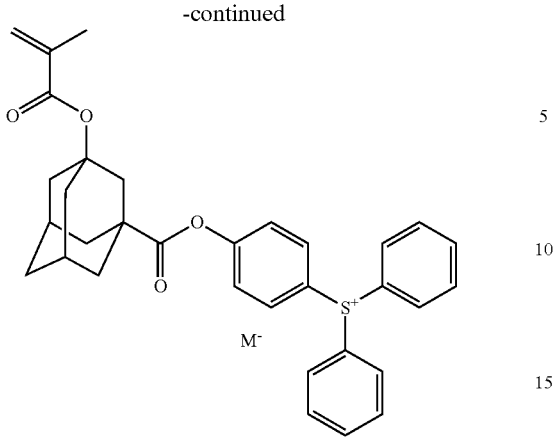

Herein M⁻ is a non-nucleophilic counter ion.

Examples of the non-nucleophilic counter ion represented by M⁻ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imidates such as bis(trifluoromethylsulfonyl)imide, bis(perfluoroethylsulfonyl)imide and bis(perfluorobutylsulfonyl)imide; methidates such as tris(trifluoromethylsulfonyl)methide and tris(perfluoroethylsulfonyl)methide.

Other non-nucleophilic counter ions include sulfonates having fluorine substituted at α-position as represented by the general formula (K-1) and sulfonates having fluorine substituted at α- and β-positions as represented by the general formula (K-2).

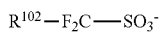
(K-1)

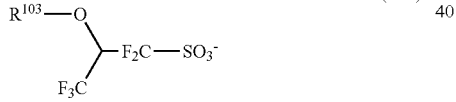
(K-2)

In formula (K-1), $R^{102}$ is hydrogen, or a straight, branched or cyclic $C_1$-$C_{20}$ alkyl group, $C_2$-$C_{20}$ alkenyl group, or $C_6$-$C_{20}$ aryl group, which may have an ether, ester, carbonyl moiety, lactone ring or fluorine. In formula (K-2), $R^{103}$ is hydrogen, or a straight, branched or cyclic $C_1$-$C_{30}$ alkyl or acyl group, $C_2$-$C_{20}$ alkenyl group, or $C_6$-$C_{20}$ aryl or aryloxy group, which may have an ether, ester, carbonyl moiety or lactone ring.

Examples of the monomers from which sulfonium salt-containing recurring units (f2) and (f3) in formula (4) are derived are given below.

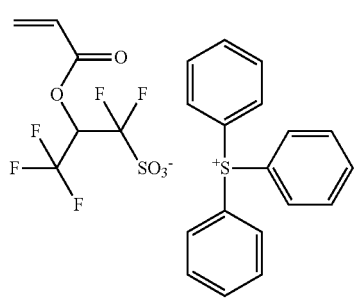

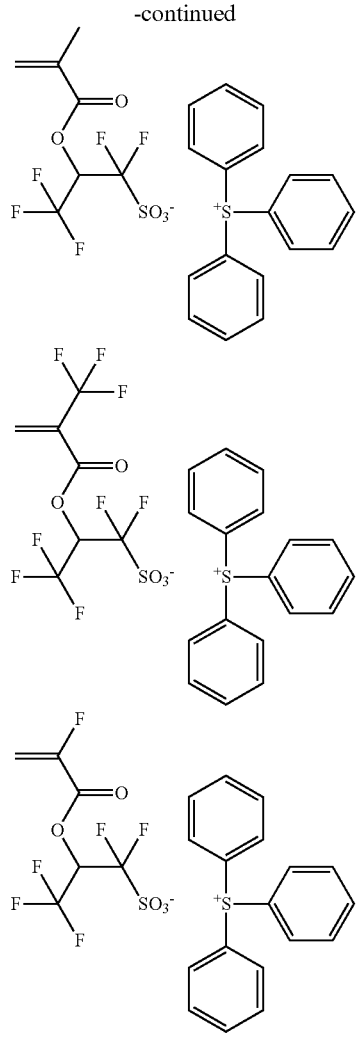

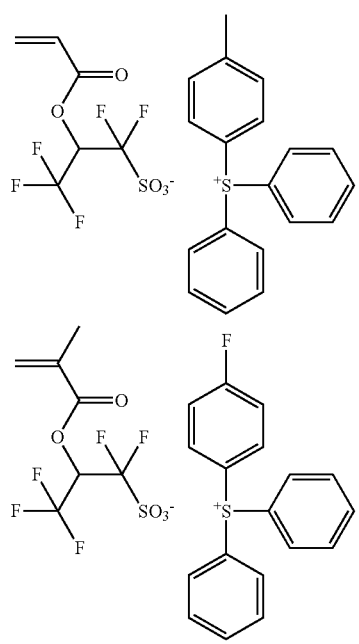

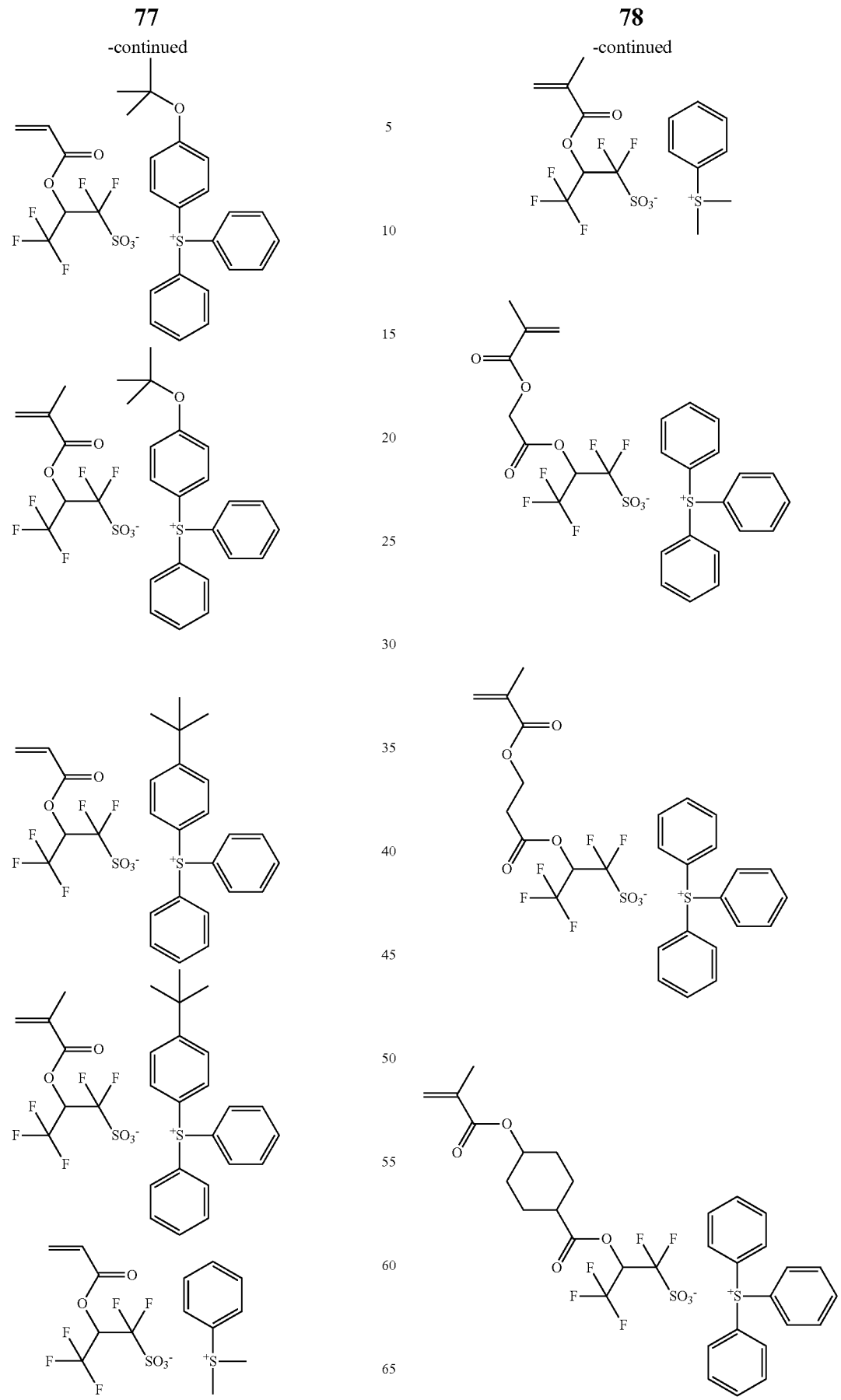

79
-continued
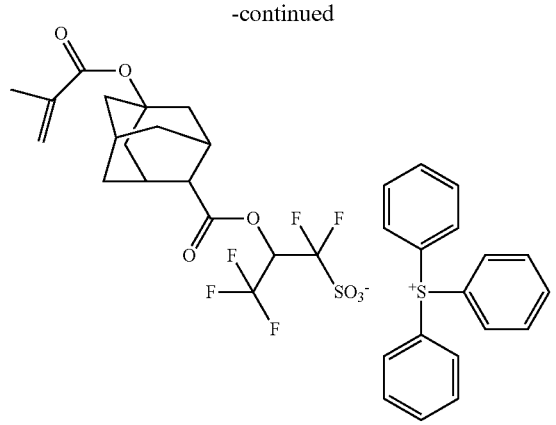
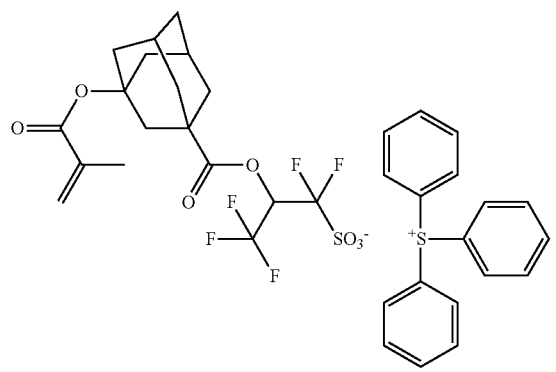
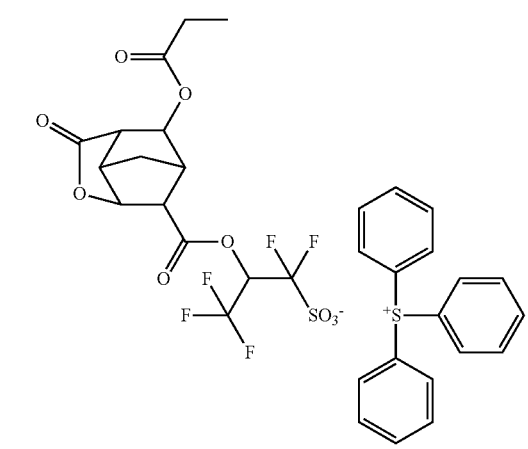
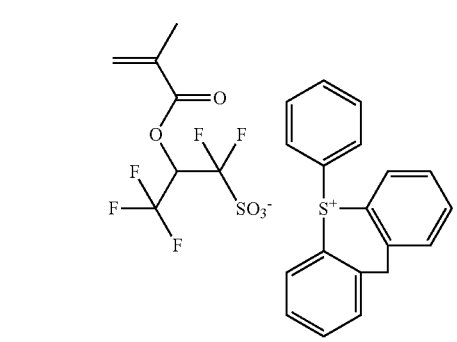
80
-continued
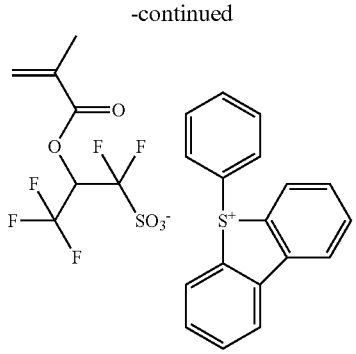
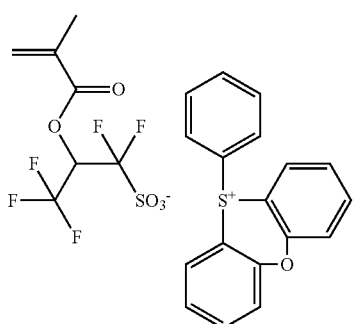
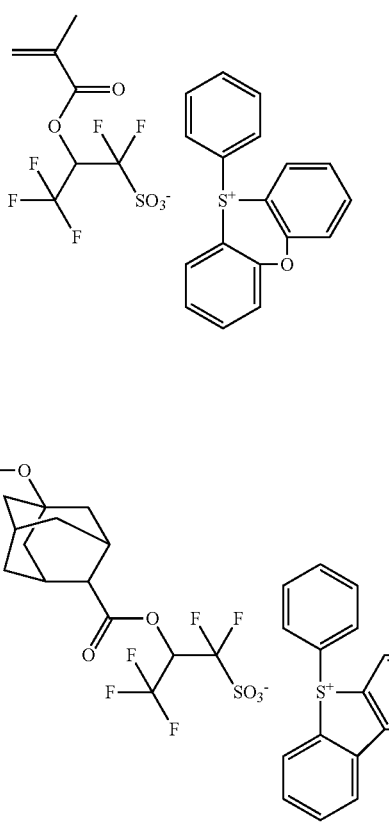
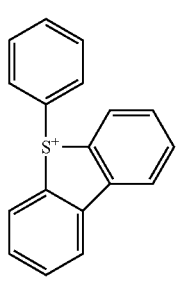

81
-continued
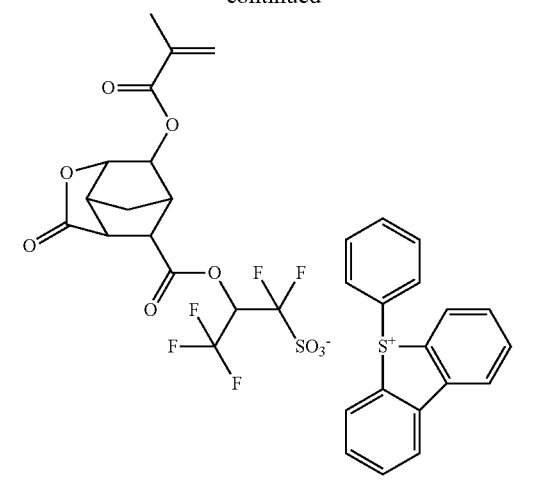
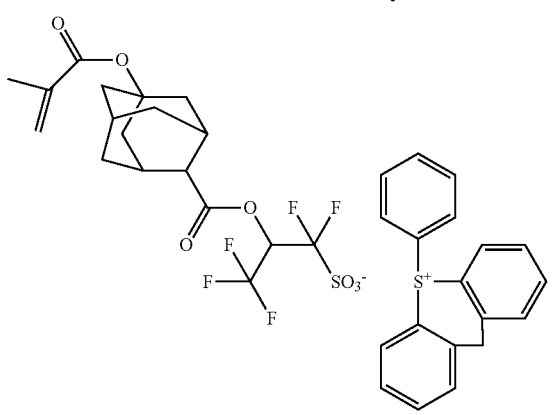
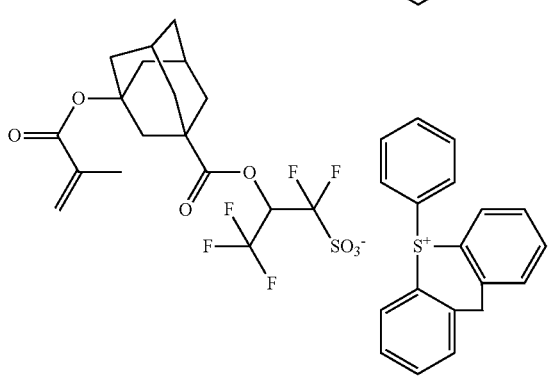
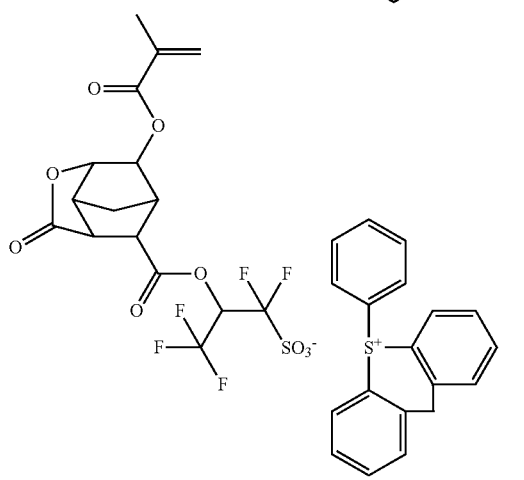
82
-continued
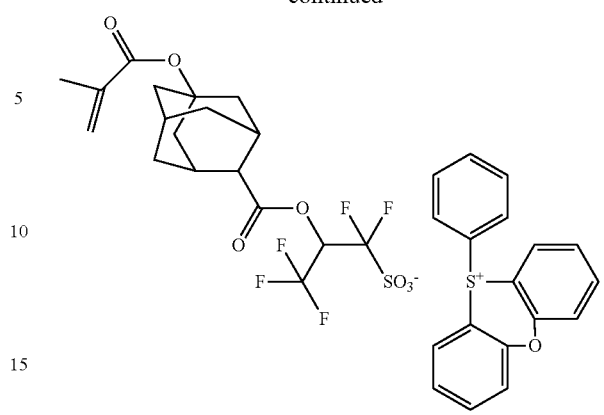
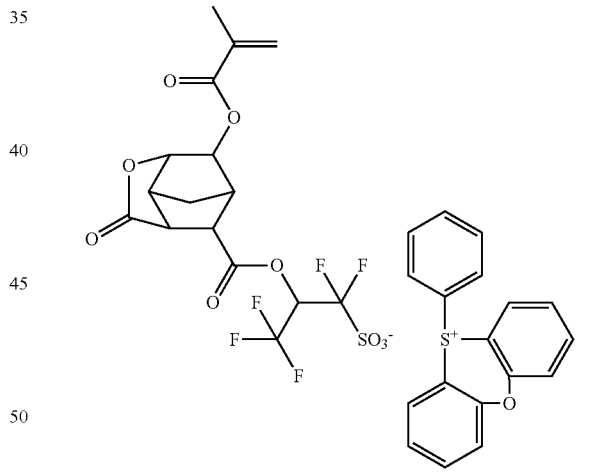
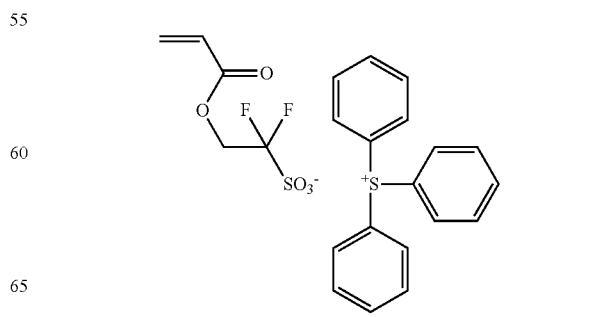

83
-continued
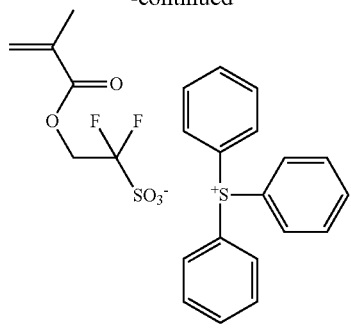
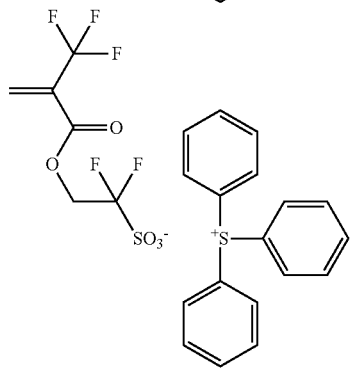
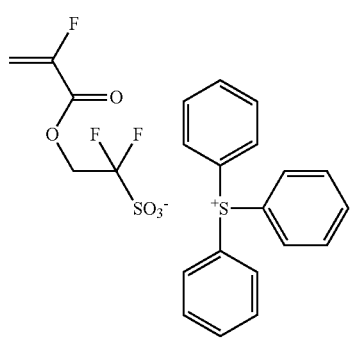
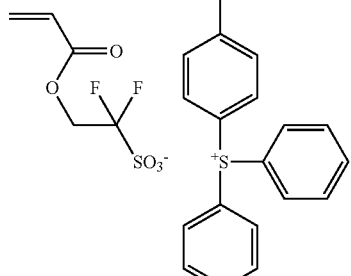
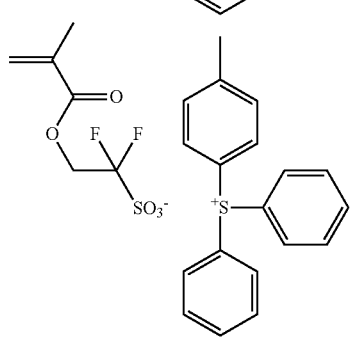
84
-continued
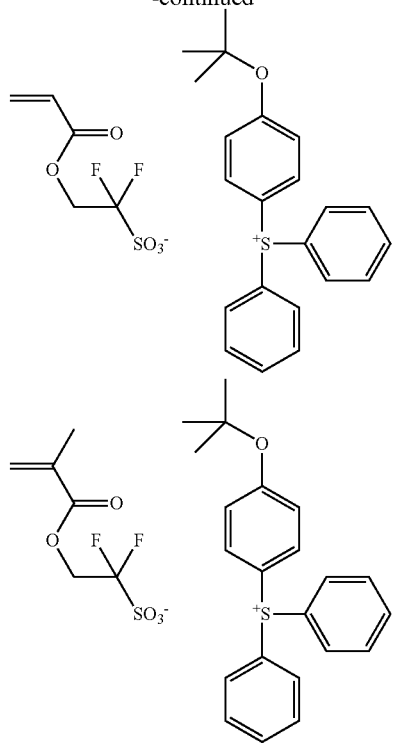
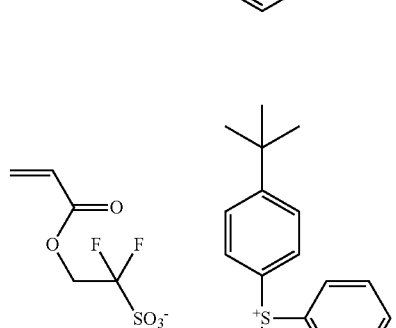
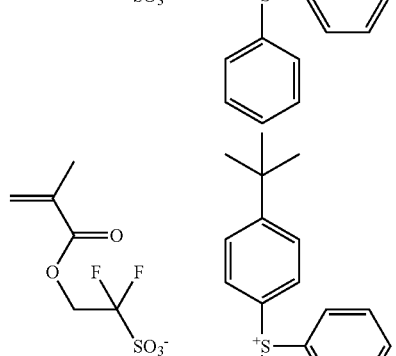
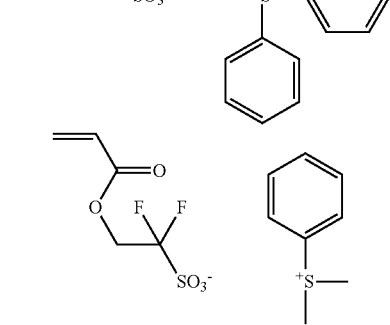

85
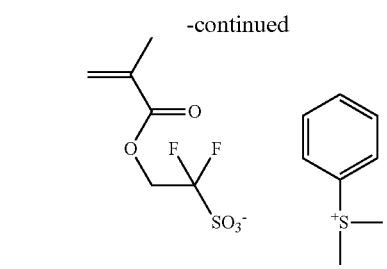
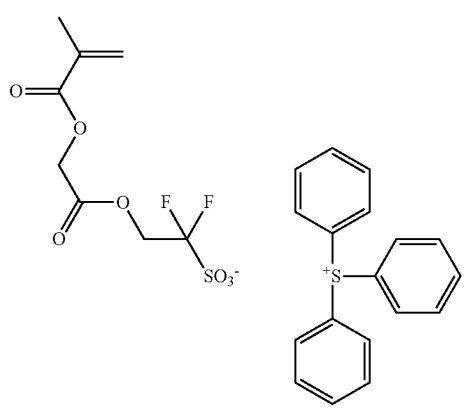
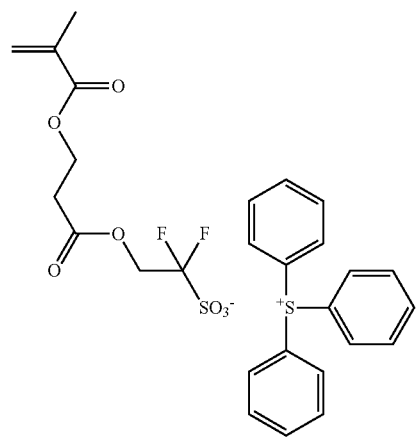
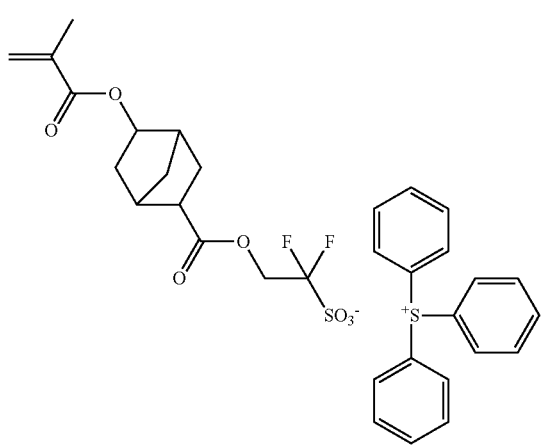
86
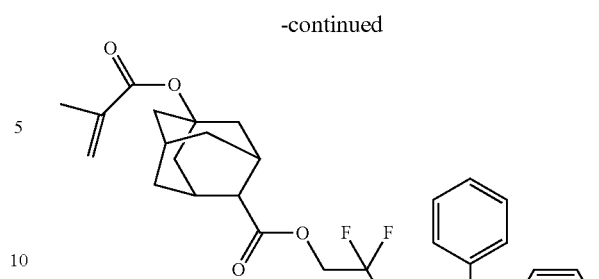
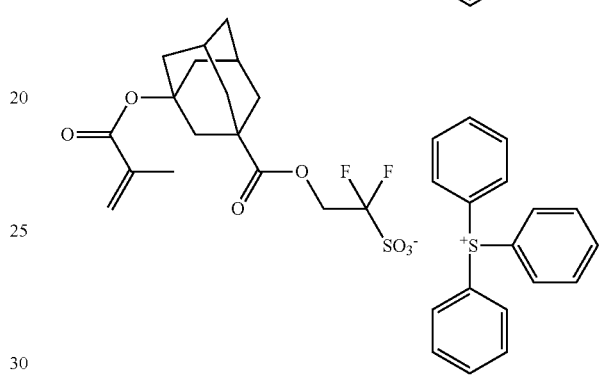
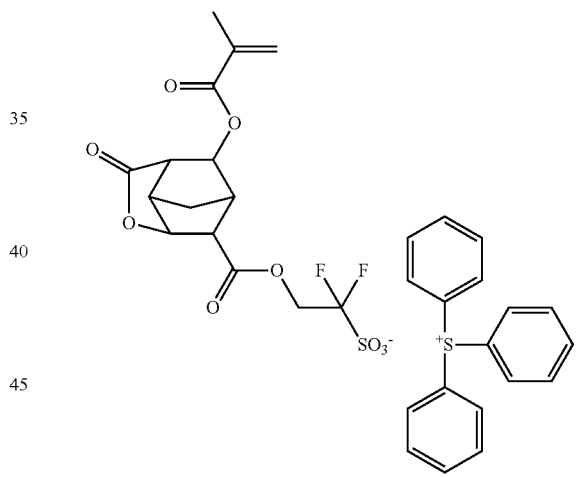
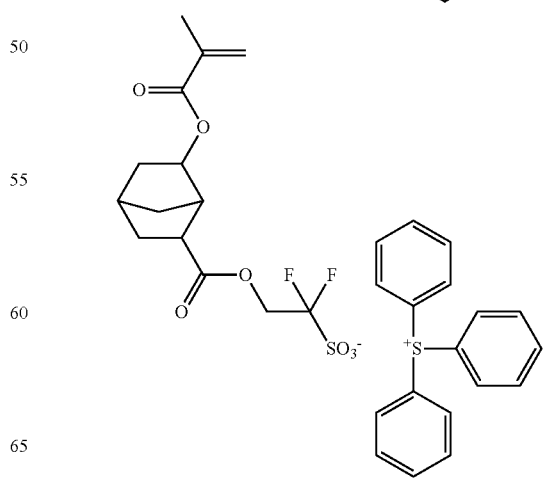

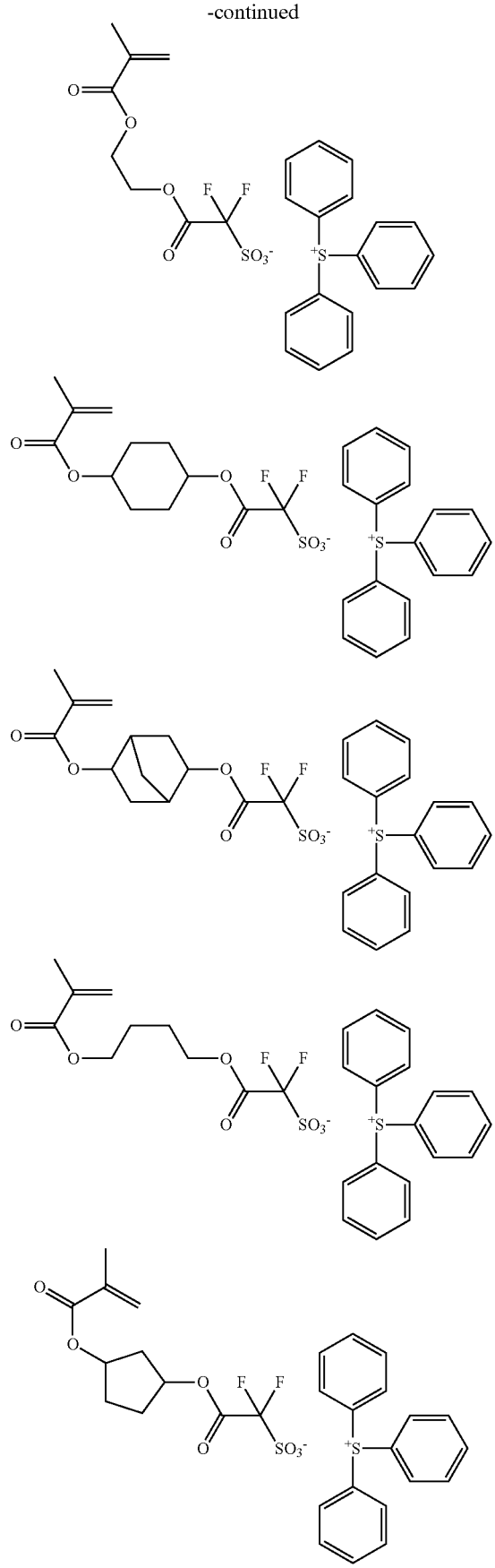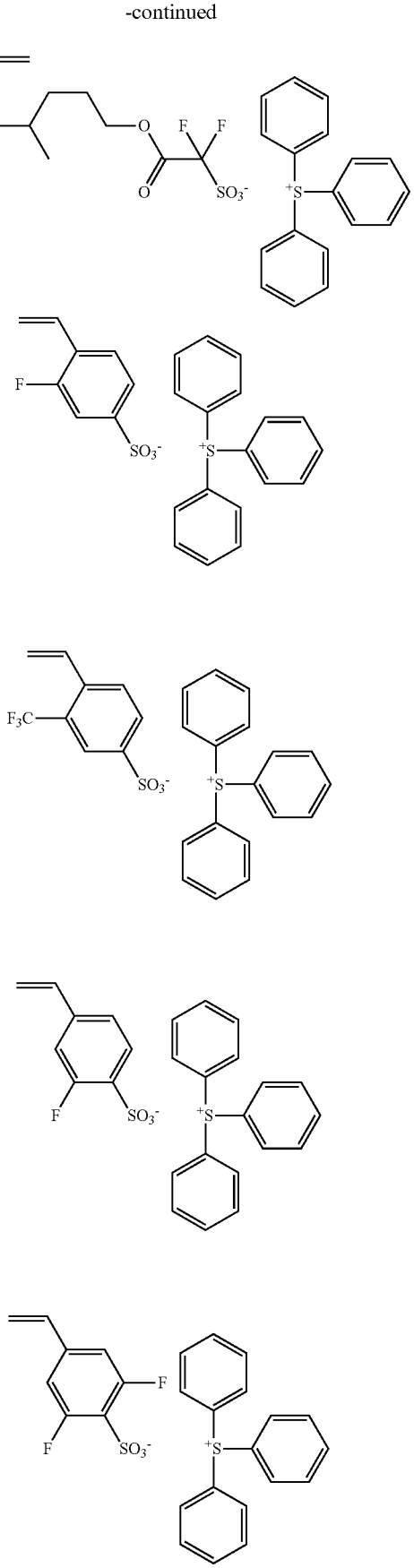

-continued
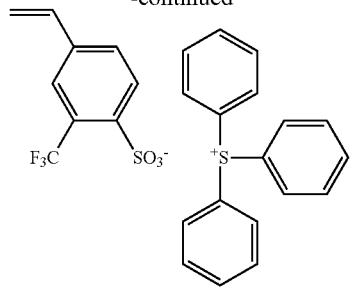
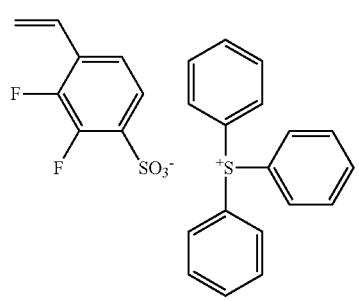
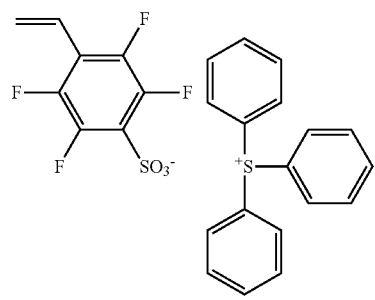
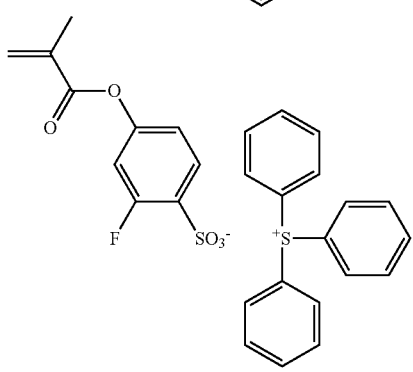
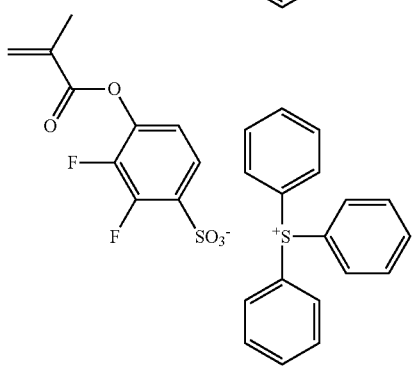
-continued
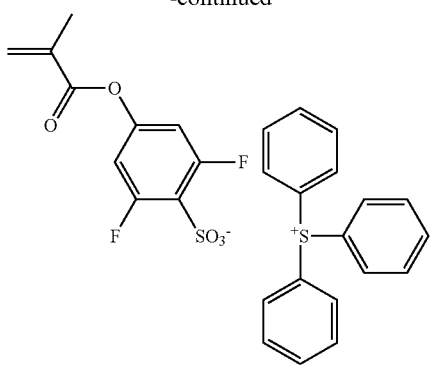
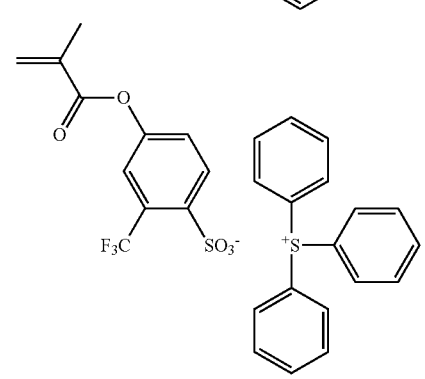
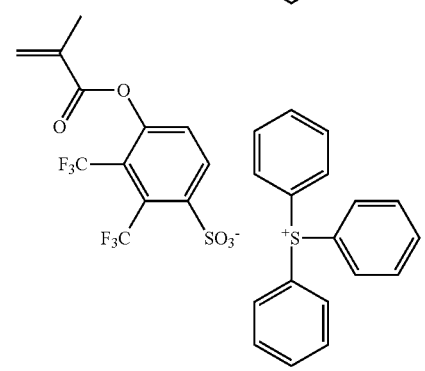
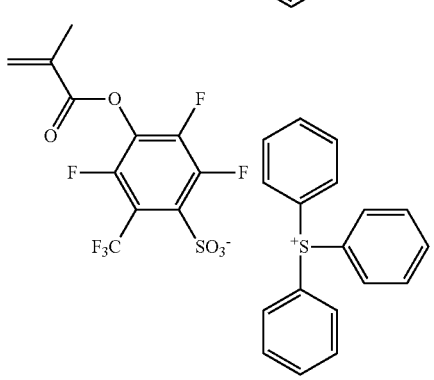
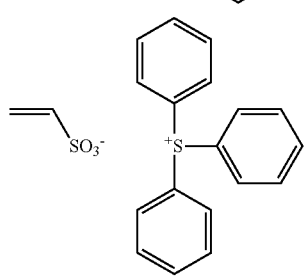

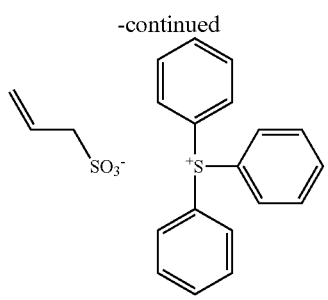

In the polymers, recurring units are preferably incorporated in the following molar fraction. The polymer for the first resist composition has the preferred range:
$0<a<1.0$, $0<b\le0.8$, $0.1\le a+b\le1.0$, $0\le e\le0.9$, $0\le f1\le0.4$, $0\le f2\le0.4$, $0\le f3\le0.4$, $0\le f1+f2+f3\le0.4$; more preferably $0.1\le a\le0.9$, $0.1\le b\le0.7$, $0.1\le a+b<1.0$, $0<e\le0.9$, $0\le f1\le0.3$, $0\le f2\le0.3$, $0\le f3\le0.3$, $0\le f1+f2+f3\le0.3$.

The polymer for the second resist composition has the preferred range:
$0\le c<1.0$, $0\le d<1.0$, $0.1\le c+d\le1.0$, $0\le e\le0.9$, $0\le a\le0.8$, $0\le f1\le0.4$, $0\le f2\le0.4$, $0\le f3\le0.4$, $0\le f1+f2+f3\le0.4$; more preferably $0\le c\le0.9$, $0\le d\le0.9$, $0.1\le c+d<1.0$, $0<e\le0.9$, $0\le a\le0.7$, $0\le f1\le0.3$, $0\le f2\le0.3$, $0\le f3\le0.3$, $0\le f1+f2+f3\le0.3$.

The meaning of a+b=1, for example, is that in a polymer comprising recurring units (a) and (b), the sum of recurring units (a) and (b) is 100 mol % based on the total amount of entire recurring units. The meaning of a+b<1 is that the sum of recurring units (a) and (b) is less than 100 mol % based on the total amount of entire recurring units, indicating the inclusion of other recurring units.

The polymer serving as the base resin in the resist composition should desirably have a weight average molecular weight (Mw) in the range of 1,000 to 500,000, and more desirably 2,000 to 30,000, as measured by GPC versus polystyrene standards. With too low a Mw, the resist composition after development may have a low efficiency of heat crosslinking. A polymer with too high a Mw may have a low alkaline solubility, giving rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

A blend of two or more polymers which differ in compositional ratio, molecular weight or dispersity is acceptable.

The polymer may be synthesized by any desired methods, for example, by dissolving suitable unsaturated bond-bearing monomers corresponding to recurring units (a) to (f) in an organic solvent, adding a radical initiator thereto, and effecting heat polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once removed with an acid catalyst and thereafter the polymer be protected or partially protected.

The resist composition (which may be either the first or second resist composition) used in the pattern forming process may further comprise an organic solvent, a compound capable of generating an acid in response to high-energy radiation (i.e., acid generator), and optionally a dissolution regulator, basic compound, surfactant and other components.

The organic solvent used in the first and second resist compositions, especially chemically amplified positive resist composition is not particularly limited as long as the base resin, acid generator and other additives are soluble therein. Exemplary solvents include ketones such as cyclohexanone and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, which may be used alone or in admixture of two or more. Of these, diethylene glycol dimethyl ether, 1-ethoxy-2-propanol, PGMEA and mixtures thereof are preferred because the acid generator is most soluble therein.

The organic solvent is preferably used in an amount of 200 to 3,000 parts, more preferably 400 to 2,000 parts by weight per 100 parts by weight of the base resin.

The first or second resist composition used herein may include an acid generator in order for the composition to function as a chemically amplified positive resist composition. Typical of the acid generator used herein is a photoacid generator (PAG) capable of generating an acid in response to actinic light or radiation. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

The PAG is preferably compounded in an amount of 0.1 to 50 parts and more preferably 0.5 to 40 parts by weight per 100 parts by weight of the base resin. Less than 0.1 part of PAG may generate, upon exposure, an insufficient amount of acid to provide sensitivity and resolution. More than 50 parts of PAG may reduce the transmittance of a resist film, detracting from resolution. Where the polymer has acid generator units (f1), (f2) or (f3) copolymerized therein, the acid generator need not necessarily be added.

To the resist composition, a basic compound, typically amine may be added. The basic compound serves to improve contrast by trapping the acid generated by the acid generator to control acid diffusion. Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146] to [0164], and compounds having a carbamate group, as described in JP 3790649. Onium salts such as sulfonium salts, iodonium salts and ammonium salts of sulfonic acids which are not fluorinated at α-position as described in JP-A 2008-158339 (US 20080153030) and similar onium salts of carboxylic acids as described in JP 3991462 may be used as the quencher. Although onium salts of sulfonic acids which are not fluorinated at α-position and onium salts of carboxylic acids lack basicity, they function as a quencher by salt exchange with a super strong acid fluorinated at α-position to neutralize the α-position fluorinated sulfonic acid.

The basic compound or quencher is preferably compounded in an amount of 0.001 to 15 parts and more preferably 0.01 to 10 parts by weight per 100 parts by weight of the base resin. Less than 0.001 part of the basic compound may achieve no addition effect whereas more than 15 parts may result in too low a sensitivity.

Also useful are quenchers of polymer type as described in JP-A 2008-239918. The polymeric quencher segregates at the resist surface after coating and thus enhances the rectangularity of resist pattern. The polymeric quencher is effective for preventing any film thickness loss of resist pattern or rounding of pattern top in the case of positive resist, and for reducing top bulging or bridging in the case of negative resist.

Also a polymeric additive may be added for improving the water repellency on surface of a resist film as spin coated. This additive may be used in the topcoatless immersion lithography. The additive has a specific structure with a 1,1,1,3,3,3-hexafluoro-2-propanol residue and is described in JP-A 2007-297590 and JP-A 2008-111103. The water repellency improver to be added to the resist should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

To the positive resist composition, especially chemically amplified positive resist composition, a surfactant may be added for the purpose of facilitating coating operation. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. An appropriate amount of the surfactant is up to 2 parts, preferably up to 1 part by weight per 100 parts by weight of the base resin, independent of whether it is used in the chemically amplified positive resist composition or the resist composition subject to organic solvent development.

Process

Now referring to the drawings, the pattern forming process of the invention is illustrated in FIG. 1. First, the positive resist composition is coated on a substrate to form a resist film thereon. Specifically, a first resist film 30 of a positive resist composition is formed on a processable substrate 20 disposed on a substrate 10 directly or via an intermediate intervening layer as shown in FIG. 1A. The first resist film 30 preferably has a thickness of 10 to 1,000 nm and more preferably 20 to 500 nm. Prior to exposure, the first resist film 30 is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer (not shown) includes hard masks of $SiO_2$, SiN, SiON or p-Si, an undercoat in the form of carbon film, a silicon-containing intermediate film, and an organic antireflective coating.

Next comes exposure depicted by arrows in FIG. 1B. For the exposure, preference is given to high-energy radiation having a wavelength of 140 to 250 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. In the immersion lithography, the prebaked resist film is exposed to light from a projection lens while pure water or suitable liquid is introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface. The resist protective film used in the immersion lithography is preferably formed from a solution of a polymer having 1,1,1,3,3,3-hexafluoro-2-propanol residues which is insoluble in water, but soluble in an alkaline developer, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue.

In the protective film-forming composition, an amine compound may be compounded. The amine compound may be selected from the compounds enumerated as the basic compound to be added to the resist composition. An appropriate amount of the amine compound added is 0.01 to 10 parts, preferably 0.02 to 8 parts by weight per 100 parts by weight of the base resin for the protective film. After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film. Deposition of an amine-containing protective film is effective for preventing a film thickness loss of positive resist and top bulging of negative resist.

Exposure is preferably performed in an exposure dose of about 1 to 200 $mJ/cm^2$, more preferably about 10 to 100 $mJ/cm^2$. This is followed by baking (PEB) on a hot plate at 60 to 150° C. for 1 to 5 minutes, preferably at 80 to 120° C. for 1 to 3 minutes.

Thereafter the exposed resist film is developed in an aqueous alkaline solution, typically a 0.1 to 5 wt %, preferably 2 to 3 wt % aqueous solution of tetramethylammonium hydroxide (TMAH) as developer for 0.1 to 3 minutes, preferably 0.5 to 2 minutes by any conventional techniques such as dip, puddle and spray techniques. In this way, a first positive resist pattern 30*a* is formed on the substrate 20 as shown in FIG. 1C.

Next, a crosslinked first positive resist pattern 30*b* is formed, as shown in FIG. 1D, by eliminating the acid labile group on the polymer in the resist pattern and crosslinking the polymer. Acid and heat are necessary for eliminating the acid labile group on the polymer in the pattern and for crosslinking the polymer. Specifically, acid generation is followed by heating to carry out deprotection of acid labile group and crosslinking at the same time. To generate acid, the wafer (resist pattern) as developed may be subjected to flood exposure to decompose the PAG. The flood exposure uses radiation in a wavelength range of 180 to 400 nm in a dose of 10 mJ/cm$^2$ to 1 J/cm$^2$. Exposure to radiation with a wavelength of less than 180 nm, specifically excimer laser or excimer lamp of 172 nm, 146 nm or 122 nm is unfavorable because both acid generation from the PAG and crosslinking reaction are promoted, and excessive crosslinking invites a lowering of alkaline dissolution rate. For the flood exposure, light sources of longer wavelength such as ArF excimer laser of 193 nm, KrCl excimer lamp of 222 nm, KrF excimer laser of 248 nm, low-pressure mercury lamp centering at 254 nm, XeCl excimer lamp of 308 nm, and i-line of 365 nm are preferably used. In another embodiment, a thermal acid generator in the form of an ammonium salt is added to the positive resist composition so that acid may be generated by heating. In this embodiment, acid generation and crosslinking reaction take place simultaneously. Preferred heating conditions include a temperature of 150 to 400° C., especially 160 to 300° C. and a time of 10 to 300 seconds. As a result, a crosslinked resist pattern which is insoluble in the second solvent of the second resist composition is formed. The embodiment that achieves insolubilization by TAG addition and bake is preferred because the process step added is only one.

Suitable ammonium salts serving as the TAG include compounds of the general formula (P1a-2). Specifically, the TAG may be added in an amount of 0 to 15 parts, preferably 0 to 10 parts by weight per 100 parts by weight of the base resin. When the TAG is added, its amount is preferably at least 0.1 part by weight.

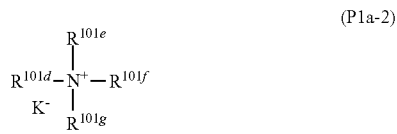
(P1a-2)

Herein K$^-$ is a sulfonate having at least one fluorine substituted at α-position, or perfluoroalkylimidate or perfluoroalkylmethidate. R$^{101d}$, R$^{101e}$, R$^{101f}$, and R$^{101g}$ are each independently hydrogen, a straight, branched or cyclic alkyl, alkenyl, oxoalkyl or oxoalkenyl group of 1 to 12 carbon atoms, an aryl group of 6 to 20 carbon atoms, or an aralkyl or aryloxoalkyl group of 7 to 12 carbon atoms, in which some or all hydrogen atoms may be substituted by alkoxy groups. Alternatively, R$^{101d}$ and R$^{101e}$, or R$^{101d}$, R$^{101e}$ and R$^{101f}$ may bond together to form a ring with the nitrogen atom to which they are attached, and R$^{101e}$ and R$^{101f}$ or R$^{101d}$, R$^{101e}$ and R$^{101f}$ represent a C$_3$-C$_{10}$ alkylene group or a hetero-aromatic ring having incorporated therein the nitrogen atom when they form a ring.

Examples of K$^-$ include perfluoroalkanesulfonates such as triflate and nonaflate, imidates such as bis(trifluoromethylsulfonyl)imide, bis(perfluoroethylsulfonyl)imide, and bis(perfluorobutylsulfonyl)imide, methidates such as tris(trifluoromethylsulfonyl)methide and tris(perfluoroethylsulfonyl)methide, and sulfonates having fluorine substituted at α-position, represented by the formula (K-1), and sulfonates having fluorine substituted at α-position, represented by the formula (K-2).

(K-1)

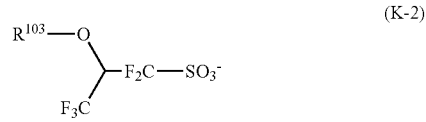
(K-2)

Herein, R$^{102}$ and R$^{103}$ are as defined above.

Next, as shown in FIG. 1E, a second resist composition is coated until it covers or overlies the crosslinked first positive resist pattern 30b, forming a second resist film 40. The thickness of the second resist film 40 varies over a wide range.

Thereafter, the second resist film 40 is subjected to second exposure as shown in FIG. 1F, PEB, and developed in an organic solvent as shown in FIG. 1G, forming a negative resist pattern. Since the first positive pattern is insoluble in the organic solvent developer, it is retained even after the organic solvent development. Thereafter, as shown in FIG. 1G, the processable substrate is dry etched through the first and second resist patterns serving as the mask.

The first resist pattern and second resist pattern may be combined in various ways. As shown in FIG. 2, the first and second resist patterns are combined as orthogonally intersecting lines. When a positive pattern resulting from over-exposure of 1:1 pattern is combined with a negative pattern resulting from over-exposure of 1:1 pattern, a rectangular hole pattern is formed. When a positive pattern and a negative pattern are 1:1, a tetragonal hole pattern is formed.

Figure 3:
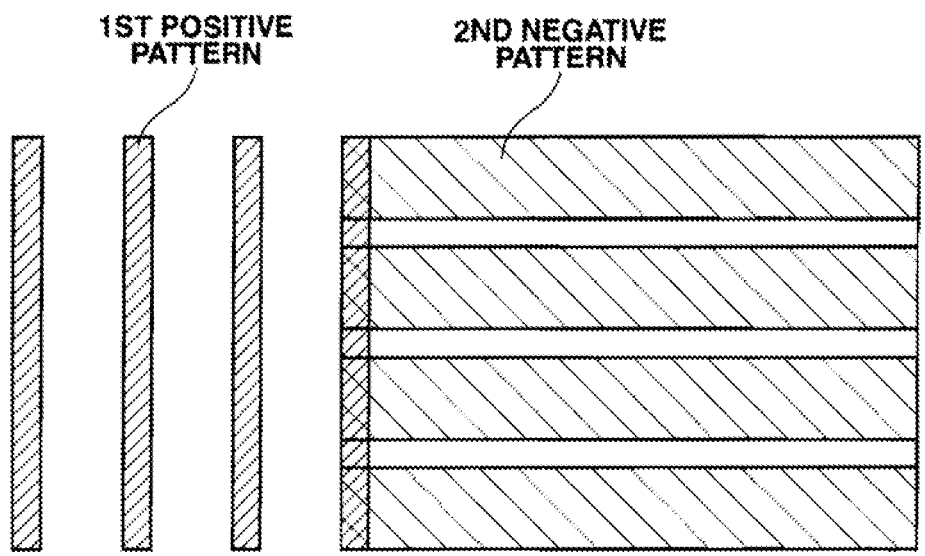
FIG. 3 illustrates a first positive pattern and a second negative pattern, which are formed contiguous and spaced apart.

The first and second resist patterns may be formed in different directions rather than the orthogonal crossing. The first and second resist patterns may be contiguous somewhere and spaced apart somewhere. As shown in FIG. 3, one feature of the first resist pattern overlaps the second resist pattern while the other features of the first resist pattern are spaced apart from the second resist pattern.

Figure 4:
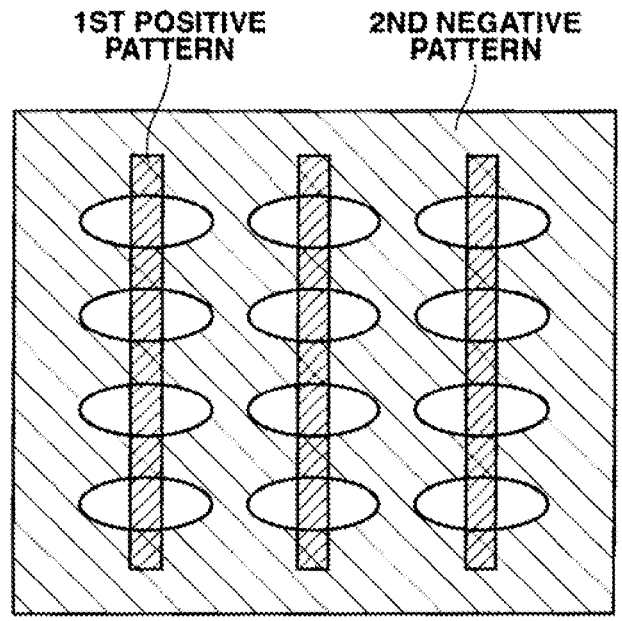
FIG. 4 illustrates a first positive pattern that divides elliptic holes of a second negative pattern.

It is also possible that the first positive pattern divides elliptic holes of the second negative pattern as shown in FIG. 4. In this case, a hole pattern with a very narrow pitch is formed.

Figure 5:
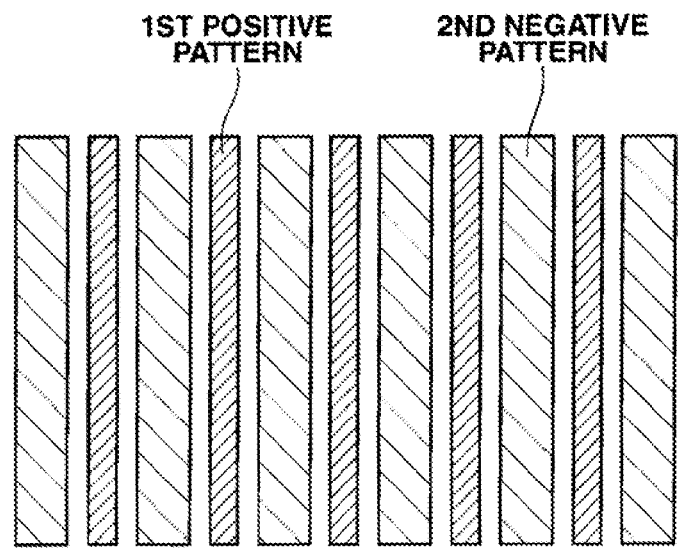
FIG. 5 illustrates a first positive pattern and a second negative pattern, which are alternately arranged.

In FIG. 5, the first and second resist patterns are alternately formed. That is, lines of the first resist pattern and lines of the second resist pattern are alternately arranged. A pattern of very narrow trenches can be formed between the positive and negative patterns, thereby reducing the pitch to one half.

EXAMPLE

Examples of the invention are given below by way of illustration and not by way of limitation. For all polymers, Mw and Mn are determined by GPC versus polystyrene standards.

Preparation of Resist Material

First and second resist compositions in solution form were prepared by dissolving a polymer (Resist Polymer) and components in a solvent according to the formulation shown in Tables 1 and 2, and filtering through a filter with a pore size of 0.2 μm. The components used are identified below.

Acid generator: PAG1 of the following structural formula
PAG 1
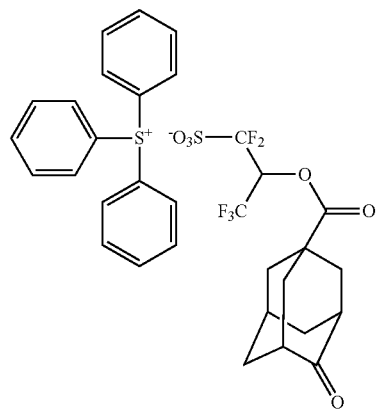
Resist Polymer 1
Mw=8,310
Mw/Mn=1.73
Resist Polymer 1
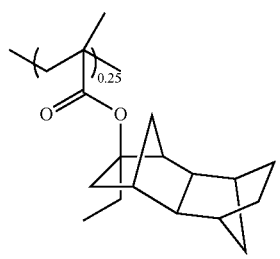
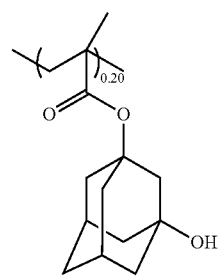
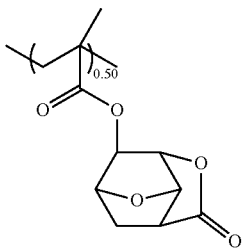
Resist Polymer 2
Mw=7,300
Mw/Mn=1.67
Resist Polymer 2
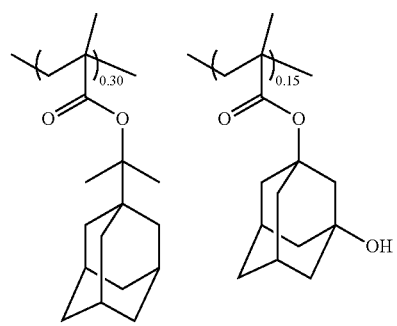
-continued
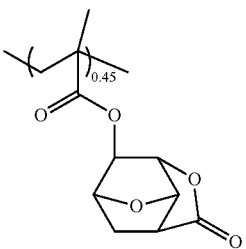
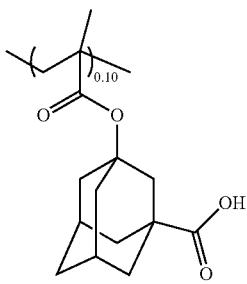
Resist Polymer 3
Mw=7,800
Mw/Mn=1.88
Resist Polymer 3
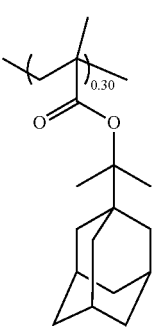
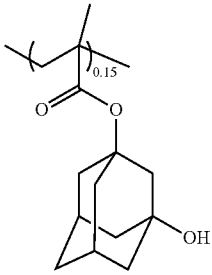
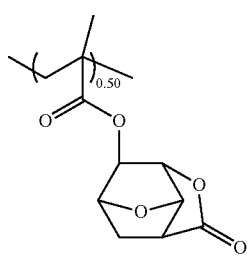
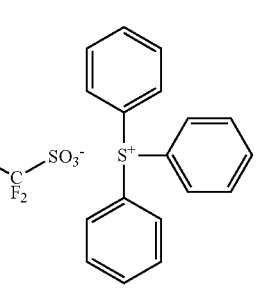

Resist Polymer 4
Mw=7,200
Mw/Mn=1.82
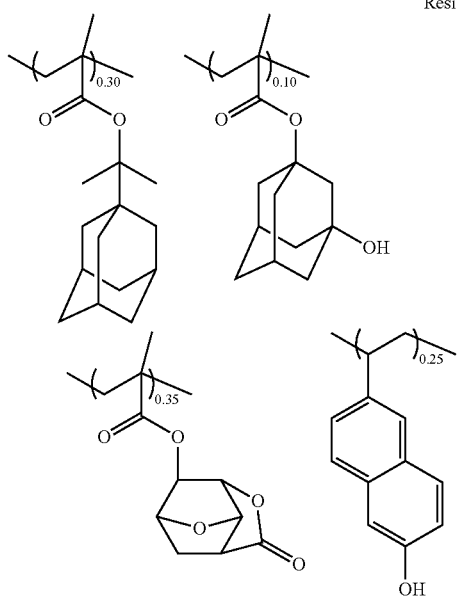
Resist Polymer 4
Resist Polymer 5
Mw=8,310
Mw/Mn=1.73
Resist Polymer 5
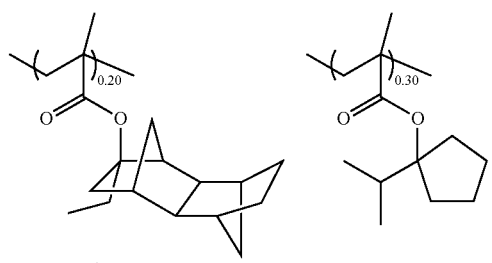
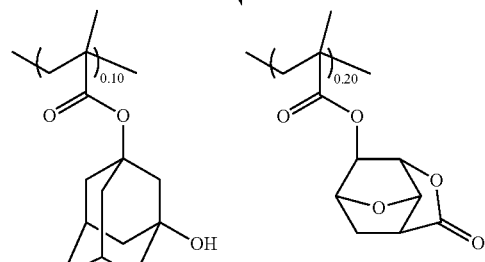
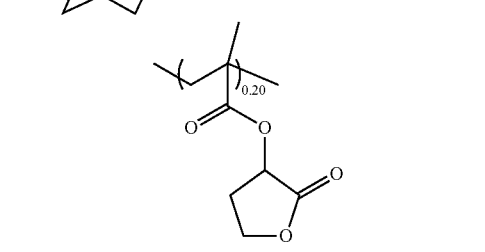
Resist Polymer 6
Mw=8,600
Mw/Mn=1.76
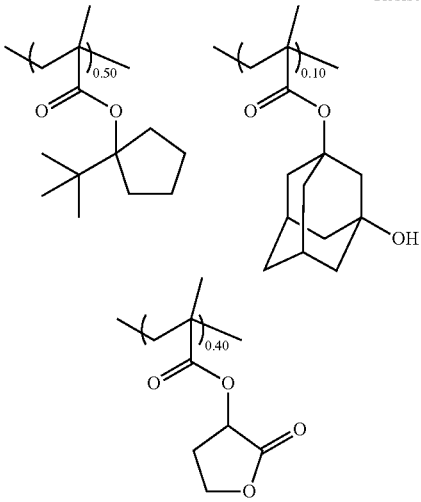
Resist Polymer 6
Resist Polymer 7
Mw=6,900
Mw/Mn=1.93
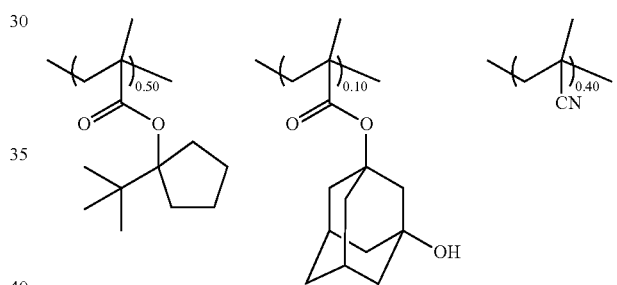
Resist Polymer 7
Resist Polymer 8
Mw=8,600
Mw/Mn=1.87
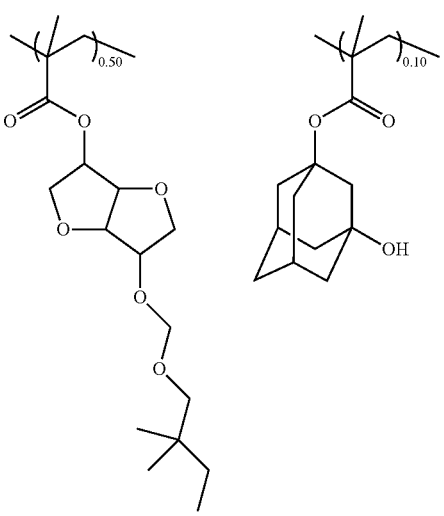
Resist Polymer 8

101
-continued
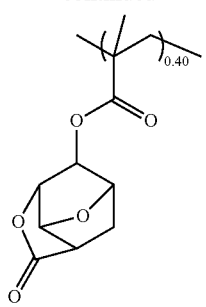
Resist Polymer 9
  Mw=8,600
  Mw/Mn=1.83
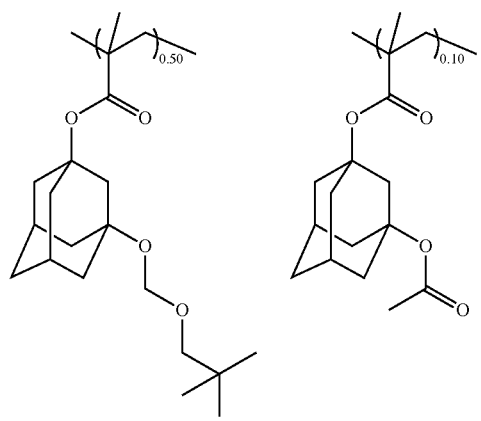
Resist Polymer 9
Basic compound: Quencher 1, Quencher 2, Polymeric Quencher 3 of the following structural formulae
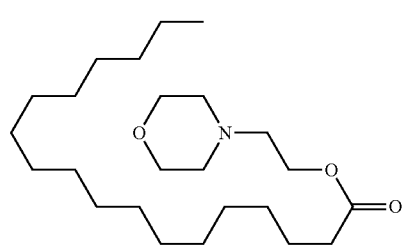
Quencher 1
102
-continued
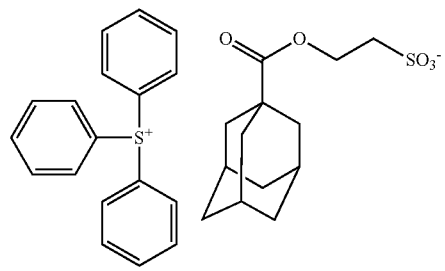
Quencher 2
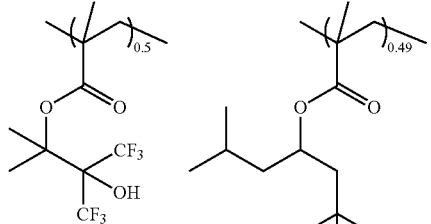
Quencher 3
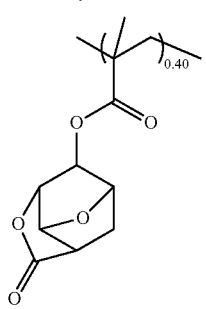
Thermal acid generator: TAG1 to TAG4 of the following structural formulae
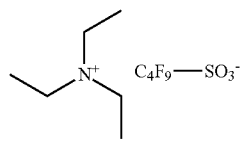
TAG 1
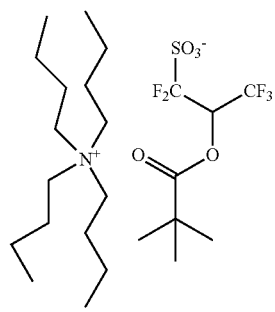
TAG 2
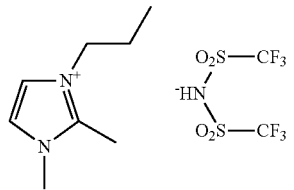
TAG 3

-continued

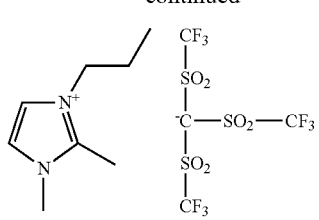
TAG 4

Water-repellent polymers 1, 2 of the following structural formulae

Water-repellent polymer 1

Water-repellent polymer 2

Organic Solvent:
PGMEA (propylene glycol monomethyl ether acetate)
CyH (cyclohexanone)
GBL (gamma-butyrolactone)
EL (ethyl lactate)

EXAMPLES AND COMPARATIVE EXAMPLES

Measurement of Solvent Solubility of Resist Film after High-Temperature Bake

The first positive resist composition of the formulation shown in Table 1 was spin coated on an antireflective coating (ARC-29A, Nissan Chemical Industries, Ltd., 90 nm) on a silicon wafer and baked on a hot plate at 110° C. for 60 seconds to form a resist film of 100 nm thick. A coating of Comparative Resist 1-2 was irradiated with light from Xe2 excimer lamp of wavelength 172 nm and irradiance 10 mW and baked at 185° C. for 60 seconds.

Next, the resist film was baked at 185° C. for 60 seconds. A solvent as shown in Table 3 was dispensed on the resist film and kept in contact for 30 seconds. The wafer was spun at 2,000 rpm for 30 seconds for removing the solvent and baked at 100° C. for 60 seconds for drying. A film thickness was measured by a film thickness gauge to determine a change in film thickness between 185° C. baking and solvent contact. The results are shown in Table 3.

ArF Lithography Patterning Test

On a substrate (silicon wafer), a spin-on carbon film ODL-101 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the first resist composition shown in Table 1 was spin coated, then baked on a hot plate at 100° C. for 60 seconds to form a resist film of 100 nm thick.

Using an ArF excimer laser immersion lithography scanner NSR-610C (Nikon Corp., NA 1.30, σ 0.98/0.78, dipole 35 deg., azimuthally polarized illumination), exposure was performed in a varying dose through a 6% halftone phase shift mask bearing a Y-direction line-and-space pattern. After the exposure, the wafer was baked (PEB) at the temperature shown in Table 4 for 60 seconds, developed in an aqueous solution of 2.38 wt % tetramethylammonium hydroxide (TMAH), and rinsed with deionized water, forming a positive pattern with a line width of 30 nm. Thereafter, the resist film was baked at 185° C. for 60 seconds. Notably, a coating of Comparative Resist 1-2 was irradiated with light from Xe2 excimer lamp of wavelength 172 nm and irradiance 10 mW and baked at 185° C. for 60 seconds.

Next, the second resist composition of the formulation shown in Table 2 was coated under such conditions that a film of 80 nm thick might be formed on a flat plate, and baked at 100° C. for 60 seconds. Using an ArF excimer laser immersion lithography scanner NSR-610C (Nikon Corp., NA 1.30, σ 0.98/0.78, dipole 35 deg., azimuthally polarized illumination), exposure was performed in a varying dose through a 6% halftone phase shift mask bearing a X-direction line-and-space pattern at such a position that the second resist pattern might orthogonally cross the first resist pattern. After the exposure, the wafer was baked (PEB) at the temperature shown in Table 4 for 60 seconds, developed in an organic solvent as shown in Table 3 for 30 seconds, rinsed with diisoamyl ether, spin dried, and baked at 100° C. for 20 seconds for evaporating off the rinse liquid. A negative pattern was formed.

Using a top-down scanning electron microscope (TDSEM CG-4000, Hitachi Hitechnologies, Ltd.), the minimum slit width of X-direction negative pattern was measured to examine whether or not a hole pattern resulted from orthogonal intersection of Y-direction positive pattern and X-direction negative pattern and whether or not the line width of Y-direction positive pattern was kept unchanged. The results are shown in Table 4.

TABLE 1

|  |  | Polymer (pbw) | Acid generator (pbw) | Basic compound (pbw) | Water-repellent polymer (pbw) | Organic solvent (pbw) |
| --- | --- | --- | --- | --- | --- | --- |
| Resist | 1-1 | Resist Polymer 1 (100) | PAG1 (14.0) TAG1 (0.5) | Quencher1 (2.20) | Water-repellent polymer 1 (4.0) | PGMEA (2,500) |

TABLE 1-continued

|  |  | Polymer (pbw) | Acid generator (pbw) | Basic compound (pbw) | Water-repellent polymer (pbw) | Organic solvent (pbw) |
|---|---|---|---|---|---|---|
|  | 1-2 | Resist Polymer 2 (100) | PAG1 (14.0) TAG1 (0.5) | Quencher1 (2.20) | Water-repellent polymer 1 (4.0) | PGMEA (2,500) |
|  | 1-3 | Resist Polymer 3 (100) | TAG1 (0.5) | Quencher1 (2.20) | Water-repellent polymer 1 (4.0) | PGMEA (2,000) GBL (500) |
|  | 1-4 | Resist Polymer 4 (100) | PAG1 (10.0) TAG1 (0.5) | Quencher1 (2.00) | Water-repellent polymer 1 (4.0) | PGMEA (2,000) CyH (500) |
|  | 1-5 | Resist Polymer 1 (100) | PAG1 (14.0) TAG2 (0.5) | Quencher1 (2.20) | Water-repellent polymer 1 (4.0) | PGMEA (2,500) |
|  | 1-6 | Resist Polymer 1 (100) | PAG1 (14.0) TAG3 (0.5) | Quencher1 (2.20) | Water-repellent polymer 1 (4.0) | PGMEA (2,500) |
|  | 1-7 | Resist Polymer 1 (100) | PAG1 (14.0) TAG4 (0.5) | Quencher1 (2.20) | Water-repellent polymer 1 (4.0) | PGMEA (2,500) |
|  | 1-8 | Resist Polymer 1 (100) | PAG1 (6.0) TAG1 (0.5) | Quencher2 (6.20) | Water-repellent polymer 1 (4.0) | PGMEA (2,500) |
|  | 1-9 | Resist Polymer 1 (100) | PAG1 (6.0) TAG1 (0.5) | Quencher2 (6.00) Quencher3 (3.00) | Water-repellent polymer 1 (4.0) | PGMEA (2,500) |
| Comparative Resist | 1-1 | Resist Polymer 6 (100) | PAG1 (14.0) TAG1 (0.5) | Quencher1 (2.20) | Water-repellent polymer 1 (4.0) | PGMEA (2,500) |
|  | 1-2 | Resist Polymer 4 (100) | PAG1 (10.0) | Quencher1 (2.00) | Water-repellent polymer 1 (4.0) | PGMEA (2,000) CyH (500) |

TABLE 2

|  |  | Polymer (pbw) | Acid generator (pbw) | Basic compound (pbw) | Water-repellent polymer (pbw) | Organic solvent (pbw) |
|---|---|---|---|---|---|---|
| Resist | 2-1 | Resist Polymer 5 (100) | PAG1(8.0) | Quencher1 (1.80) | Water-repellent polymer 2 (4.0) | PGMEA(2,500) |
|  | 2-2 | Resist Polymer 6 (100) | PAG1(8.0) | Quencher1 (1.80) | Water-repellent polymer 2 (4.0) | PGMEA(2,000) CyH(500) |
|  | 2-3 | Resist Polymer 7 (100) | PAG1(8.0) | Quencher1 (1.80) | Water-repellent polymer 2 (4.0) | PGMEA(2,500) |
|  | 2-4 | Resist Polymer 8 (100) | PAG1(8.0) | Quencher1 (1.80) Quencher3 (3.00) | Water-repellent polymer 2 (4.0) | PGMEA(2,500) |
|  | 2-5 | Resist Polymer 9 (100) | PAG1(5.0) | Quencher1 (5.20) | Water-repellent polymer 2 (4.0) | PGMEA(2,000) GBL(500) |

TABLE 3

|  | Solvent | Film thickness loss by solvent (nm) |
|---|---|---|
| Resist 1-1 | PGMEA | 0.5 |
| Resist 1-2 | PGMEA | 1.5 |
| Resist 1-3 | PGMEA | 0.6 |
| Resist 1-3 | EL | 1.2 |
| Resist 1-3 | PGMEA/EL (85/15) | 0.7 |
| Resist 1-3 | PGMEA/GBL (90/10) | 1.3 |
| Resist 1-3 | PGMEA/CyH (85/15) | 0.4 |
| Resist 1-3 | 2-heptanone | 0.8 |
| Resist 1-4 | PGMEA | 1.1 |
| Resist 1-5 | PGMEA | 0.3 |
| Resist 1-6 | PGMEA | 0.6 |
| Resist 1-7 | PGMEA | 0.5 |
| Resist 1-8 | PGMEA | 0.6 |
| Resist 1-9 | PGMEA | 0.8 |
| Comparative Resist 1-1 | PGMEA | 53 |
| Comparative Resist 1-2 (172 nm irradiation) | PGMEA | 0.5 |

TABLE 4

| | | 1st resist | | 2nd resist | Y-line | X-slit |
| | 1st resist | PEB temp. (°C.) | 2nd resist | PEB temp. (°C.) | size (nm) | size (nm) |
|---|---|---|---|---|---|---|
| Example 1 | Resist 1-1 | 95 | Resist 2-1 | 90 | 30 | 24 |
| 2 | Resist 1-2 | 95 | Resist 2-1 | 90 | 31 | 26 |
| 3 | Resist 1-3 | 95 | Resist 2-1 | 90 | 32 | 24 |
| 4 | Resist 1-4 | 95 | Resist 2-1 | 90 | 28 | 24 |
| 5 | Resist 1-5 | 95 | Resist 2-1 | 90 | 29 | 24 |
| 6 | Resist 1-6 | 95 | Resist 2-1 | 90 | 30 | 25 |
| 7 | Resist 1-7 | 95 | Resist 2-1 | 90 | 31 | 25 |
| 8 | Resist 1-8 | 95 | Resist 2-1 | 90 | 32 | 26 |
| 9 | Resist 1-9 | 95 | Resist 2-1 | 90 | 30 | 26 |
| 10 | Resist 1-4 | 95 | Resist 2-2 | 90 | 30 | 24 |
| 11 | Resist 1-4 | 95 | Resist 2-3 | 90 | 31 | 26 |
| 12 | Resist 1-4 | 95 | Resist 2-4 | 85 | 29 | 28 |
| 13 | Resist 1-4 | 95 | Resist 2-5 | 90 | 29 | 28 |
| Comparative Example 1 | Comparative Resist 1-1 | 95 | Resist 2-1 | 90 | 0 | 32 |
| 2 | Comparative Resist 1-2 | 95 | Resist 1-1 | 95 | 28 | 40 |

As seen from the results in Table 4, the pattern forming process of Examples 1 to 13 ensured that Y lines of the positive resist film resulting from over-exposure were retained even after the organic solvent development of the second resist film, and narrow slits resulted from over-exposure of the second resist film. As a result, a hole pattern as shown in FIG. 2 was formed. In Comparative Example 1 wherein the first resist film was insufficiently insolubilized with respect to organic solvent, the first resist pattern dissolved away during coating of the second resist composition. In Comparative Example 2, the first positive resist film was insolubilized with respect to both organic solvent and alkaline developer by irradiation of light of wavelength 172 nm and bake, and a pattern was formed using a positive resist composition as the second resist composition. Where a positive resist composition was used as the second resist composition, narrow slits should be opened by under-exposure having a low optical contrast. Consequently, narrow slits could not be resolved.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2013-005152 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of:
   coating a first chemically amplified positive resist composition onto a processable substrate, said first resist composition comprising a resin comprising recurring units having 7-oxanorbornane ring and recurring units having an acid labile group so that it may turn soluble in alkaline developer as a result of the acid labile group being eliminated, a photoacid generator capable of generating an acid upon exposure to high-energy radiation, a thermal acid generator capable of generating an acid upon heating and having the general formula (P 1a-2):

(P1a-2)

wherein $K^-$ is a sulfonate having at least one fluorine at α-position, perfluoroalkylimidate or perfluoroalkylmethidate, $R^{101d}$, $R^{101e}$, $R^{101f}$ and $R^{101g}$ are each independently hydrogen, a straight, branched or cyclic $C_1$-$C_{12}$ alkyl, alkenyl, oxoalkyl or oxoalkenyl group, $C_6$-$C_{20}$ aryl group, $C_7$-$C_{12}$ aralkyl group or aryloxoalkyl group, in which some or all hydrogen atoms may be substituted by alkoxy groups, $R^{101d}$ and $R^{101e}$, or $R^{101d}$, $R^{101e}$ and $R^{101f}$ may bond together to form a ring with the nitrogen atom to which they are attached, and when they form a ring, $R^{101d\,and\,R101e}$, or $R^{101d}$, $R^{101e}$ and $R^{101f}$, taken together, represent a $C_3$-$C_{10}$ alkylene group or form a hetero-aromatic ring having the nitrogen atom in the formula therein, and a first organic solvent, prebaking the coating to remove the unnecessary solvent and to form a resist film, exposing patternwise the resist film to high-energy radiation, post-exposure baking, and developing in an alkaline developer to form a positive pattern,
   heating the positive pattern to render it resistant to a second organic solvent used in a second resist composition to be subsequently coated,
   coating the second resist composition comprising a resin and the second organic solvent selected from the group consisting of propylene glycol monomethyl ether acetate, cyclohexanone, cyclopentanone, ethyl lactate, propylene glycol monomethyl ether, heptanone, γ-butyrolactone and mixtures thereof onto the positive pattern-bearing substrate, prebaking, exposing, post-exposure baking, and developing in a third organic solvent to form a negative pattern,
   whereby the positive pattern of the first resist composition and the negative pattern of the second resist composition are simultaneously formed.

2. The process of claim 1 wherein the positive pattern after heating experiences a film thickness loss of up to 10 nm when it is kept in contact with the second organic solvent for 30 seconds.

3. The process of claim 1 wherein during the steps of generating acid in the positive pattern and heating to eliminate the acid labile group on the resin in the positive pattern, crosslinking of the resin and elimination of the acid labile group are conducted at the same time in the positive pattern.

4. The process of claim 1 wherein the recurring units having 7-oxanorbornane ring are recurring units (a) having the general formula (1):

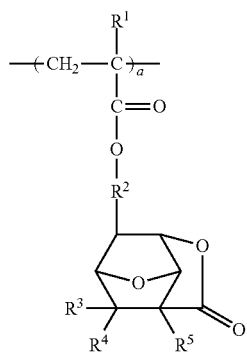

(1)

wherein $R^1$ is hydrogen or methyl, $R^2$ is a single bond, or a straight, branched or cyclic $C_1$-$C_6$ alkylene group which may contain an ether or ester moiety and which has a primary or secondary carbon atom through which it is linked to the ester moiety in the formula, $R^3$, $R^4$, and $R^5$ are each independently hydrogen, a straight, branched or cyclic $C_1$-$C_6$ alkyl group or cyano group, and a is a number in the range: $0 < a < 1.0$.

5. The process of claim 1 wherein the recurring units having an acid labile group are recurring units (b) having the general formula (2):

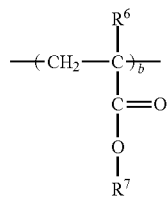

(2)

wherein $R^6$ is hydrogen or methyl, $R^7$ is an acid labile group, and b is a number in the range: $0 < b \leq 0.8$.

6. The process of claim 5 wherein $R^7$ is an acid labile group of alicyclic structure.

7. The process of claim 1 wherein the resin in the second resist composition comprises recurring units having a carboxyl and/or hydroxyl group substituted with an acid labile group.

8. The process of claim 7 wherein the recurring units having a carboxyl or hydroxyl group substituted with an acid labile group are recurring units (c) or (d) having the general formula (3):

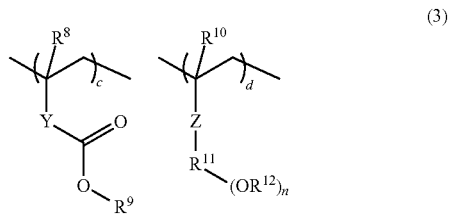

(3)

wherein $R^8$ and $R^{10}$ each are hydrogen or methyl, $R^9$ and $R^{12}$ each are an acid labile group, Y is a single bond or —C(=O)—O—$R^{13}$—, $R^{13}$ is a straight, branched or cyclic $C_1$-$C_{10}$ alkylene group which may contain an ether or ester moiety, or a naphthylene group, Z is a single bond or —C(=O)—O—, $R^{11}$ is a straight, branched or cyclic $C_1$-$C_{15}$ alkylene group or a trivalent group obtained by eliminating one hydrogen from the alkylene group, which may contain an ether or ester moiety, or a naphthylene group or a trivalent group obtained by eliminating one hydrogen from the naphthylene group, n is 1 or 2, c and d are numbers in the range: $0 \leq c < 1.0$, $0 \leq d < 1.0$, and $0 < c+d < 1.0$.

9. The process of claim 1 wherein the third organic solvent used in the last developing step to form a negative pattern is selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, isoamyl acetate, butenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

10. The process of claim 1 wherein the first positive pattern crosses the second negative pattern.

11. The process of claim 1 wherein the first positive pattern and the second negative pattern are formed in different directions.

12. The process of claim 1 wherein spaces of the second negative pattern are formed in proximity to the remaining portion of the first positive pattern.

13. The process of claim 1 wherein the first resist composition comprising a resin consisting of
recurring units (a) having the general formula (1):

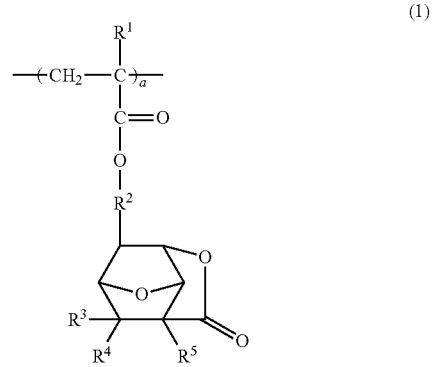

(1)

wherein $R^1$ is hydrogen or methyl, $R^2$ is a single bond, or a straight, branched or cyclic $C_1$-$C_6$ alkylene group which may contain an ether or ester moiety and which has a primary or secondary carbon atom through which it is linked to the ester moiety in the formula, and $R^3$, $R^4$, and $R^5$ are each independently hydrogen, a straight, branched or cyclic $C_1$-$C_6$ alkyl group or cyano group, recurring units (b) having the general formula (2):

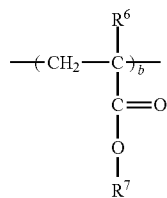

(2)

wherein $R^6$ is hydrogen or methyl, and $R^7$ is an acid labile group, recurring units (e) derived from a monomer having an adhesive group selected from the group consisting of hydroxy, cyano, carbonyl, ester, ether group, lactone ring, carboxyl or carboxylic anhydride group, and recurring units of at least one type selected from sulfonium salt units (f1) to (f3) as represented by the general formula (4):

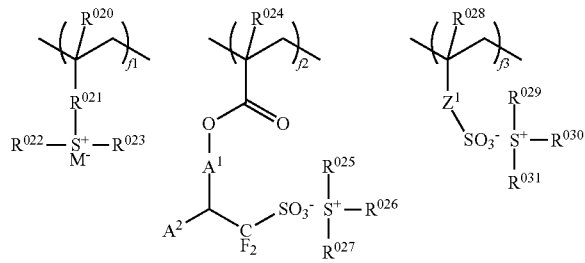

(4)

wherein $R^{020}$, $R^{024}$, and $R^{028}$ each are hydrogen or methyl, $R^{021}$ is a single bond, phenylene, —O—$R^{033}$—, or —C(=O)—Y—$R^{033}$—, wherein Y is oxygen or NH, and $R^{033}$ is a straight, branched or cyclic $C_1$-$C_6$ akylene group, alkenylene group or phenylene group, which may contain a carbonyl (—CO—), ester (—COO—), ether (—O—), or hydroxyl moiety, $R^{022}$, $R^{023}$, $R^{025}$, $R^{026}$, $R^{027}$, $R^{029}$, $R^{030}$, and $R^{031}$ are each independently a straight, branched or cyclic $C_1$-$C_{12}$ alkyl group which may contain a carbonyl, ester or ether moiety, a $C_6$-$C_{12}$ aryl group, a $C_7$-$C_{20}$ aralkyl group, or a thiophenyl group, $A^1$ is a single bond, -$A^0$—C(=O)—O—, -$A^0$—O— or -$A^0$—O—C(=O)—, wherein $A^0$ is a straight, branched or cyclic $C_1$-$C_{12}$ alkylene group which may contain a carbonyl, ester or ether moiety, $A^2$ is hydrogen, $CF_3$ or carbonyl, $Z^1$ is a single bond, methylene, ethylene, phenylene, fluorinated phenylene, —O—$R^{032}$—, or —C(=O)—$Z^2$—$R^{032}$—, wherein $Z^2$ is oxygen or NH, and $R^{032}$ is a straight, branched or cyclic $C_1$-$C_6$ alkylene, phenylene, fluorinated phenylene, trifluoromethyl-substituted phenylene or alkenylene group, which may contain a carbonyl, ester, ether or hydroxyl moiety, and $M^-$ is a non-nucleophilic counter ion, wherein $0.1 \le a \le 0.9$, $0.1 \le b \le 0.7$, $0 < e \le 0.9$, $0 \le f1 \le 0.3$, $0 \le f2 \le 0.3$, $0 \le f3 \le 0.3$, and $0 \le f1+f2+f3 \le 0.3$.

14. The process of claim 13 wherein the second resist composition comprising a resin comprising recurring units (c) or (d) having the general formula (3):

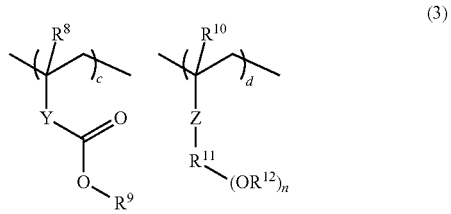

(3)

wherein $R^8$ and $R^{10}$ each are hydrogen or methyl, $R^9$ and $R^{12}$ each are an acid labile group, Y is a single bond or —C(=O)—O—$R^{13}$—, $R^{13}$ is a straight, branched or cyclic $C_1$-$C_{10}$ alkylene group which may contain an ether or ester moiety, or a naphthylene group, Z is a single bond or —C(=O)—O—, $R^{11}$ is a straight, branched or cyclic $C_1$-$C_{15}$ alkylene group or a trivalent group obtained by eliminating one hydrogen from the alkylene group, which may contain an ether or ester moiety, or a naphthylene group or a trivalent group obtained by eliminating one hydrogen from the naphthylene group, n is 1 or 2, and recurring units (e) derived from a monomer having an adhesive group such as hydroxy, cyano, carbonyl, ester, ether group, lactone ring, carboxyl or carboxylic anhydride group, wherein $0 \le c \le 0.9$, $0 \le d \le 0.9$, $0.1 \le c+d < 1.0$, and $0 < e \le 0.9$.

* * * * *